(12) United States Patent
Sasaki et al.

(10) Patent No.: US 10,153,181 B2
(45) Date of Patent: Dec. 11, 2018

(54) SUBSTRATE TREATING APPARATUS AND SUBSTRATE TREATING METHOD

(71) Applicant: SCREEN Holdings Co., Ltd., Kyoto (JP)

(72) Inventors: Yuta Sasaki, Kyoto (JP); Yosuke Hanawa, Kyoto (JP); Soichi Nadahara, Kyoto (JP); Dai Ueda, Kyoto (JP); Hiroaki Kitagawa, Kyoto (JP); Katsuya Okumura, Tokyo (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/602,722

(22) Filed: May 23, 2017

(65) Prior Publication Data

US 2017/0345683 A1  Nov. 30, 2017

(30) Foreign Application Priority Data

May 24, 2016  (JP) ................................ 2016-103086
Jul. 21, 2016  (JP) ................................ 2016-143784
(Continued)

(51) Int. Cl.
*H01L 21/67* (2006.01)
*B08B 3/02* (2006.01)
(Continued)

(52) U.S. Cl.
CPC .......... *H01L 21/67034* (2013.01); *B08B 3/02* (2013.01); *B08B 3/08* (2013.01);
(Continued)

(58) Field of Classification Search
CPC ......... H01L 21/67034; H01L 21/02057; H01L 21/67028; H01L 21/67051; B08B 3/02;
(Continued)

(56) References Cited

U.S. PATENT DOCUMENTS

| | | | | |
|---|---|---|---|---|
| 5,309,649 A | * | 5/1994 | Bergmann | ................ F26B 5/06 34/201 |
| 5,937,536 A | * | 8/1999 | Kieselbach | ............. F26B 5/044 34/202 |

(Continued)

FOREIGN PATENT DOCUMENTS

| | | | |
|---|---|---|---|
| EP | 3249682 A1 * | 11/2017 | ............... B08B 3/02 |
| JP | 2012-243869 A | 12/2012 | |

(Continued)

OTHER PUBLICATIONS

Extended European Search Report dated Sep. 26, 2017 issued in corresponding European Patent Application No. 17172339.8.

*Primary Examiner* — Stephen M Gravini

(74) *Attorney, Agent, or Firm* — Ostrolenk Faber LLP

(57) ABSTRACT

Disclosed is a substrate treating apparatus including the following units: a supplying unit which supplies a process liquid including a sublimable substance in a melt state on a pattern-formed surface of a substrate W; a solidifying unit which solidifies the process liquid on the pattern-formed surface to produce a solidified body; and a sublimating unit which sublimates the solidified body to remove the solidified body from the pattern-formed surface. In this apparatus, the sublimable substance includes a fluorinated carbon compound.

27 Claims, 25 Drawing Sheets

(30) Foreign Application Priority Data

Sep. 26, 2016 (JP) .................................. 2016-187013
Sep. 27, 2016 (JP) .................................. 2016-187924

(51) Int. Cl.
    *B08B 3/08*     (2006.01)
    *C11D 7/26*     (2006.01)
    *C11D 7/30*     (2006.01)
    *C11D 11/00*     (2006.01)
    *H01L 21/02*     (2006.01)

(52) U.S. Cl.
    CPC ............... *C11D 7/261* (2013.01); *C11D 7/30* (2013.01); *C11D 11/0047* (2013.01); *H01L 21/02057* (2013.01); *H01L 21/67028* (2013.01); *H01L 21/67051* (2013.01)

(58) Field of Classification Search
    CPC .. B08B 3/08; C11D 7/261; C11D 7/30; C11D 11/0047
    USPC ....................................................... 34/357, 78
    See application file for complete search history.

(56) References Cited

U.S. PATENT DOCUMENTS

| | | | |
|---|---|---|---|
| 6,358,863 B1 * | 3/2002 | Desu ....................... | C23C 16/30 257/E21.259 |
| 7,645,630 B2 * | 1/2010 | Hirai ....................... | C23C 16/30 438/99 |
| 8,549,768 B2 * | 10/2013 | Chakravarty ............. | F26B 5/06 34/284 |
| 8,898,928 B2 * | 12/2014 | Sirard ................ | H01L 21/02057 118/728 |
| 9,673,037 B2 * | 6/2017 | Sirard ............... | H01L 21/02057 |
| 2008/0160215 A1 * | 7/2008 | Crowder .................. | B05D 1/62 427/580 |
| 2008/0276482 A1 * | 11/2008 | Broughall ................ | F26B 5/06 34/287 |
| 2009/0280378 A1 * | 11/2009 | Matsumoto .......... | H01M 8/1004 429/524 |
| 2017/0117164 A1 | 4/2017 | Kikuchi et al. ................ | 134/19 |
| 2017/0170477 A1 * | 6/2017 | Sakshaug .............. | H01M 4/587 |
| 2017/0345683 A1 * | 11/2017 | Sasaki ....................... | B08B 3/02 |

FOREIGN PATENT DOCUMENTS

| | | | | |
|---|---|---|---|---|
| JP | 2013-016699 A | | 1/2013 | |
| JP | 2013-042094 A | | 2/2013 | |
| JP | 2013-258272 A | | 12/2013 | |
| JP | 2015-050414 A | | 3/2015 | |
| JP | 2015050414 A | * | 3/2015 | |
| JP | 2015-142069 A | | 8/2015 | |
| JP | 2015142069 A | * | 8/2015 | |
| JP | 2017152600 A | * | 8/2017 | |
| JP | 2017175049 A | * | 9/2017 | ................ F26B 3/20 |
| WO | WO 2007066132 A1 | * | 6/2007 | ................ F26B 5/06 |

\* cited by examiner

F I G. 4 B
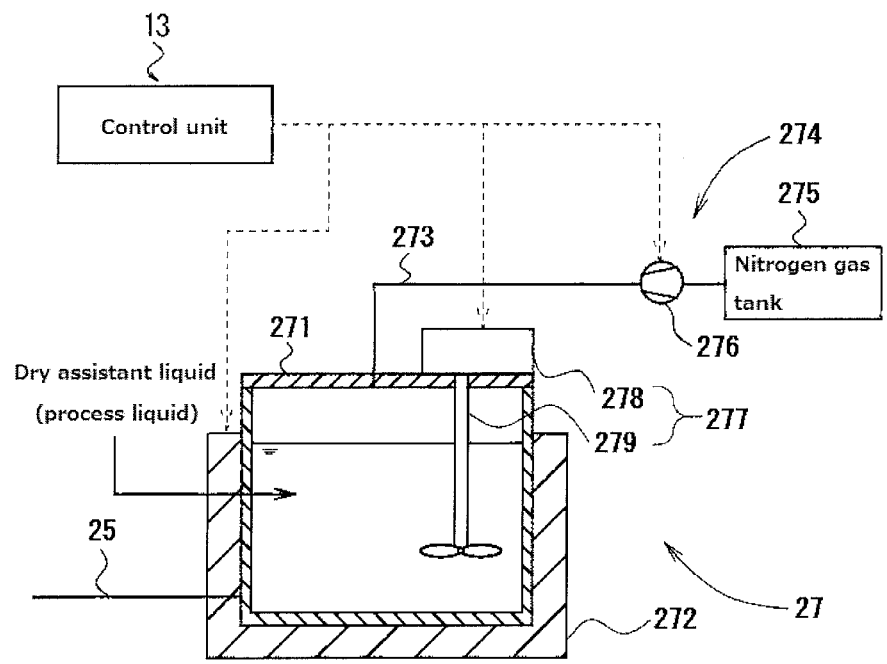

F I G. 1 7 A
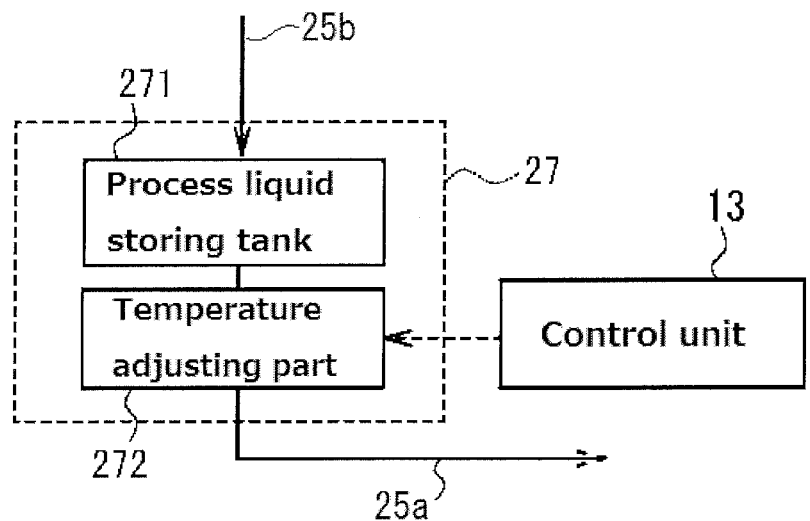
F I G. 1 7 B
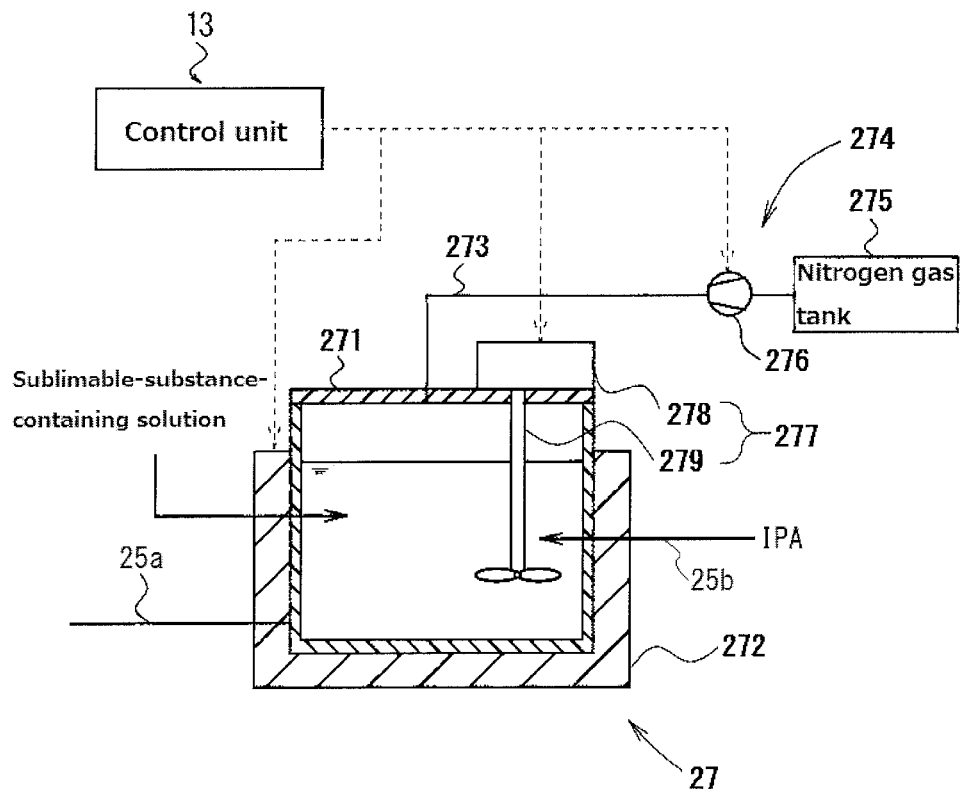

SUBSTRATE TREATING APPARATUS AND SUBSTRATE TREATING METHOD

BACKGROUND OF THE INVENTION (1) Field of the Invention

The present invention relates to a substrate treating apparatus and a substrate treating method for removing a liquid adhering on a substrate that may be of various type (hereinafter referred to merely as a "substrate") from the substrate, examples of the substrate including a semiconductor substrate, a glass substrate for a photomask, a glass substrate for a liquid crystal display, a glass substrate for a plasma display, a substrate for an FED (field emission display), a substrate for an optical disc, a substrate for a magnetic disc, or a substrate for a magnetooptical disc.

(2) Description of Related Art

In a process for producing an electronic member such as a semiconductor device or a liquid crystal display device, a substrate is subjected to various wet treatments each using a liquid, and subsequently the substrate is subjected to a drying treatment for removing the liquids adhering on the substrate by the wet treatments.

One of the wet treatments is, for example, a washing treatment for removing pollutants on the surface of the substrate. For example, on a surface of a substrate in which a fine pattern having convexo-concavities is formed through a dry etching step, reaction byproducts (etching remnants) are present. Moreover, besides the etching remnants, metal impurities, organic pollutants and others may adhere on the substrate surface. In order to remove these substances, the washing treatment is conducted, in which a washing liquid is supplied to the substrate.

After the washing treatment, the substrate is subjected to a rinsing treatment for removing the washing liquid with a rinsing liquid, and a drying treatment for drying the substrate to dry the rinsing liquid. An example of the ringing treatment is rinsing treatment of supplying a rinsing liquid such as DIW (deionized water) to the substrate surface onto which the washing liquid adheres to remove the washing liquid on the substrate surface. Thereafter, the substrate is subjected to the drying treatment, in which the rinsing liquid is removed to dry the substrate.

In recent years, a pattern formed on a substrate has been made finer. With this tendency, convexities of a pattern, which has convexo-concavities, have been becoming larger in aspect ratio (ratio between the height and width of each of the pattern convexities). Consequently, when the substrate is subjected to a drying treatment, there arises a problem of the so-called pattern collapse. Specifically, surface tension acts to a boundary interface between a washing liquid, a rinsing liquid or any other liquid that enters the concavities of the pattern and a gas contacting the liquid; and by the surface tension, adjacent two of the convexities in the pattern attract each other to be collapsed.

As a drying technique for preventing such a pattern collapse, for example, JP 2013-16699 A described blow discloses a method of bringing a solution into contact with a substrate having a formed structure (pattern), converting the solution to a solid to form a support for the pattern, and changing the support from the solid phase to a gas phase, without causing the support to undergo any liquid phase, to remove the support. The patent document also discloses that a material for the support may be at least one of methacrylic-based resin materials, styrene-based resin materials and fluorinated carbon-based materials.

JP 2012-243869 A and JP 2013-258272 A each disclose a drying technique of supplying a solution of a sublimable substance on a substrate, evaporating any solvent in the solution to fill the upper of the substrate with the resultant solid sublimable substance, and then sublimating the sublimable substance. These patent documents state that no surface tension acts to the boundary surface between the solid and a gas contacting the solid so that pattern collapse caused by such a surface tension can be restrained.

JP 2015-142069 A discloses a drying technique of supplying a melted liquid of tert-butanol (t-butanol) to a substrate onto which a liquid adheres, solidifying t-butanol on the substrate to produce a solidified body, and then sublimating t-butanol to be removed.

However, the drying technique disclosed in JP 2013-16699 A has a problem that about substrates having a pattern fine and high in aspect ratio (in other words, a pattern in which the height of its convex pattern is larger than the width of the convex pattern), pattern collapse cannot be sufficiently prevented.

The drying technique disclosed in JP 2012-243869 A and JP 2013-258272 A need to supply a solution in which a sublimable substance is dissolved in a solvent to a substrate, and subsequently remove the solvent selectively on the substrate to precipitate the sublimable substance on the substrate.

For example, JP 2013-258272 A makes use of 1,2,3-benzotriazole as a sublimable substance. This patent document states that the melting point of this substance is 95° C., and a solution in which 1 g of 1,2,3-benzotriazole is dissolved in 20 mL of IPA (isopropyl alcohol) is supplied to a substrate and this substrate is heated at 50° C. or lower to vaporize IPA to precipitate the sublimable substance on the surface of the substrate. If at this time the sublimable substance is not precipitated in the state of being filled into concavities of a pattern of the substrate, there remains a problem that surface tension acts ultimately to the substrate pattern to make it impossible to prevent the collapse of the pattern. This problem becomes more remarkable as the pattern is made finer.

In the drying technique disclosed in JP 2015-142069 A, a melted liquid of t-butanol is supplied to a substrate and then t-butanol is solidified, so that this technique does not use the precipitation of a sublimable substance by solvent-removal, which is performed in JP 2012-243869 and JP 2013-258272. Thus, this technique can cope with the above-mentioned problems. However, even the use of the sublimating and drying technique using t-butanol may not make it possible to prevent the collapse of a pattern fine and high in aspect ratio sufficiently.

Furthermore, each of the above-mentioned patent documents does not solve a problem that pattern collapse generated by a cause other than the effect of surface tension to a pattern cannot be sufficiently restrained. For example, when organic substances are present as impurities in a solution containing a sublimable substance, the organic substances may turn to crystal nuclei when this sublimating-substance-containing solution is solidified. In this way, each of the impurities has turned to the crystal nuclei so that crystal grains grow. The grown crystal grains soon collide with each other to generate crystal grain boundaries at boundaries between the grains. The generation of the crystal grain boundaries causes stress to be applied to the pattern to cause a problem that pattern collapse is generated.

SUMMARY OF THE INVENTION

In light of the above-mentioned problems, the present invention has been made, and an object thereof is to provide a substrate treating apparatus and a substrate treating method which each make it possible to remove a liquid adhering on a surface of a substrate while a pattern formed on the surface of the substrate is prevented from collapsing.

In order to solve the above-mentioned problems, the substrate treating apparatus according to the present invention includes: a supplying unit which supplies a process liquid including a sublimable substance in a melt state on a pattern-formed surface of a substrate; a solidifying unit which solidifies the process liquid on the pattern-formed surface to produce a solidified body; and a sublimating unit which sublimates the solidified body to remove the solidified body from the pattern-formed surface; wherein the sublimable substance includes a fluorinated carbon compound.

This apparatus makes it possible, for example, when a liquid is present on the pattern-formed surface of the substrate that the liquid is removed while pattern collapse is prevented on the basis of the principle of freeze-drying (or sublimation drying). Specifically, the supplying unit supplies the process liquid to the pattern-formed surface of the substrate to substitute the liquid with the process liquid. Next, the solidifying unit solidifies the process liquid to produce a solidified body. Furthermore, the solidifying unit sublimates the solidified body so that the solidified body is removed from the pattern-formed surface. The sublimation of the solidified body is based on the matter that this apparatus is configured to include the fluorinated carbon compound as a sublimable substance. The sublimable substance including the fluorinated carbon compound is changed in state from a solid to a gas without undergoing any liquid state. Thus, the sublimable substance does not cause any surface tension to affect the pattern formed on the substrate, so that the pattern formed on the substrate can be prevented from collapsing. Furthermore, the fluorinated carbon compound, which is a sublimable substance, is a compound restraining the pattern collapse more greatly than conventional sublimable substances such as t-butanol. Thus, this apparatus is useful also for any substrate on which a fine pattern high in aspect ratio is formed.

The above-mentioned wording "melt state" means the state that the sublimable substance is completely or partially melted to be in the state of a liquid having fluidity. The wording "sublimability" means that a simple substance, a compound or a mixture has a property of undergoing a phase transition from a solid to a gas, or from a gas to a solid without turning to any liquid. The wording "sublimable substance" means a substance having the sublimability. The wording "pattern-formed body" means a surface of a substrate which has an area in which a convexo-concavity pattern is formed provided that this surface may be in any form, such as a flat plane form, a curved plane form or an irregularity-made plane form. The wording "solidified body" means a product obtained by solidifying a liquid-state process liquid. For example, when a liquid present on a substrate is mixed with a process liquid and the mixture is solidified by the solidifying unit, the solidified body may also contain this liquid.

In the above-mentioned apparatus, it is preferred that the process liquid further includes an alcohol showing compatibility with the sublimable substance, and the concentration of the alcohol in the process liquid ranges from 0.001 to 0.8% by volume of the process liquid.

This form makes it possible, for example, when a liquid is present on the pattern-formed surface of the substrate that the liquid is removed while pattern collapse is prevented on the basis of the principle of freeze-drying (or sublimation drying). Specifically, the supplying unit supplies the process liquid to the pattern-formed surface of the substrate to substitute the liquid with the process liquid.

Next, the solidifying unit solidifies the process liquid to produces a solidified body. The process liquid includes therein the alcohol, which shows compatibility with the sublimable substance, in a concentration of 0.001 to 0.8% by volume. The alcohol has a property of an organic solvent. If an organic substance is present as an impurity in the process liquid, the alcohol dissolves the organic substance to restrain crystal grains from growing using the impurity as crystal nuclei. This restraint makes it possible to yield a solidified body having a crystal structure in which the generation and the growth of crystal grain boundaries are restrained. As a result, this matter decreases the effect of stress caused by the generation and the growth of crystal grain boundaries on the pattern to reduce pattern collapse.

Subsequently, the sublimating unit sublimates the solidified body to remove the solidified body from the pattern-formed surface. The sublimation of the solidified body is based on the matter that this apparatus is configured to include the fluorinated carbon compound as a sublimable substance. The sublimable substance including the fluorinated carbon compound is changed in state from a solid to a gas without undergoing any liquid state. Thus, the sublimable substance does not cause any surface tension to affect the pattern formed on the substrate, so that this form of the apparatus can simultaneously decrease pattern collapse caused on the effect of surface tension.

The adjustment of the alcohol concentration to 0.001% or more by volume makes it possible to decrease pattern collapse generated by, for example, the generation of crystal grain boundaries. In the meantime, the adjustment of the alcohol concentration to 0.8% or less by volume makes it possible to prevent the following: the solidifying point of the process liquid itself is excessively lowered to make the solidification of the process liquid difficult; and makes it possible after the process liquid is made into the solidified body to prevent the sublimability of the solidified body itself from being deteriorated to restrain an increase of the pattern collapse caused by the effect of surface tension.

The word "compatible or compatibility" means that different substances have affinity to each other, and when these substances are mixed with each other at any temperature under any pressure, the mixture has a property that the mixture does not easily undergo phase separation.

In the apparatus, it is preferred that the alcohol is isopropyl alcohol.

In the apparatus, it is preferred that the fluorinated carbon compound is at least one selected from the group consisting of the following compounds (A) to (E):

a compound (A): a fluoroalkane having 3 to 6 carbon atoms, or the fluoroalkane to which at least one selected from the group consisting of the following is bonded: halogen groups except a fluoro group, a hydroxyl group, an oxygen atom, a carboxyl group, and perfluoroalkyl groups;

a compound (B): a fluorocycloalkane having 3 to 6 carbon atoms, or the fluorocycloalkane to which at least one selected from the group consisting of the following is bonded: halogen groups except a fluoro group, a hydroxyl group, an oxygen atom, a carboxyl group, and perfluoroalkyl groups;

a compound (C): a fluorobicycloalkane having 10 carbon atoms, or the fluorobicycloalkane to which at least one selected from the group consisting of the following is bonded: halogen groups except a fluoro group, cycloalkyl groups which may each have a halogen atom, and alkyl groups each having a cycloalkyl group which may have a halogen atom;

a compound (D): a fluorotetracyanoquniodimethane, or the fluorotetracyanoquniodimethane to which at least one halogen group except a fluoro group is bonded; and a compound (E): a fluorocyclotriphosphazene, or the fluorocyclotriphosphazene to which at least one selected from the group consisting of the following is bonded: halogen groups except a fluoro group, a phenoxy group, and alkoxy groups.

In the apparatus, it is preferred that the compound (A) is tetradecafluorohexane.

In the apparatus, it is preferred that the compound (B) is at least one selected from the group consisting of 1,1,2,2-tetrachloro-3,3,4,4-tetrafluorocyclobutane, 1,2,3,4,5-pentafluorocyclopentane, 1,1,2,2,3,3,4-heptafluorocyclopentane, fluorocyclohexane, dodecafluorocyclohexane, 1,1,4-trifluorocyclohexane, 2-fluorocyclohexanol, 4,4-difluorocyclohexanone, 4,4-difluorocyclohexanecarboxylic acid, and 1,2,2,3,3,4,4,5,5,6,6-undecafluoro-1-(nonafluorobutyl) cyclohexane.

In the apparatus, it is preferred that the compound (C) is 2-[difluoro(undecafluorocyclohexyl)methyl]-1,1,2,3,3,4,4,4a,5,5,6,6,7,7,8,8,8a-heptade cafluorodecahydronaphthalene.

In the apparatus, it is preferred that the compound (D) is tetrafluorotetracyanoquinodimethane.

In the apparatus, it is preferred that the compound (E) is hexafluorocyclotriphosphazene.

In the apparatus, it is preferred that the supplying unit is a unit which supplies the process liquid to the pattern-formed surface of the substrate under an atmospheric pressure, and the solidifying unit is a unit which cools the process liquid under an atmospheric pressure to a temperature not higher than the solidifying point of the sublimable substance. This form makes it unnecessary to make at least the supplying unit and the solidifying unit into a pressure-resistant structure. Thus, costs for the apparatus can be decreased.

In the apparatus, it is preferred that the fluorinated carbon compound as the sublimable substance has sublimability under an atmospheric pressure, and the sublimating unit sublimates the sublimable substance under the atmospheric pressure. In this way, the use of the substance having sublimability under the atmospheric pressure, as the fluorinated carbon compound as the sublimable substance, makes it unnecessary to make at least the sublimating unit into a pressure-resistant structure. Thus, costs for the apparatus can be decreased.

In the apparatus, the solidifying unit and the sublimating unit may be rendered a common gas supplying unit which supplies an inert gas chemically inert to at least the sublimable substance to the pattern-formed surface at a temperature not higher than the solidifying point of the sublimable substance.

According to this form, as the solidifying unit, the gas supplying unit supplies the inert gas having the temperature not higher than the solidifying point of the sublimable substance to the pattern-formed surface. Thus, the sublimable substance can be cooled to be solidified. Moreover, the gas supplying unit supplies the inert gas also to the solidified body produced on the pattern-formed surface to sublimate the solidified body. Thus, the gas supplying unit can be caused to function as a sublimating unit. Furthermore, the gas supplying unit can be used as both of the solidifying unit and the sublimating unit; thus, the number of parts can be reduced so that costs for the apparatus can be decreased. For reference, the inert gas is inert to the sublimable substance not to denature the sublimable substance.

In the apparatus, at least one of the solidifying unit and the sublimating unit may be rendered a unit which supplies a coolant to a back surface of the substrate, which is opposite to the pattern-formed surface of the substrate, at a temperature not higher than the solidifying point of the sublimable substance.

According to this form, in the solidifying unit, the coolant of the temperature not higher than the solidifying point of the sublimable substance is supplied to the back surface of the substrate, which is opposite to the pattern-formed surface thereof, so that the sublimable substance can be cooled and solidified. Moreover, in the sublimating unit, the coolant is supplied to the back surface of the substrate so that the solidified body can be sublimated. Furthermore, when both of the solidifying unit and the sublimating unit are configured to supply the coolant to the back surface of the substrate, the number of parts can be reduced to decrease costs for the apparatus.

In the apparatus, it is preferred that the sublimating unit is a pressure reducing unit which makes an environment in which the pattern-formed surface, on which the solidified body is produced, is located into a pressure lower than any atmospheric pressure.

The use of the pressure reducing unit as the sublimating unit makes it possible to make the environment in which the pattern-formed surface of the substrate is located into a pressure lower than any atmospheric pressure to sublimate the sublimable substance in the solidified body. When the sublimable substance is sublimated and gasified from the solidified body, heat as sublimation heat is deprived of the solidified body. Thus, the solidified body is cooled. Accordingly, even in an environment of a slightly higher temperature than the melting point of the sublimable substance, the solidified body can be kept in the state of a temperature lower than the melting point of the sublimable substance without cooling the solidified body separately. Consequently, the solidified body can be sublimated while the sublimable substance is prevented from being melted in the solidified body. Moreover, the setting-up of any separate cooling mechanism is not required, so that costs for the apparatus and the treatment can be decreased.

In the apparatus, it is preferred that as the solidifying unit, the pressure reducing unit is used. According to this form, the pressure reducing unit as the sublimating unit is also used as the solidifying unit. Thus, the number of parts can be reduced so that costs for the apparatus can be decreased.

In the apparatus, it is preferred that the supplying unit has a process liquid temperature adjusting part which adjusts the temperature of the process liquid to a temperature that is not lower than the melting point of the sublimable substance and is lower than the boiling point of the sublimable substance. According to this form, the supplying unit further has the process liquid temperature adjusting part to succeed in adjusting the temperature of the process liquid to the temperature not lower than the melting point of the sublimable substance and lower than the boiling point of the sublimable substance. The adjustment of the process liquid temperature to the temperature not lower than the melting point of the sublimable substance makes it possible to conduct drying treatment of any liquid on the substrate satisfactorily while the pattern formed on the substrate is further prevented from collapsing.

In the apparatus, it is preferred that the supplying unit is a unit which supplies the process liquid as a washing liquid or a rinsing liquid to the pattern-formed surface of the substrate to wash or rinse the pattern-formed surface. This form makes it possible that the supplying unit uses the process liquid including the sublimable substance in a melt state, as a washing liquid and/or a rinsing liquid, to supply the process liquid on the pattern-formed surface of the substrate. In this way, a washing step and/or a rinsing step can be performed. In this case, the number of steps can be made smaller to make the treatment efficiency better while pollutants present on the pattern-formed surface of the substrate are further removed than in the case of supplying a process liquid on the pattern-formed surface after a washing step and/or a rinsing step, so as to substitute the process liquid with the washing liquid or the rising liquid to attain freeze-drying (or sublimation drying).

It is preferred that the apparatus further includes a water repellent treatment unit which applies water repellent treatment to at least the pattern-formed surface of the substrate before the process liquid is supplied to the pattern-formed surface. When the solidified body is sublimated, the solidified body may cause stress to act to the pattern of the substrate. When the degree of the sublimation of the solidified body is nonuniform at this time, the stress is nonuniformly applied also to the pattern so that pattern collapse may be caused. In the front surface of the pattern, hydroxyl groups are usually present; thus, when the pattern collapse causes the pattern to contact each other, the hydroxyl groups are hydrogen-bonded to each other so that the pattern convexities adhere on each other. However, in the present form, the water repellent treatment unit applies water repellent treatment beforehand to the pattern-formed surface of the substrate. Thus, even when the pattern are caused to move toward contact with each other, they are mutually repelled by repulsive force so that pattern collapse can be prevented. In this case, the collapse ratio of the pattern can be made lower than in the case of conducting no water repellent treatment.

In the apparatus, it is preferred that the solidifying unit and the sublimating unit are a common gas supplying unit which supplies an inert gas chemically inert to at least the sublimable substance and the alcohol to the pattern-formed surface at a temperature not higher than the solidifying point of the process liquid.

This form makes it possible that the gas supplying unit as the solidified unit supplies the inert gas having the temperature not higher than the solidifying point of the process liquid to the pattern-formed surface to cool and solidify the process liquid. Moreover, the gas supplying unit supplies the inert gas also to the solidified body produced on the pattern-formed surface. The supply makes it possible to sublimate the solidified body to cause the gas supplying unit to function as a sublimating unit. Furthermore, the gas supplying unit can be used as both of the solidifying unit and the sublimating unit so that the number of parts can be reduced and costs for the apparatus can be decreased. For reference, the inert gas is inert to the sublimable substance and the alcohol to denature neither the sublimable substance nor the alcohol.

In the apparatus, it is preferred that the supplying unit has a process liquid temperature adjusting part which adjusts the temperature of the process liquid to a temperature that is not lower than the melting point of the sublimable substance, and that is a temperature lower than lower one of the respective boiling points of the sublimable substance and the alcohol. According to this form, the supplying unit further has the process liquid temperature adjusting part so that the temperature of the process liquid can be adjusted to the temperature, which is not lower than the melting point of the sublimable substance and is a temperature lower than lower one of the respective boiling points of the sublimable substance and the alcohol. By setting the process liquid temperature to the temperature not lower than the melting point of the sublimable substance, the drying treatment of the liquid on the substrate can be satisfactorily conducted while the pattern formed on the substrate is further prevented from collapsing. In the meantime, by setting the process liquid temperature to the temperature lower than lower one of the respective boiling points of the sublimable substance and the alcohol, it is possible to prevent a change in the composition of the process liquid, for example, a matter that the alcohol concentration in the process liquid falls outside the range of 0.001 to 0.8% by volume of the process liquid.

In order to solve the above-mentioned problems, the substrate treating method of the present invention includes: a supplying step of supplying a process liquid including a sublimable substance in a melt state on a pattern-formed surface of a substrate; a solidifying step of solidifying the process liquid on the pattern-formed surface to produce a solidified body; and a sublimating step of sublimating the solidified body to be removed from the pattern-formed surface; wherein the sublimable substance includes a fluorinated carbon compound.

This method makes it possible, for example, when a liquid is present on the pattern-formed surface of the substrate that the liquid is removed while pattern collapse is prevented on the basis of the principle of freeze-drying (or sublimation drying). Specifically, in the supplying step, the process liquid is supplied to the pattern-formed surface of the substrate to substitute the liquid with the process liquid. Next, in the solidifying step, the process liquid is solidified to produce a solidified body. Furthermore, in the sublimating step, the solidified body is sublimated so that the solidified body is removed from the pattern-formed surface. The sublimation of the solidified body is based on the matter that this apparatus is configured to include the fluorinated carbon compound as a sublimable substance. The sublimable substance including the fluorinated carbon compound is changed in state from a solid to a gas without undergoing any liquid state. Thus, the sublimable substance does not cause any surface tension to affect the pattern formed on the substrate, so that the pattern formed on the substrate can be prevented from collapsing. Furthermore, the fluorinated carbon compound, which is a sublimable substance, is a compound restraining the pattern collapse more greatly than conventional sublimable substances such as t-butanol. Thus, this apparatus is useful also for any substrate on which a fine pattern high in aspect ratio is formed.

In the method, it is preferred that the process liquid further includes an alcohol showing compatibility with the sublimable substance, and the concentration of the alcohol in the process liquid ranges from 0.001 to 0.8% by volume of the process liquid.

This manner makes it possible, for example, when a liquid is present on the pattern-formed surface of the substrate that the liquid is removed while pattern collapse is prevented on the basis of the principle of freeze-drying (or sublimation drying). Specifically, in the supplying step, the process liquid is supplied to the pattern-formed surface of the substrate to substitute the liquid with the process liquid.

Next, in the solidifying step, the process liquid is solidified to produces a solidified body. The process liquid includes therein the alcohol, which shows compatibility with the sublimable substance, in a concentration of 0.001 to 0.8% by volume. The alcohol has natures of an organic solvent. If an organic substance is present as an impurity in the process liquid, the process liquid dissolves the organic substance to restrain crystal grains from growing using the impurity as crystal nuclei. This restraint makes it possible to yield a solidified body having a crystal structure in which the generation and the growth of crystal grain boundaries are restrained. As a result, this matter decreases the effect of stress caused by the generation and the growth of crystal grain boundaries on the pattern to reduce pattern collapse.

Subsequently, in the sublimating step, the solidified body is sublimated to remove the solidified body from the pattern-formed surface. The sublimation of the solidified body is based on the matter that this apparatus is configured to include the fluorinated carbon compound as a sublimable substance. The sublimable substance including the fluorinated carbon compound is changed in state from a solid to a gas without undergoing any liquid state. Thus, the sublimable substance does not cause any surface tension to affect the pattern formed on the substrate, so that this form of the apparatus can simultaneously decrease pattern collapse caused on the effect of surface tension.

The adjustment of the alcohol concentration to 0.001% or more by volume makes it possible to decrease pattern collapse generated by, for example, the generation of crystal grain boundaries. In the meantime, the adjustment of the alcohol concentration to 0.8% or less by volume makes it possible to prevent the following: the solidifying point of the process liquid itself is excessively lowered to make the solidification of the process liquid difficult; and makes it possible after the process liquid is made into the solidified body to prevent the sublimability of the solidified body itself from being deteriorated to restrain an increase of the pattern collapse caused by the effect of surface tension.

In the method, it is preferred that the fluorinated carbon compound is at least one selected from the group consisting of the following compounds (A) to (E):

a compound (A): a fluoroalkane having 3 to 6 carbon atoms, or the fluoroalkane to which at least one selected from the group consisting of the following is bonded: halogen groups except a fluoro group, a hydroxyl group, an oxygen atom, a carboxyl group, and perfluoroalkyl groups;

a compound (B): a fluorocycloalkane having 3 to 6 carbon atoms, or the fluorocycloalkane to which at least one selected from the group consisting of the following is bonded: halogen groups except a fluoro group, a hydroxyl group, an oxygen atom, a carboxyl group, and perfluoroalkyl groups;

a compound (C): a fluorobicycloalkane having 10 carbon atoms, or the fluorobicycloalkane to which at least one selected from the group consisting of the following is bonded: halogen groups except a fluoro group, cycloalkyl groups which may each have a halogen atom, and alkyl groups each having a cycloalkyl group which may have a halogen atom;

a compound (D): a fluorotetracyanoquniodimethane, or the fluorotetracyanoquniodimethane to which at least one halogen radical except a fluoro group is bonded; and a compound (E): a fluorocyclotriphosphazene, or the fluorocyclotriphosphazene to which at least one selected from the group consisting of the following is bonded: halogen groups except a fluoro group, a phenoxy group, and alkoxy groups.

In the method, it is preferred that the compound (A) is tetradecafluorohexane.

In the method, it is preferred that the compound (B) is at least one selected from the group consisting of 1,1,2,2-tetrachloro-3,3,4,4-tetrafluorocyclobutane, 1,1,2,2,3,3,4-heptafluorocyclopentane, fluorocyclohexane, dodecafluoro-cyclohexane, 1,1,4-trifluorocyclohexane, 2-fluorocyclohexanol, 4,4-difluorocyclohexanone, 4,4-difluorocyclohexanecarboxylic acid, and 1,2,2,3,3,4,4,5,5,6,6-undecafluoro-1-(nonafluorobutyl)cyclohexane.

In the apparatus, it is preferred that the compound (C) is 2-[difluoro(undecafluorocyclohexyl)methyl]-1,1,2,3,3,4,4, 4a,5,5,6,6,7,7,8,8,8a-heptade cafluorodecahydronaphthalene.

In the apparatus, it is preferred that the compound (D) is tetrafluorotetracyanoquinodimethane.

In the apparatus, it is preferred that the compound (E) is hexafluorocyclotriphosphazene.

The present invention produces the following advantageous effects through the above-mentioned apparatus and method:

According to the present invention, for example, when a liquid is present on a pattern-formed surface of a substrate, the liquid is substituted with a process liquid including a fluorinated carbon compound as a sublimable substance and then the fluorinated carbon compound is solidified to produce a solidified body. Furthermore, the solidified body is sublimated. For this reason, the pattern can be prevented from collapsing without causing any surface tension to affect the pattern formed on the substrate. Additionally, the fluorinated carbon compound, which is the sublimable substance, restrains the pattern collapse more largely than conventional sublimable substance such as t-butanol. Thus, the substrate treating apparatus of the present invention is very useful for drying treatment of a liquid on any substrate on which a pattern is formed.

BRIEF DESCRIPTION OF THE DRAWINGS

FIG. 4B is an explanatory view illustrating a specific structure of the dry assistant liquid storing part;

FIG. 17A is a block chart illustrating a schematic structure of a process liquid storing part in the substrate treating apparatus;

FIG. 17B is an explanatory view illustrating a specific structure of the process liquid storing part;

DETAILED DESCRIPTION OF PREFERRED EMBODIMENTS

First Embodiment

Hereinafter, a first embodiment of the present disclosure will be described.

Figure 1:
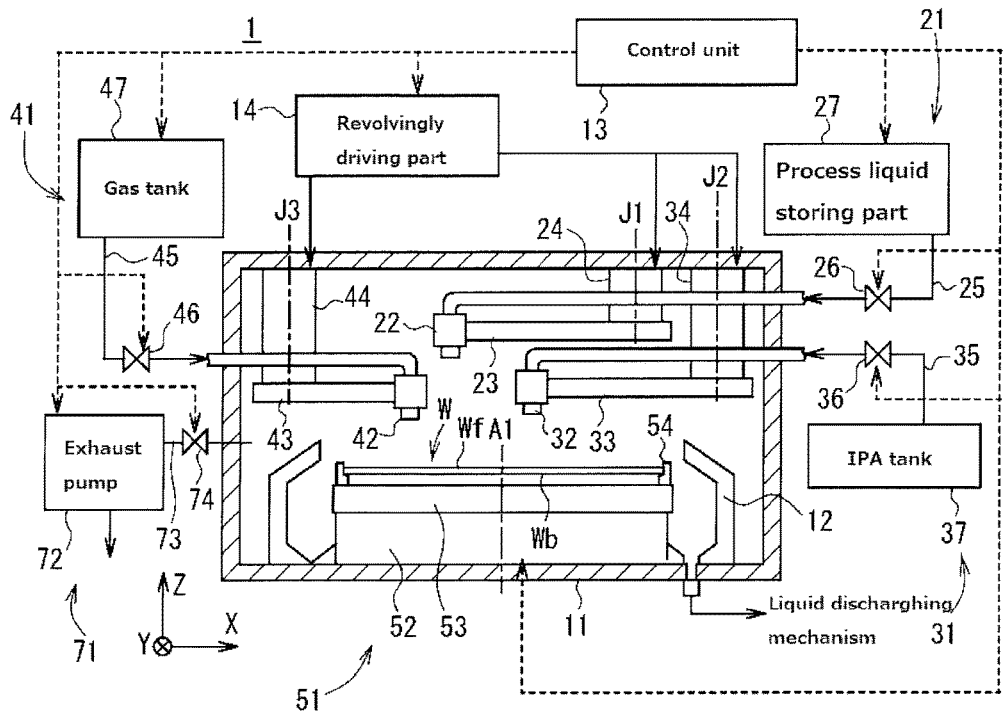
FIG. 1 is an explanatory view illustrating an outline of a substrate treating apparatus according to a first embodiment of the present invention.
Figure 2:
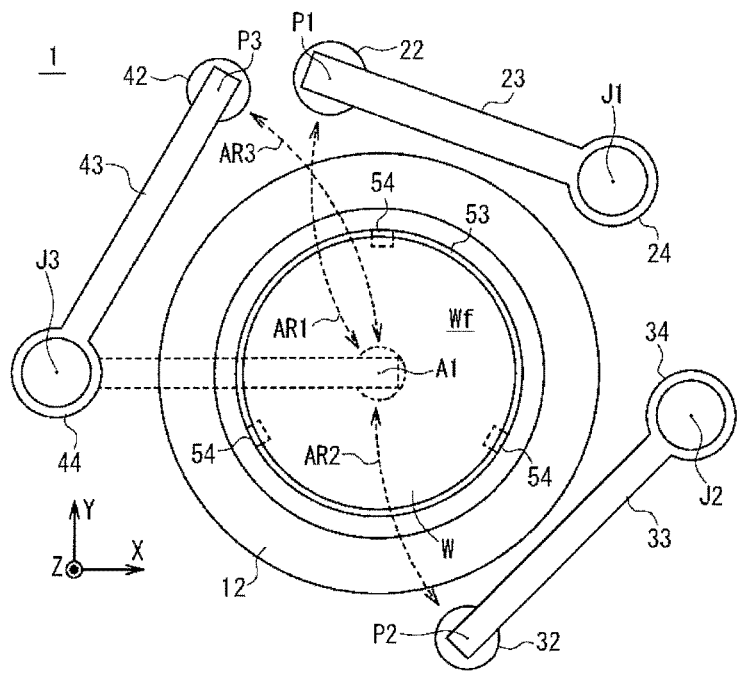
FIG. 2 is a schematic plan view illustrating the substrate treating apparatus.

FIG. 1 is an explanatory view illustrating an outline of a substrate treating apparatus 1 according to the present embodiment. FIG. 2 is a schematic plan view illustrating an internal structure of the substrate treating apparatus 1. In all the drawings, in order to make a directional relationship between illustrated members clear, orthogonal coordinate axes XYZ are appropriately represented. In FIGS. 1 and 2, their XY plane represents a horizontal plane and their +Z direction represents a vertically upper direction.

The substrate treating apparatus 1 is usable for treatment for, e.g., various substrates. The "substrates" denote various substrates such as a semiconductor substrate, a glass substrate for a photomask, a glass substrate for a liquid crystal display, a glass substrate for a plasma display, a substrate for an FED (field emission display), a substrate for an optical disc, a substrate for a magnetic disc, and a substrate for a magnetooptical disc. In the present embodiment, the following will describe the substrate treating apparatus 1, giving, as an example, a case where the substrate treating apparatus 1 is used to treat a semiconductor substrate (hereinafter referred to as a "substrate W").

As an example of the substrate W, a substrate is used which has, on only one main surface thereof, a circuit pattern and/or any other member (hereinafter referred to as a "pattern") formed. The pattern-formed surface (main surface), on which the pattern is formed, is called the "front surface" of the substrate. While a main surface of the substrate which is opposite to the front surface and has no formed pattern is called the "back surface" thereof. A surface of the substrate that is downward faced is called the "lower surface" of the substrate, and a surface thereof that is upward faced is called the "upper surface" thereof. The following description will be made under the condition that the upper surface is rendered the front surface.

The substrate treating apparatus 1 is a single wafer type substrate treating apparatus which is for treating substrates that are separate from each other, and which is used for a washing treatment (including a rinsing treatment) for removing particles or other pollutants sticking on the substrate W, and a drying treatment after the washing treatment. In FIGS. 1 and 2, only moieties of the apparatus that are used for the drying treatment are illustrated while a washing nozzle, and others that are used for the washing treatment are not illustrated. However, the substrate treating apparatus 1 may have a washing nozzle and others.

<1-1. Structure of Substrate Treating Apparatus>

With reference to FIGS. 1 and 2, the structure of the substrate treating apparatus 1 will be initially described.

The substrate treating apparatus 1 has at least a chamber 11 which is a container which the substrate W is taken in; a substrate holder 51 for holding the substrate W; a control unit 13 for controlling individual parts of the substrate treating apparatus 1; a process liquid supplying unit (supplying unit) 21 for supplying a process liquid as a dry assistant liquid to the substrate W held by the substrate holder 51; an IPA supplying unit 31 for supplying IPA to the substrate W held by the substrate holder 51; a gas supplying unit 41 (solidifying unit or sublimating unit) for supplying a gas to the substrate W held by the substrate holder 51; a scattering-preventing cup 12 for collecting IPA, the dry assistant liquid and others that are supplied to the substrate W held by the substrate holder 51 and that are discharged to the outside of the peripheral portion of the substrate W; a revolvingly driving part 14 for driving arms of individual parts of the substrate treating apparatus 1 revolvingly, the arms being to be detailed later, each independently; and a pressure reducing unit 71 for reducing the pressure inside the chamber 11. The substrate treating apparatus 1 also has a substrate carrying-in/out unit, a chuck-pin-opening/closing mechanism, and a wet washing unit (each not illustrated). The individual parts of the substrate treating apparatus 1 will be described hereinafter.

The substrate holder 51 has a rotarily driving part 52, a spin base 53, and chuck pins 54. The spin base 53 has a flat plane size somewhat larger than that of the substrate W. Near the peripheral portion of the spin base 53, the chuck pins 54 are located to stand to grasp peripheral portion portions of the substrate W. The number of the located chuck pins 54 is not particularly limited. The number is preferably 3 or more in order for the pins to hold the substrate W, which is in a disc form, certainly. In the present embodiment, the chuck pins are located in a number of 3 at regular intervals along the peripheral portion of the spin base 53 (see FIG. 2). Each of the chuck pins 54 has a substrate supporting pin which supports one of the peripheral portion portions of the substrate W from the lower side of the substrate, and a substrate supporting pin which pushes and presses the outer circumferential end surface of the substrate W supported by the former substrate supporting pin, so as to hold the substrate W.

Each of the chuck pins 54 can be switched between a pushing pressing state such that the substrate holding pin pushes and presses the outer circumferential end surface of the substrate W, and a releasing state such that the substrate holding pin is made apart from the outer circumferential end surface of the substrate W. These states are switched in accordance with an operation command from the control unit 13 for controlling the whole of the apparatus.

More specifically, when the substrate W is carried into or out from the spin base 53, the individual chuck pins 54 are made into the release state. When the substrate W is subjected to a substrate treatment process from a washing treatment to a sublimating treatment, this process being to be detailed later, the individual chuck pins 54 are made into the pushing and pressing state. When the chuck pins 54 are made into the pushing and pressing state, the chuck pins 54 grasp the peripheral portion portions of the substrate W to hold the substrate W, with a horizontal posture (on the XY plane), to be separated from the spin base 53 by a predetermined interval. In this way, the substrate W is horizontally held in the state that its front surface Wf is upward faced.

As described above, in the present embodiment, the spin base 53 and the chuck pins 54 are used to hold the substrate W. However, the substrate-holding manner is not limited to this manner. For example, the substrate W may be held in a sucking manner of using, e.g., a spin chuck to suck its back surface Wb.

The spin base 53 is connected to the rotarily driving part 52. The rotarily driving part 52 is rotated along its axis A1 along the Z direction through an operation command from the control unit 13. The rotarily driving part 52 is composed of a belt, a motor and a rotary axis that are each known. When the rotarily driving part 52 is rotated around the axis A1, the substrate W held by the chuck pins 54 above the spin base 53 is rotated accordingly around the axis A1 together with the spin base 53.

The following will describe the process liquid supplying unit 21 (supplying unit).

The process liquid supplying unit 21 is a unit for supplying a dry assistant liquid on the pattern-formed surface of the substrate W. As illustrated in FIG. 1, the process liquid supplying unit 21 has at least a nozzle 22, an arm 23, a revolving axis 24, a pipe 25, a valve 26, and a process liquid storing part 27.

Figure 4A:
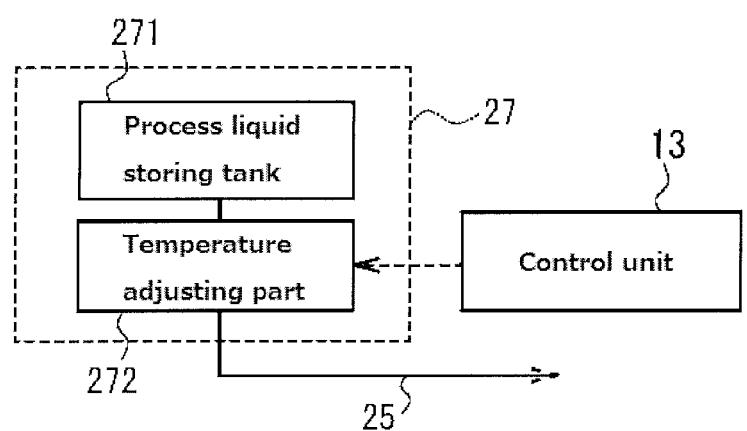
FIG. 4A is a block chart illustrating a schematic structure of a dry assistant liquid storing part in the substrate treating apparatus.

As illustrated in FIGS. 4A and 4B, the process liquid storing part 27 has at least a process liquid storing tank 271, a stirring part 277 for stirring the dry assistant liquid inside the process liquid storing tank 271, a pressurizing part 274 for pressurizing the process liquid storing tank 271 to send out the dry assistant liquid, and a temperature adjusting part 272 for heating the dry assistant liquid inside the process liquid storing tank 271. For reference, FIG. 4A is a block chart illustrating a schematic structure of the process liquid storing part 27, and FIG. 4B is an explanatory view illustrating a specific structure of the process liquid storing part 27.

The stirring part 277 has a rotary part 279 for stirring the dry assistant liquid inside the process liquid storing tank 271, and a stirring control part 278 for controlling the rotation of the rotary part 279. The stirring control unit 278 is electrically connected to the control unit 13. About the rotary part 279, a tip of its rotary axis (the lower end of the rotary part 279 in FIG. 5) has propeller-form stirring fans. The control unit 13 sends an operation command to the stirring control unit 278 to rotate the rotary part 279, so that the stirring fans stir the dry assistant liquid. Consequently, the concentration of a dry assistant substance and others in the dry assistant liquid, and the temperature of the liquid are made uniform.

The method for uniformizing the concentration in the dry assistant liquid in the process liquid storing tank 271 and the temperature of the liquid is not limited to the above-mentioned method, and may be a known method, such as a method of fitting a circulating pump separately into the apparatus to circulate the dry assistant liquid.

The pressurizing part 274 is composed of a nitrogen gas tank 275 which is a source for supplying a gas for pressurizing the inside of the process liquid storing tank 271, a pump 276 for pressurizing nitrogen gas, and a pipe 273. The nitrogen gas tank 275 is connected through the pipe 273 to the process liquid storing tank 271. The pump 273 is fitted into the middle of the pipe 276.

The temperature adjusting part 272 is electrically connected to the control unit 13, and is a section for heating the dry assistant liquid stored in the process liquid storing tank 271 through an operation command from the control unit 13 to adjust the temperature of the liquid. It is sufficient for the temperature adjustment to be made to adjust the liquid temperature of the dry assistant liquid to a temperature not lower than the melting point of the dry assistant substance (sublimable substance; details thereof are to be described later) contained in the dry assistant liquid. This way makes it possible to maintain the melt state of the dry assistant substance. The upper limit of the adjusted temperature is preferably a temperature lower than the boiling point of the dry assistant substance. The temperature adjusting part 272 is not particularly limited, and may be, for example, a known temperature adjusting mechanism such as a resistor heating heater, a Peltier element, or a pipe through which temperature-adjusted water is passed. In the present embodiment, the temperature adjusting part 272 may have any structure. When the installation environment of the substrate treating apparatus 1 is, for example, an environment having a higher temperature than the melting point of the sublimable substance, the melt state of the sublimable substance can be maintained so that the heating of the dry assistant liquid is not required. As a result, the temperature adjusting part 272 can be omitted.

Returning FIG. 1, the process liquid storing part 27 (more specifically, the process liquid storing tank 271) is connected through a pipe 25 to the nozzle 22, and the valve 26 is fitted into the middle of the pipe 25.

A gas pressure sensor (not illustrated) is set inside the process liquid storing tank 271, and is electrically connected to the control unit 13. On the basis of a value detected through the gas pressure sensor, the control unit 13 controls the operation of the pump 276 to keep the pressure of the gas in the process liquid storing tank 271 at a predetermined gas pressure higher than any atmospheric pressure. In the meantime, the valve 26 is also electrically connected to the control unit 13, and is usually closed. The opening and closing of the valve 26 are also each controlled through an operation command from the control unit 13. When the control unit 13 sends an operation command to the process liquid supplying unit 21 to open the valve 26, from the inside of the pressurized process liquid storing tank 271 the dry assistant liquid is sent under pressure to be passed through the pipe 25 and then discharged from the nozzle 22. This way makes it possible to supply the dry assistant liquid to the front surface Wf of the substrate W. As described above, the process liquid storing tank 271 sends the dry assistant liquid under pressure, using the pressure based on the nitrogen gas; thus, it is preferred that the process liquid storing tank 271 is made into an airtight form.

The nozzle 22 is fitted to a front tip of the arm 23 extended horizontally, and is located over the spin base 53. A rear tip of the arm 23 is freely rotatably supported around an axis J1 by the revolving axis 24 extended in the Z direction. The revolving axis 24 is located to be fixed inside the chamber 11. The arm 23 is connected through the revolving axis 24 to the revolvingly driving part 14. The revolvingly driving part 14 is electrically connected to the control unit 13, and moves the arm 23 revolvingly around the axis J1 through an operation command from the control unit 13. With the revolving movement of the arm 23, the nozzle 22 is also shifted.

As represented by a solid line in FIG. 2, the nozzle 22 is usually located at a retiring position P1 outside the peripheral portion of the substrate W and outside the scattering-preventing cup 12. When the arm 23 is revolvingly moved through an operation command from the control unit 13, the nozzle 22 is shifted along a path represented by an arrow AR1 to be arranged at a position over a central portion of the front surface Wf of the substrate W (over the position of the axis A1 or the vicinity thereof).

Returning to FIG. 1, the following will describe the IPA supplying unit 31. The IPA supplying unit 31 is a unit for supplying IPA (isopropyl alcohol) to the substrate W, and has a nozzle 32, an arm 33, a revolving axis 34, a pipe 35, a valve 36 and an IPA tank 37.

The IPA tank 37 is connected through the pipe 35 to the nozzle 32. The valve 36 is fitted into the middle of the path of the pipe 35. In the IPA tank 37, IPA is stored. A pump not illustrated pressurizes IPA inside the IPA tank 37 to send IPA from the pipe 35 into the direction of the nozzle 32.

The valve 36 is electrically connected to the control unit 13, and is usually closed. The opening and closing of the valve 36 are each controlled through an operation command from the control unit 13. When the valve 36 is opened through an operation command from the control unit 13, IPA is passed through the pipe 35 to be supplied to the front surface Wf of the substrate W from the nozzle 32.

The nozzle 32 is fitted to a front tip of the arm 33 extended horizontally, and is located over the spin base 53. A rear tip of the arm 33 is freely rotatably supported around an axis J2 by the revolving axis 34 extended in the Z direction. The revolving axis 34 is located to be fixed inside the chamber 11. The arm 33 is connected through the revolving axis 34 to the revolvingly driving part 14. The revolvingly driving part 14 is electrically connected to the control unit 13, and moves the arm 33 revolvingly around the axis J2 through an operation command from the control unit 13. With the revolving movement of the arm 33, the nozzle 32 is also shifted.

As represented by a solid line in FIG. 2, the nozzle 32 is usually located at a retiring position P2 outside the peripheral portion of the substrate W and outside the scattering-preventing cup 12. When the arm 33 is revolvingly moved through an operation command from the control unit 13, the nozzle 32 is shifted along a path represented by an arrow AR2 to be arranged at a position over the central portion of the front surface Wf of the substrate W (over the position of the axis A1 or the vicinity thereof).

In the present embodiment, in the IPA supplying unit 31, IPA is used. In the present disclosure, however, the liquid used in this supplying unit is not limited to IPA as far as the liquid is soluble in the dry assistant substance and deionized water (DIW). Examples of an alternate for IPA in the present embodiment include methanol, ethanol, acetone, benzene, carbon tetrachloride, chloroform, hexane, decalin, tetralin, acetic acid, cyclohexanol, ether, and hydrofluoro ether.

Returning to FIG. 1, the following will describe the gas supplying unit 41. The gas supplying unit 41 is a unit for supplying a gas to the substrate W, and has a nozzle 42, an arm 43, a revolving axis 44, a pipe 45, a valve 46, and a gas tank 47.

Figure 5:
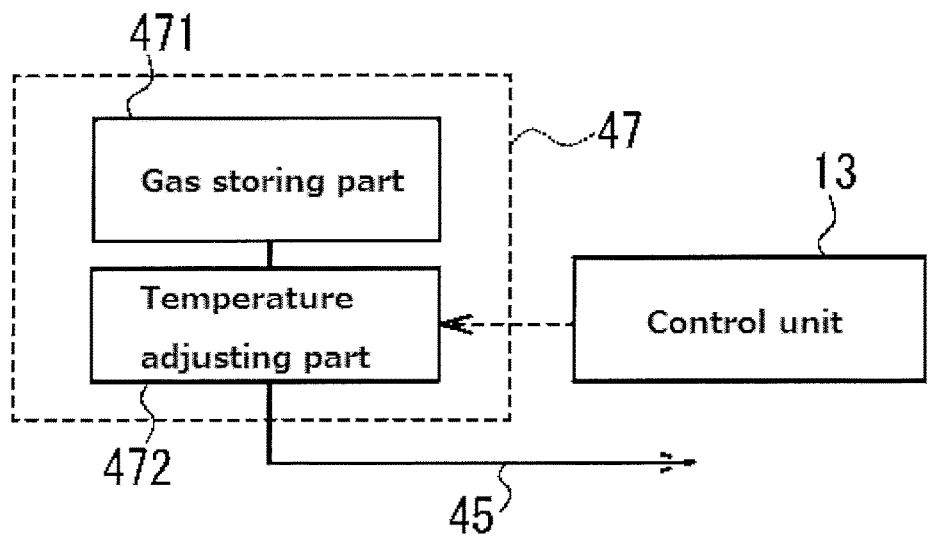
FIG. 5 is a block chart illustrating a schematic structure of a gas tank in the substrate treating apparatus.

FIG. 5 is a block chart illustrating a schematic structure of the gas tank 47. The gas tank 47 has a gas storing part 471 in which a gas is stored, and a gas temperature adjusting part 472 for adjusting the temperature of the gas stored in the gas storing part 471. The gas temperature adjusting part 472 is electrically connected to the control unit 13, and is a section for heating or cooling the gas stored in the gas storing part 471 through an operation command from the control unit 13 so as to adjust the temperature of the gas. It is sufficient for the temperature adjustment to be made to adjust the temperature of the gas stored in the gas storing part 471 to a low temperature not higher than the solidifying point of the dry assistant substance.

The gas temperature adjusting part 472 is not particularly limited, and may be a known gas temperature adjusting mechanism such as a Peltier element or a pipe through temperature-adjusted water is passed.

Returning to FIG. 1, the gas tank 47 (more specifically, the gas storing part 471) is connected through the pipe 45 to the nozzle 42. The valve 46 is fitted into the middle of the path of the pipe 45. A pressurizing unit not illustrated pressurizes the gas in the gas tank 47 to send the gas to the pipe 45. The pressurizing unit can be realized by pressurization through, e.g., a pump, or by compressing and storing the gas into the gas tank 47. Thus, the pressurizing unit may be any pressurizing unit.

The valve 46 is electrically connected to the control unit 13, and is usually closed. The opening and closing of the valve 46 are each controlled through an operation command from the control unit 13. When the valve 46 is opened through an operation command from the control unit 13, the gas is passed through the pipe 45 to be supplied from the nozzle 42 to the front surface Wf of the substrate W.

The nozzle 42 is fitted to a front tip of the arm 43 extended horizontally, and is located over the spin base 53. A rear tip of the arm 43 is freely rotatably supported around an axis J3 by the revolving axis 44 extended in the Z direction. The revolving axis 44 is located to be fixed inside the chamber 11. The arm 43 is connected through the revolving axis 44 to the revolvingly driving part 14. The revolvingly driving part 14 is electrically connected to the control unit 13, and moves the arm 43 revolvingly around the axis J3 through an operation command from the control unit 13. With the revolving movement of the arm 43, the nozzle 42 is also shifted.

As represented by a solid line in FIG. 2, the nozzle 42 is usually located at a retiring position P3 outside the peripheral portion of the substrate W and outside the scattering-preventing cup 12. When the arm 43 is revolvingly moved through an operation command from the control unit 13, the nozzle 42 is shifted along a path represented by an arrow AR3 to be arranged at a position over the central portion of the front surface Wf of the substrate W (over the position of the axis A1 or the vicinity thereof). In FIG. 2, a dotted line represents a situation that the nozzle 42 is arranged above the central portion of the front surface Wf.

In the gas storing part 471, an inert gas is stored, which is chemically inert to at least the dry assistant substance. More specifically, nitrogen gas is stored therein. In the gas temperature adjusting part 472, the stored nitrogen gas is adjusted into a temperature not higher than the solidifying point of the dry assistant substance. The nitrogen gas temperature is not particularly limited as far as the temperature is a temperature not higher than the solidifying point of the dry assistant substance. The temperature is usually set into a range from 0 to 15° C. both inclusive. When the nitrogen gas temperature is set to 0° C. or higher, the following can be prevented: water vapor present inside the chamber 11 is solidified to cause, for example, the adhesion of the resultant on the front surface Wf of the substrate W; and thus bad effects are produced on the substrate W.

The nitrogen gas used in the first embodiment is preferably a dry gas having a dew point of 0° C. or lower. When the nitrogen gas is blown to the solidified body, in an atmospheric-pressure environment, the dry assistant substance in the solidified sublimates into the nitrogen gas. Since the nitrogen gas is continuously supplied to the solidified body, the partial pressure of the gas-state dry assistant substance generated by the sublimation in the nitrogen gas is kept lower than the saturated vapor pressure of the gas-state dry assistant substance at the temperature of the nitrogen gas. Thus, at least the surface of the solidified body, is filled with the gas-state dry assistant substance in an atmosphere in which this substance is present at the saturated vapor pressure or less.

In the present embodiment, the gas supplied by the gas supplying unit 41 is nitrogen gas. In the present disclosure, however, the supplied gas is not particularly limited to this gas as far as the gas is a gas inert to the dry assistant substance. In the first embodiment, examples of a gas alternative for the nitrogen gas include argon gas, helium gas, and air (gas composed of nitrogen gas in a concentration of 80%, and oxygen gas in a concentration of 20%). Alternatively, the alternative gas may be a mixed gas in which two or more of these gases are mixed with each other.

Returning to FIG. 1, the pressure reducing unit 71 is a unit for reducing the pressure inside the chamber 11 to render the inside of the chamber 11 an environment having a pressure lower than any atmospheric pressure, and has an exhaust pump 72, a pipe 73, and a valve 74. The exhaust pump 72 is a known pump which is connected through the pipe 73 to the chamber 11 to apply pressure to a gas. The exhaust pump 72 is electrically connected to the control unit 13, and is usually in a stop state. The driving of the exhaust pump 72 is controlled through an operation command from the control unit 13. Moreover, the valve 74 is fitted into the middle of the pipe 73. The valve 74 is electrically connected to the control unit 13, and is usually closed. The opening and closing of the valve 74 are each controlled through an operation command from the control unit 13.

Through an operation command from the control unit 13 the exhaust pump 72 is driven and the valve 74 is opened, and then the gas present inside the chamber 11 is discharged through the pipe 73 to the outside of the chamber 11 by the exhaust pump 72.

The scattering-preventing cup 12 is located to surround the spin base 53. The scattering-preventing cup 12 is connected to an up-and-down driving mechanism, any illustration thereof being omitted, and can be raised up and lowered down in the Z direction. When the dry assistant liquid or IPA is supplied to the substrate W, the scattering-preventing cup 12 is positioned at a predetermined site as illustrated in FIG. 1 through the up-and-down mechanism to surround the substrate W held by the chuck pins 54 from side positions of the substrate. This way makes it possible to collect the dry assistant liquid, IPA and other liquids that are scattered from the substrate W or the spin base 53.

Figure 3:
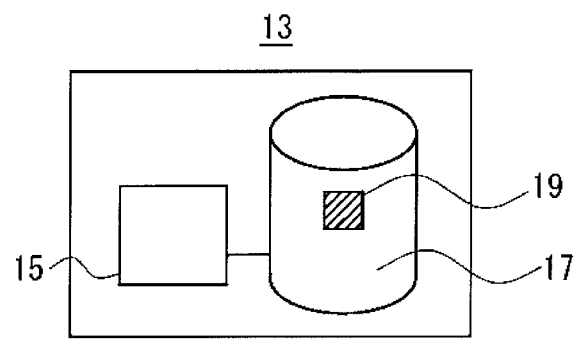
FIG. 3 is an explanatory view illustrating an outline of a control unit in the substrate treating apparatus.

FIG. 3 is a schematic view illustrating a structure of the control unit 13. The control unit 13 is electrically connected to the individual parts of the substrate treating apparatus 1 (see FIG. 1) to control the parts. The control unit 13 is made of a computer having an arithmetic processing part 15 and a memory 17. The arithmetic processing part 15 may be a CPU for making various arithmetic operations. The memory 17 has a ROM, which is a read-exclusive memory for memorizing a basic program; a RAM, which is a memory in which various data are memorized, and in/from which data can be freely written and read; and a magnetic disc in which a controlling software, data and others are memorized. In the magnetic disc, substrate treating conditions in accordance with the substrate W are beforehand stored as a substrate treating program 19 (also called a recipe). The CPU reads the content of the program into the RAM. In accordance with the content of the substrate treating program 19, which is read out by the RAM, the CPU controls the individual parts of the substrate treating apparatus 1.

<1-2. Dry Assistant Liquid>

The following will describe the dry assistant liquid used in the present embodiment.

The dry assistant liquid in the embodiment is a process liquid containing a dry assistant substance (sublimable substance) in a melt state, and fulfils the following function: in a drying treatment for removing a liquid present in a pattern-formed surface of a substrate, a function for assisting the drying treatment.

The sublimable substance is a substance having a property of undergoing a phase transition from a solid to a gas or from a gas to a solid without undergoing any liquid phase. Specifically, this substance may be a fluorinated carbon compound. The fluorinated carbon compound is a compound in which a fluoro group as a substituent is bonded to a carbon compound.

In the case of supplying, on a substrate, the dry assistant liquid containing such a fluorinated carbon compound in a melt state, the use of the fluorinated carbon compound as the dry assistant substance makes it possible to produce a solidified body in the form of a membrane having a uniform layer thickness. Moreover, the fluorinated carbon compound is higher in vapor pressure than DIW (vapor pressure: 2.3 kPa at 20° C.) or t-butanol (vapor pressure: 4.1 kPa at 20° C.), which is a conventional dry assistant substance. Thus, a solidified body of this fluorinated carbon compound can be sublimated at a higher sublimating speed than solidified bodies of such conventional substances. Furthermore, the fluorinated carbon compound has no OH group to be less soluble in water than t-butanol. Thus, even when the dry assistant liquid is supplied on a substrate, the liquid is not mixed with water remaining on the substrate. Consequently, after the solidified is sublimated, no water remains between convexo-concavities of a pattern on the substrate. These factors and other factors act in a multiple form, and thus the drying in the present embodiment can more highly restrain pattern collapse caused by surface tension than conventional substrate drying.

In the present embodiment, the fluorinated carbon compound is preferably at least one of compounds (A) to (E) described below. These compounds are usable singly or in any combination of two or more thereof.

Compound (A): a fluoroalkane having 3 to 6 carbon atoms, or the fluoroalkane to which a substituent is bonded;

Compound (B): a fluorocycloalkane having 3 to 6 carbon atoms, or the fluorocycloalkane to which a substituent is bonded;

Compound (C): a fluorobicycloalkane having 10 carbon atoms, or the fluorobicycloalkane to which a substituent is bonded;

Compound (D): a fluorotetracyanoquinodimetane, or the fluorotetracyanoquinodimetane to which a substituent is bonded; and Compound (E): a fluorocyclotriphosphazene, or the fluorocyclotriphosphazene to which a substituent is bonded.

[Compound (A)]

The compound (A) may be a fluoroalkane having 3 to 6 carbon atoms and represented by the general formula (1):

$$C_mH_nF_{2m+2-n} \quad (1)$$

wherein m represents an integer of 3 to 6 both inclusive, n represents an integer of 0 or more, and "2m+2−n"≥1.

More specific examples of the fluoroalkane having 3 carbon atoms include $CF_3CF_2CF_3$, $CHF_2CF_2CF_3$, $CH_2FCF_2CF_3$, $CH_3CF_2CH_3$, $CHF_2CF_2CH_3$, $CH_2FCF_2CH_3$, $CH_2FCF_2CH_2F$, $CHF_2CF_2CHF_2$, $CF_3CHFCF_3$, $CH_2FCHFCF_3$, $CHF_2CHFCF_3$, $CH_2FCHFCH_2F$, $CHF_2CHFCHF_2$, $CH_3CHFCH_3$, $CH_2FCHFCH_3$, $CHF_2CHFCH_3$, $CF_3CH_2CF_3$, $CH_2FCH_2CF_3$, $CHF_2CH_2CF_3$, $CH_2FCH_2CH_2F$, $CH_2FCH_2CHF_2$, $CHF_2CH_2CHF_2$, $CH_3CH_2CH_2F$, and $CH_3CH_2CHF_2$.

Examples of the fluoroalkane having 4 carbon atoms include $CF_3(CF_2)_2CF_3$, $CF_3(CF_2)_2CH_2F$, $CF_3CF_2CH_2CF_3$, $CHF_2(CF_2)_2CHF_2$, $CHF_2CHFCF_2CHF_2$, $CF_3CH_2CF_2CHF_2$, $CF_3CHFCH_2CF_3$, $CHF_2CHFCHFCHF_2$, $CF_3CH_2CF_2CH_3$, $CF_3CF_2CH_2CH_3$, $CF_3CHFCF_2CH_3$, and $CHF_2CH_2CF_2CH_3$.

Examples of the fluoroalkane having 5 carbon atoms include $CF_3(CF_2)_3CF_3$, $CF_3CF_2CF_2CHFCF_3$, $CHF_2(CF_2)_3CF_3$, $CHF_2(CF_2)_3CHF_2$, $CF_3CH(CF_3)CH_2CF_3$, $CF_3CHFCF_2CH_2CF_3$, $CF_3CF(CF_3)CH_2CHF_2$, $CHF_2CHFCF_2CHFCHF_2$, $CF_3CH_2CF_2CH_2CF_3$, $CHF_2(CF_2)_2CHFCH_3$, $CHF_2CH_2CF_2CH_2CHF_2$, and $CF_3(CH_2)_3CF_3$, $CF_3CHFCHFCF_2CF_3$.

Examples of the fluoroalkane having 6 carbon atoms include $CF_3(CF_2)_4CF_3$, $CF_3(CF_2)_4CHF_2$, $CF_3(CF_2)_4CH_2F$, $CF_3CH(CF_3)CHFCF_2CF_3$, $CHF_2(CF_2)_4CHF_2$, $CF_3CF_2CH(CF_3)CF_3$, $CF_3CF_2(CH_2)_2CF_2CF_3$, $CF_3CH_2(CF_2)_2CH_2CF_3$, $CF_3(CF_2)_3CH_2CF_3$, $CF_3CH(CF_3)(CH_2)_2CF_3$, $CHF_2CF_2(CH_2)_2CF_2CHF_2$, $CF_3(CF_2)_2(CH_2)_2CH_3$.

The compound (A) may be the fluoroalkane, which has 3 to 6 carbon atoms, to which a substituent is bonded. The substituent may be at least one selected from the group consisting of halogen groups other than a fluoro group (specifically, chloro, bromo and iodo groups), a hydroxyl group, an oxygen atom, alkyl groups, a carboxyl group, and perfluoroalkyl groups.

Examples of the alkyl group include methyl, ethyl, n-propyl, isopropyl, n-butyl, and t-butyl groups.

The perfluoroalkyl group is not particularly limited, and examples thereof include any saturated perfluoroalkyl group, and any unsaturated perfluoroalkyl group. The perfluoroalkyl group may have a linear structure or a branched structure. More specific examples of the perfluoroalkyl group include trifluoromethyl, perfluoroethyl, perfluoro-n-propyl, perfluoroisopropyl, perfluoro-n-butyl, perfluoro-sec-butyl, perfluoro-tert-butyl, perfluoro-n-amyl, perfluoro-sec-amyl, perfluoro-tert-amyl, perfluoroisoamyl, perfluoro-n-hexyl, perfluoroisohexyl, perfluoroneohexyl, perfluoro-n-heptyl, perfluoroisoheptyl, perfluoroneoheptyl, perfluoro-n-octyl, perfluoroisooctyl, perfluoroneooctyl, perfluoro-n-nonyl, perfluoroneononyl, perfluoroisononyl, perfluoro-n-decyl, perfluoroisodecyl, perfluoroneodecyl, perfluoro-sec-decyl, and perfluoro-tert-decyl groups.

[Compound (B)]

The compound (B) may be a fluorocycloalkane having 3 to 6 carbon atoms and represented by the general formula (2):

$$C_mH_nF_{2m-n} \quad (2)$$

wherein m represents an integer of 3 to 6 both inclusive, n represents an integer of 0 or more, and "2m−n"≥1.

More specific examples of the fluorocycloalkane having 3 to 6 carbon atoms include monofluorocyclohexane, dodecafluorocyclohexane, 1,1,4-trifluorocyclohexane, 1,1,2,2-tetrafluorocyclobutane, 1,1,2,2,3-pentafluorocyclobutane, 1,2,2,3,3,4-hexafluorocyclobutane, 1,1,2,2,3,3-hexafluorocyclobutane, 1,1,2,2,3,3-hexafluorocyclobutane, 1,1,2,2,3,4-hexafluorocyclobutane, 1,1,2,2,3,3-hexafluorocyclopentane, 1,1,2,2,3,4-hexafluorolcyclopentane, 1,1,2,2,3,3,4-heptafluorocyclopentane, 1,1,2,2,3,4,5-heptafluorocyclopentane, 1,1,2,2,3,3,4,4-octafluorocyclopentane, 1,1,2,2,3,3,4,5-octafluorocyclopentane, 1,1,2,2,3,3,4,5-octafluorocyclopentane, 1,1,2,2,3,4,5,6-octafluorocyclohexane, 1,1,2,2,3,3,4,4-octafluorocyclohexane, 1,1,2,2,3,3,4,5-octafluorocyclohexane, 1,1,2,2,3,4,4,5,6-octafluorocyclohexane, 1,1,2,2,3,3,4,4,5-nonafluorocyclohexane, 1,1,2,2,3,3,4,5,6-nonafluorocyclohexane, 1,1,2,2,3,3,4,5,5,6-nonafluorocyclohexane, decafluorocyclohexane, 1,1,2,2,3,3,4,4,5,6-decafluorocyclohexane, 1,1,2,2,3,3,4,4,5,5-decafluorocyclohexane, 1,1,2,2,3,3,4,4,5,6-decafluorocyclohexane, perfluorocyclopropane, perfluorocyclobutane, perfluorocyclopentane, and perfluorocyclohexane.

The compound (B) may be the fluorocycloalkane, which has 3 to 6 carbon atoms, to which a substituent is bonded. The substituent may be at least one selected from the group consisting of halogen groups other than a fluoro group (specifically, chloro, bromo and iodo groups), a hydroxyl group, an oxygen atom, alkyl groups, a carboxyl group, and perfluoroalkyl groups. The alkyl group and the perfluoroalkyl group are not particularly limited. Examples thereof are the same as described about the compound (A).

Specific examples of the compound (B) in which a substituent is bonded to the fluorocycloalkane, which has 3 to 6 carbon atoms, include 1,2,2,3,3-tetrafluoro-1-trifluoromethylcyclobutane, 1,2,4,4-tetrafluoro-1-trifluoromethylcyclobutane, 2,2,3,3-tetrafluoro-1-trifluoromethylcyclobutane, 1,2,2-trifluoro-1-trimethylcyclobutane, 1,4,4,5,5-pentafluoro-1,2,2,3,3-pentamethylcyclopentane, 1,2,5,5-tetrafluoro-1,2-dimethylcyclopentane, 3,3,4,4,5,5,6,6-octafluoro-1,2-dimethylcyclohexane, 1,1,2,2-tetrachloro-3,3,4,4-tetrafluorocyclobutane, 2-fluorocyclohexanol, 4,4-difluorocyclohexanone, 4,4-difluorocyclohexanecarboxylic acid, 1,2,2,3,3,4,4,5,5,6,6-undecafluoro-1-(nonafluorobutyl)cyclohexanone, perfluoromethylcyclopropane, perfluorodimethylcyclopropane, perfluorotrimethylcyclopropane, perfluoromethylcyclobutane, perfluorodimethylcyclobutane, perfluorotrimethylcyclobutane, perfluoromethylcyclopentane, perfluorodimethylcyclopentane, perfluorotrimethylcyclopentane, perfluoromethylcyclohexane, perfluorodimethylcyclohexane, and perfluorotrimethylcyclohexane.

[Compound (C)]

Examples of the fluorobicycloalkane, which has 10 carbon atoms, as the compound (C) include fluorobicyclo[4.4.0]decane, fluorobicyclo[3.3.2]decane, perfluorobicyclo[4.4.0]decane, and perfluorobicyclo[3.3.2]decane.

The compound (C) may be the fluorobicycloalkane, which has 10 carbon atoms, to which a substituent is bonded. The substituent may be a halogen radical other than a fluoro group (specifically, a chloro, bromo or iodo groups), a cycloalkyl group which may have a halogen atom, or an alkyl group having a cycloalkyl group which may have a halogen atom.

In the cycloalkyl group which may have a halogen atom, examples of the halogen atom include fluorine, chlorine, bromine and iodine atoms. Examples of the cycloalkyl group which may have a halogen atom include cyclopropyl, cyclobutyl, cyclopentyl, cyclohexyl, cycloheptyl, perfluorocyclopropyl, perfluorocyclobutyl, perfluorocyclopentyl, perfluorocyclohexyl, and perfluorocycloheptyl groups.

In the alkyl group having a cycloalkyl group which may have a halogen atom, examples of the halogen atom include fluorine, chlorine, bromine and iodine atoms. In the alkyl group having a cycloalkyl group which may have a halogen atom, this cycloalkyl group, which may have a halogen atom, may be, for example, a cyclopropyl, cyclobutyl, cyclopentyl, cyclohexyl, cycloheptyl, perfluorocyclopropyl, perfluorocyclobutyl, perfluorocyclopentyl, perfluorocyclohexyl or perfluorcycloheptyl group. A specific example of the alkyl group having a cycloalkyl group which may have a halogen atom is a difluoro(undecafluorocyclohexyl)methyl group.

A specific example of the compound (C) in which a substituent is bonded to the fluorobicycloalkane, which has 10 carbon atoms, is 2-[difluoro(undecafluorocyclohexyl)methyl]-1,1,2,3,3,4,4,4a,5,5,6,6,7,7,8,8,8a-heptadecafluorodecahydronaphthalene.

[Compound (D)]

An example of the fluorotetracyanoquinodimethane as the compound (D) is tetrafluorocyanoquinodimethane.

The compound (D) may be, for example, a compound in which at least one of halogen groups other than a fluoro group (specifically, chloro, bromo, and iodo groups) is bonded to the fluorotetracyanoquinodimethane.

[Compound (E)]

Examples of the fluorocyclotriphosphazene as the compound (E) include hexafluorocyclotriphosphazene, octafluorocyclotetraphosphazene, decafluorocyclopentaphosphazene, and dodecafluorocyclohexaphosphazene.

The compound (E) may be a compound in which a substituent is bonded to the fluorocyclotriphosphazene. Examples of the substituent include halogen groups other than a fluoro group (specifically, chloro, bromo and iodo groups), and phenoxy and alkoxy (—OR) groups. Examples of R in the alkoxy groups include alky, fluoroalkyl, and aromatic groups. Examples of R include methyl, ethyl and other alkyl groups; trifluoromethyl and other fluoroalkyl groups; and phenyl and other aromatic groups.

Specific examples of the compound (E) in which a substituent as described above is bonded to the fluorocyclotriphosphazene include hexachlorocyclotriphosphazene, octachlorocyclotetraphosphazene, decachlorocyclopentaphosphazene, dodecacyclohexaphosphazene, and hexaphenoxycyclotriphosphazene.

The dry assistant liquid may be made only of a sublimable substance in a melt state, and may be a liquid further including an organic solvent besides the substance. In this case, the content of the sublimable substance is preferably 60% or more by mass, more preferably 95% or more by mass of the whole of the dry assistant liquid. The organic solvent is not particularly limited as far as the solvent shows compatibility with the sublimable substance in a melt state. Specific examples of the solvent include alcohols.

<1-3. Substrate Treating Method>

Figure 6:
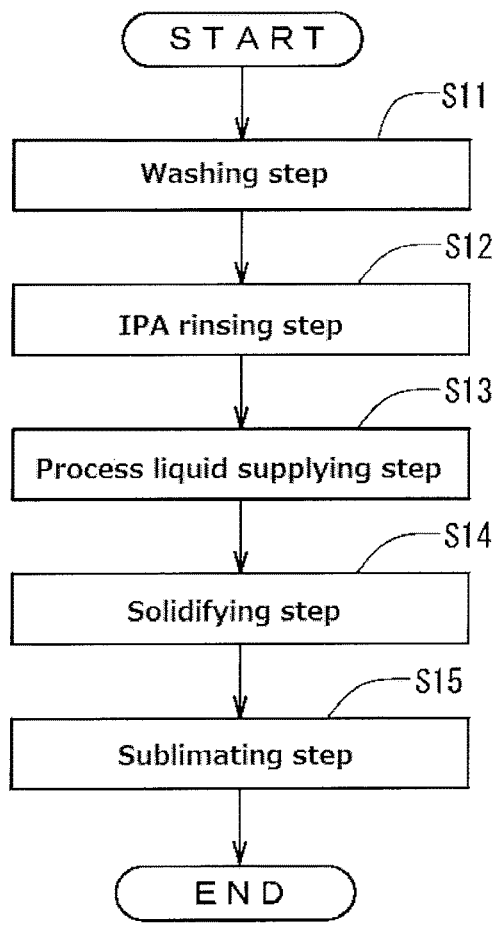
FIG. 6 is a flowchart showing a substrate treating method using the substrate treating apparatus.
Figure 7:
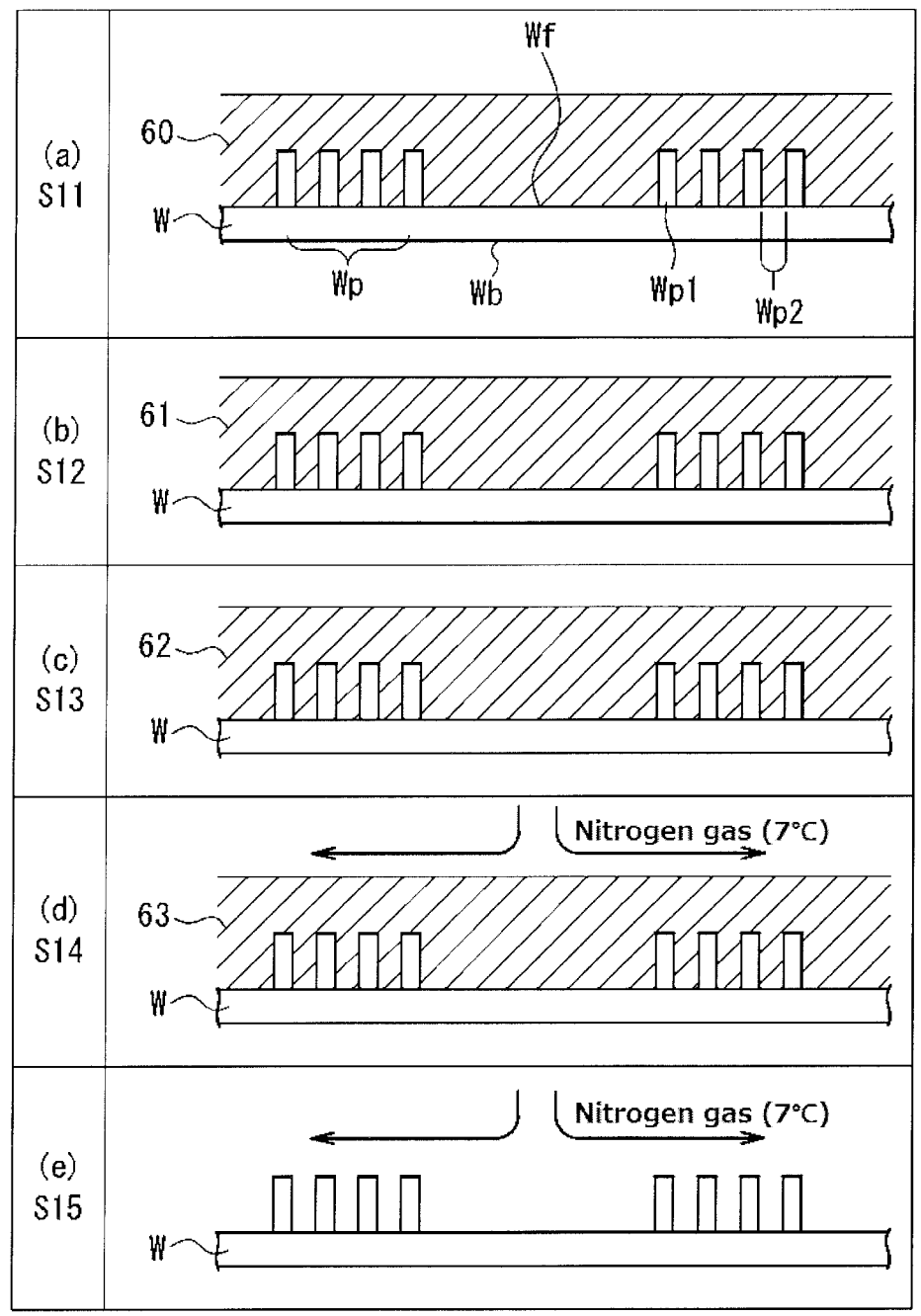
FIG. 7 is a view illustrating a situation of a substrate in each step in the substrate treating method.

Referring to FIGS. 6 and 7, the following will describe a substrate treating method using the substrate treating apparatus 1 of the present embodiment. FIG. 6 is a flowchart showing operations of the substrate treating apparatus 1 according to the first embodiment. FIG. 7 is a schematic view illustrating a situation of the substrate W in each of the steps in FIG. 6. On the substrate W, a pattern Wp having convexo-concavities is formed through the previous step. The pattern Wp has convexities Wp1 and concavities Wp2. In the present embodiment, the convexities Wp1 each have a height ranging from 100 to 600 nm and a width ranging from 10 to 50 nm. Any adjacent two of the convexities Wp1 have, therebetween, a shortest distance (shortest width between any one of the concavities Wp2) ranging from 10 to 50 nm. The aspect ratio of each of the convexities Wp1, that is, a value obtained by dividing the height with the width (height/width ratio) ranges from 10 to 20.

In FIGS. 7(a) to 7(e), the substrate W is treated in an environment having an atmospheric pressure unless otherwise specified clearly. This atmospheric pressure environment denotes an environment having a pressure in a range from 0.7 to 1.3 atm both inclusive, the center thereof being a standard atmospheric pressure (1 atm, 1013 hPa). When the substrate treating apparatus 1 is located, particularly, in a clean room having a positive pressure, the environment for the front surface Wf of the substrate W is greater than 1 atm.

Referring to FIG. 6, an operator commands the apparatus 1 to carry out the substrate processing program 19 in accordance with the predetermined substrate W. Thereafter, the control unit 13 gives operation commands to make operations described below as a preparation for carrying the substrate W into the substrate treating apparatus 1.

Specifically, the rotation of the rotarily driving part 52 is stopped to locate the chuck pins 54 at positions suitable for the delivery of the substrate W. Moreover, the valves 26, 36, 46 and 74 are opened and the nozzles 22, 32 and 42 are located at the retiring positions P1, P2 and P3, respectively. The chuck pins 54 are then made into open states by an opening and closing mechanism not illustrated.

The substrate W, which has not been treated, is carried into the substrate treating apparatus 1 by a substrate carrying-in/out mechanism not illustrated. The substrate W is then put onto the chuck pins 54, and then the chuck pins 54 are made into close states by the opening and closing mechanism not illustrated.

After the untreated substrate W is held by the substrate holder 51, the substrate is subjected to a washing step S11 by the wet washing unit not illustrated. The washing step S11 includes a step of supplying a washing liquid on the front surface Wf of the substrate W to wash the front surface Wf, and subsequently rinsing the substrate W to remove the washing liquid. The washing liquid is not particularly limited. Examples thereof include SC-1 (liquid containing ammonia, hydrogen peroxide water and water), and SC-2 (liquid containing hydrochloric acid, hydrogen peroxide water and water). The rinsing liquid is not particularly limited, and is, for example, DIW. The supply amount of the washing liquid and the rinsing liquid are not particularly limited, and may be appropriately set in accordance with, for example, a scope of the substrate that is to be washed. The washing period is not particularly limited, either, and may be appropriately set as required.

In the present embodiment, through the wet washing unit, SC-1 is supplied on the front surface Wf of the substrate W, and then DIW is further supplied on the front surface Wf to remove SC-1.

FIG. 7(a) illustrates the situation of the substrate W at the time when the washing step S11 is ended. As illustrated in FIG. 7(a), DIW (represented by reference number "60" in this figure) supplied in the washing step S11 adheres on the front surface Wf of the substrate W in which the pattern Wp is formed.

Returning to FIG. 6, an IPA rinsing step S12 is next performed in which IPA is supplied on the front surface Wf of the substrate W, onto which the DIW 60 adheres. Initially, the control unit 13 issues an operation command to the rotarily driving part 52 to rotate the substrate W at a constant velocity around the axis A1.

Next, the control unit 13 gives an operation command to the revolvingly driving part 14 to position the nozzle 32 to the central portion of the front surface Wf of the substrate W. The control unit 13 then gives an operation command to the valve 36 to open the valve 36. In this way, IPA is supplied from the IPA tank 37 through the pipe 35 and the nozzle 32 to the front surface Wf of the substrate W.

IPA supplied to the front surface Wf of the substrate W is caused to flow from the vicinity of the center of the front surface Wf of the substrate W to the peripheral portion of the substrate W by centrifugal force generated by the rotation of the substrate W, so that IPA is diffused on the whole of the front surface Wf of the substrate W. In this way, the supply of IPA attains the removal of DIW sticking on the front surface Wf of the substrate W, so that the whole of the front surface Wf of the substrate W is covered with IPA. The rotation speed of the substrate W is preferably set to make the membrane thickness of a membrane made of IPA higher than the height of the convexities Wp1 on the whole of the front surface Wf. The supply amount of IPA is not particularly limited, and may be appropriately set.

After the end of the IPA rinsing step S12, the control unit 13 gives an operation command to the valve 36 to close the valve 36. Moreover, the control unit 13 gives an operation command to the revolvingly driving part 14 to position the nozzle 32 at the retiring position P2.

FIG. 7(b) illustrates a situation of the substrate W at the end time of the IPA rinsing step S12. As illustrated in FIG. 7(b), IPA (represented by reference number "61" in this figure) supplied in the IPA rinsing step S12 adheres on the front surface Wf of the substrate W, on which the pattern Wp is formed. The DIW 60 is substituted with the IPA 61 to be removed from the front surface Wf of the substrate W.

Returning to FIG. 6, a process liquid supplying step (supplying step) S13 is performed in which a process liquid containing a dry assistant substance in a melt state is supplied as a dry assistant liquid on the front surface Wf of the substrate W, onto which the IPA 61 adheres. Initially, the control unit 13 gives an operation command to the rotarily driving part 52 to rotate the substrate W around the axis A1 at a constant speed. At this time, the rotation speed of the substrate W is preferably set to make the membrane thickness of a liquid membrane made of the dry assistant liquid higher than the height of the convexities Wp1 on the whole of the front surface Wf.

Subsequently, the control unit 13 gives an operation command to the revolvingly driving part 14 to position the nozzle 22 at the central portion of the front surface Wf of the substrate W. The control unit 13 then gives an operation command to the valve 26 to open the valve 26. In this way, the dry assistant liquid is supplied from the process liquid storing tank 271 through the pipe 25 and the nozzle 22 to the front surface Wf of the substrate W.

After the supplied dry assistant liquid is supplied to at least the front surface Wf of the substrate W, the liquid temperature of the liquid is set to a temperature which is not lower than the melting point of the dry assistant substance and is further lower than the boiling point of the substance. In the case of using, for example, the above-mentioned compound 1,1,2,2,3,3,4-heptafluorocyclopentane (boiling point: 82.5° C.), the liquid temperature of the dry assistant liquid is preferably set to a range from 35 to 82° C. both inclusive. Moreover, the supply amount of the dry assistant liquid is not particularly limited, and may be appropriately set.

As described above, by the supply of the dry assistant liquid in the state of a high temperature not lower than the melting point, the liquid membrane of the dry assistant liquid is formed on the front surface Wf of the substrate W, and subsequently a solidified body can be produced. As a result, the solidified body can be gained as a membrane-form solidified body with a uniform layer thickness. Thus, the substrate W can be decreased in drying-unevenness generation. When the temperature of the substrate W and that of the atmosphere in the chamber 11 are not higher than the melting point of the dry assistant substance, the supply of the dry assistant liquid having a temperature slightly higher than the melting point may cause the solidification of the dry assistant liquid in a period very short from the contact of the dry assistant liquid with the substrate W. In such a case, a solidified body having a uniform layer thickness cannot be produced so that the drying-unevenness is not easily decreased. Accordingly, when the temperature of the substrate W and that of the atmosphere in the chamber 11 are not higher than the melting point of the dry assistant substance, it is preferred to make a temperature adjustment to make the liquid temperature of the dry assistant liquid sufficiently higher than the melting point thereof.

Immediately before the dry assistant liquid is supplied to the front surface Wf of the substrate W, the liquid temperature of this liquid is preferably set to a temperature not lower than the "melting point of the dry assistant substance plus 10° C.". In a case where particles or air bubbles are present in the dry assistant liquid, these may become crystal nuclei when the dry assistant liquid is solidified. When the crystal nuclei are present in a large number, crystals grow from the individual crystal nuclei to produce crystal grains. In a boundary where any two of the crystal grains collide with each other, a crystal grain boundary is generated. The presence of the crystal grain boundaries causes stress to act on the pattern. In this way, pattern collapse may be caused. However, when the liquid temperature of the dry assistant liquid is set to the above-mentioned lower limit or higher, air bubbles present in the dry assistant liquid can be decreased or vanished. As a result, the generation of the crystal boundaries can be decreased to reduce the pattern collapse further.

The dry assistant liquid supplied to the front surface Wf of the substrate W is caused to flow from the vicinity of the center of the front surface Wf of the substrate W to the peripheral portion of the substrate W by centrifugal force generated by the rotation of the substrate W, so that the dry assistant liquid is diffused on the whole of the front surface Wf of the substrate W. In this way, the supply of the dry assistant liquid attains the removal of IPA adhering on the front surface Wf of the substrate W, so that the whole of the front surface Wf of the substrate W is covered with the dry assistant liquid. After the end of the process liquid supplying step S13, the control unit 13 gives an operation command to the valve 26 to close the valve 26. Moreover, the control unit 13 gives an operation command to the revolvingly driving part 14 to position the nozzle 22 at the retiring position P1.

FIG. 7(c) illustrates a situation of the substrate W at the end time of the process liquid supplying step S13. As illustrated in FIG. 7(c), the dry assistant liquid (represented by reference number "62" in this figure) supplied in the process liquid supplying step S13 adheres on the front surface Wf of the substrate W, on which the pattern Wp is formed. The IPA 61 is substituted with the dry assistant liquid 62 to be removed from the front surface Wf of the substrate W.

Returning to FIG. 6, a solidifying step S14 is next performed in which the dry assistant liquid 62 supplied on the front surface Wf of the substrate W is solidified to form a solidified membrane of the dry assistant liquid. Initially, the control unit 13 gives an operation command to the rotarily driving part 52 to rotate the substrate W around the axis A1 at a constant speed. At this time, the rotation speed of the substrate W is set to cause the dry assistant liquid 62 to be made into a membrane having a predetermined membrane thickness higher than the convexities Wp1 on the whole of the front surface Wf.

Subsequently, the control unit 13 gives an operation command to the revolvingly driving part 14 to position the nozzle 42 at the central portion of the front surface Wf of the substrate W. The control unit 13 then gives an operation command to the valve 46 to open the valve 46. In this way, a gas (nitrogen gas of 7° C. temperature in the present embodiment) is supplied from the gas tank 47 through the pipe 45 and the nozzle 42 to the front surface Wf of the substrate W.

The nitrogen gas supplied toward the front surface Wf of the substrate W is caused to flow from the vicinity of the center of the front surface Wf of the substrate W to the peripheral portion of the substrate W by centrifugal force generated by the rotation of the substrate W, so that the nitrogen gas is diffused onto the whole of the front surface Wf of the substrate W, which is covered with the dry assistant liquid 62. In this way, the liquid membrane of the dry assistant liquid 62, which is formed on the front surface Wf of the substrate W, is cooled to a low temperature not higher than the solidifying point of the dry assistant substance to be solidified. Thus, a solidified body is produced.

FIG. 7(d) illustrates a situation of the substrate W at the end time of the solidifying step S14. As illustrated in FIG. 7(d), the dry assistant liquid 62 supplied in the process liquid supplying step S13 is cooled by the supply of the nitrogen gas of 7° C. temperature to be solidified to produce a solidified body (represented by reference number "63" in this figure) containing the dry assistant substance.

Returning to FIG. 6, a sublimating step S15 is performed in which the solidified body 63 produced on the front surface Wf of the substrate W is sublimated to be removed from the front surface Wf of the substrate W. In the sublimating step S15 also, gas (nitrogen gas) from the nozzle 42 is supplied continuously from the solidifying step S14.

The partial pressure of the dry assistant substance in the nitrogen gas is set to a value lower than the saturated vapor pressure of the dry assistant substance at the supply temperature of the nitrogen gas. Accordingly, when the nitrogen gas in such a state is supplied onto the front surface Wf of the substrate W to contact the solidified body 63, the dry assistant substance is sublimated from the solidified body 63 into the nitrogen gas. Moreover, the nitrogen gas has a lower temperature than the melting point of the dry assistant substance; thus, the sublimation of the solidified body 63 can be attained while the solidified body 63 is prevented from being melted.

In this way, when IPA and other substances present on the front surface Wf of the substrate W are removed by the sublimation of the solid-state dry assistant substance, surface tension is prevented from acting on the pattern Wp so that the front surface Wf of the substrate W can be satisfactorily dried while the generation of pattern collapse is restrained.

FIG. 7(e) illustrates a situation of the substrate W at the end time of the sublimating step S15. As illustrated in FIG. 7(e), the solidified body 63 of the dry assistant substance, which is produced in the solidifying step S14, is sublimated by the supply of the nitrogen gas of 7° C. temperature. Thus, the solidified body 63 is removed from the front surface Wf to complete the drying of the front surface Wf of the substrate W.

After the end of the sublimating step S15, the control unit 13 gives an operation command to the valve 46 to close the valve 46. Moreover, the control unit 13 gives an operation command to the revolvingly driving part 14 to position the nozzle 42 at the retiring position P3.

Through this step, the substrate drying treatment series is ended. After the above-mentioned substrate drying treatment, the substrate carrying-in/out mechanism not illustrated is used to carry the drying-treated substrate W out from the chamber 11.

As described above, in the present embodiment, the dry assistant liquid, which contains the melt-state dry assistant substance made of the fluorinated carbon compound, is supplied on the front surface Wf of the substrate W, onto which IPA adheres. The dry assistant liquid is solidified on the front surface Wf of the substrate W to produce a solidified body containing the dry assistant substance. Thereafter, the solidified body is sublimated to be removed from the front surface Wf of the substrate W to attain the drying treatment of the substrate W.

The use of the fluorinated carbon compound as the dry assistant substance produces an advantage effect such that pattern collapse on the substrate can be restrained with a higher certainty in the present drying than in conventional substrate drying. This would be because factors described below and other factors act in a multiply form.

Factor 1: The dry assistant substance made of the fluorinated carbon compound is supplied in a melt state; thus, on the substrate, a membrane-form solidified body can be produced with a uniform layer thickness.

Factor 2: The fluorinated carbon compound is higher in vapor pressure than DIW (vapor pressure: 2.3 kPa at 20° C.) and t-butanol (vapor pressure: 4.1 kPa at 20° C.), which are conventional dry assistant substances; thus, the sublimating step can be performed at a larger sublimating speed than at a conventional speed.

Factor 3: The fluorinated carbon compound has no OH group to be less soluble in water than t-butanol; thus, this compound is not miscible with water remaining on the substrate, so that water does not remain between convexo-concavities of the pattern after the compound is sublimated.

Specific pattern-collapse-restraining effects will be described in the item "EXAMPLES", which will be given later.

In the present embodiment, in the solidifying step S14 and the sublimating step S15, the gas supplying unit 41 common to these steps is used to supply nitrogen gas, which is an inert gas chemically inert to the dry assistant substance, at a temperature not higher than the solidifying point of the dry assistant substance. This way makes it possible to start the sublimating step S15 immediately after the solidifying step S14 to produce advantageous effects of not only decreasing treating-periods associated with operations of the individual parts of the substrate treating apparatus 1, and a memory quantity for the substrate treating program 19 in the control unit 13 for operating the parts, but also reducing the number of parts used for the treatment to decrease costs for the apparatus. In the present embodiment, particularly, the above-mentioned pressure reducing unit 71 is not used. Thus, the pressure reducing unit 71 can be omitted.

Second Embodiment

A second embodiment according to the present disclosure will be described hereinafter.

The present embodiment is different from the first embodiment in that a process liquid is used as a washing liquid and/or a rinsing liquid and further the step of supplying the treatment is performed as a washing/rinsing step. In the present embodiment, this manner makes it possible to reduce the number of steps and improve the efficiency of the treatment, and to restrain pattern collapse. Thus, the surface of a substrate can be satisfactorily dried.

<2-1. Structure of Substrate Treating Apparatus, and Process Liquid>

A substrate treating apparatus and a control unit according to the second embodiment may be an apparatus and a unit which have the same constituents as the substrate treating apparatus 1 and the control unit 13 according to the first embodiment (see FIGS. 1 and 2). Thus, the same reference numbers are attached to the constituents, respectively, and descriptions thereon are omitted.

The above-mentioned process liquid supplying unit 21 is used as a wet washing unit and a rinsing unit in the present embodiment. The structure of a process liquid supplying unit in the embodiment as the wet washing unit and the rinsing unit is the same as in the first embodiment. Thus, descriptions thereon are omitted. However, in the present embodiment, an IPA rinsing step is omitted so that the above-mentioned IPA supplying unit 31 can also be omitted. A process liquid used in the present embodiment is also equivalent to the process liquid according to the first embodiment. Thus, descriptions thereon are omitted.

<2-2. Substrate Treating Method>

The following will describe a substrate treating method according to the second embodiment, using the substrate treating apparatus 1 having the same structure as the apparatus in the first embodiment.

Figure 8:
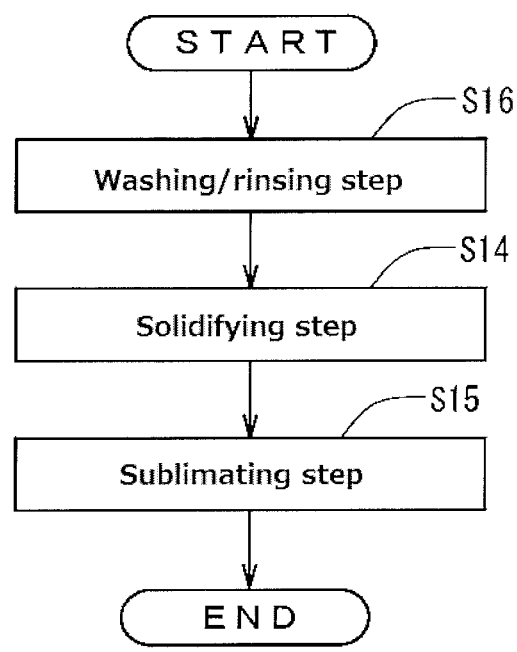
FIG. 8 is a flowchart showing a substrate treating method according to a second embodiment of the present invention.
Figure 9:
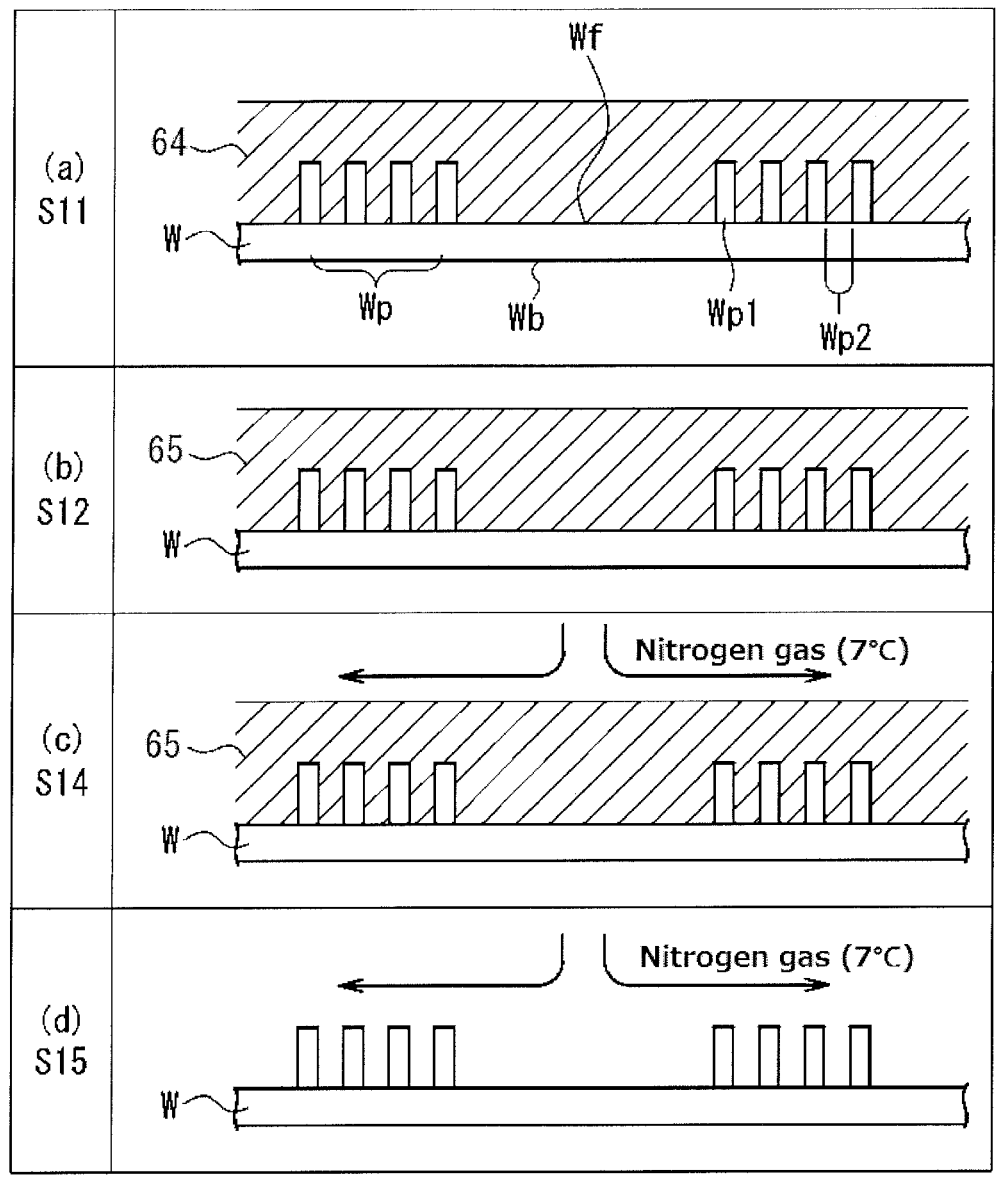
FIG. 9 is a view illustrating a situation of a substrate in each step in the substrate treating method according to the second embodiment of the present invention.

Hereinafter, a process for substrate treatment will be described with an appropriate reference to FIGS. 1, 2, 8 and 9. FIG. 8 is a flowchart showing operations of the substrate treating apparatus according to the second embodiment, which is an apparatus 1. FIG. 9 is a schematic view of a substrate W in each of the steps in FIG. 8. In the second embodiment, each of a solidifying step S14 and a sublimating step S15 illustrated in FIGS. 8, and 9(c) and 9(d) is the same as in the first embodiment. Thus, descriptions thereon are omitted.

As illustrated in FIG. 8, the substrate W that has not been treated is held by the substrate holder 51, and subsequently the substrate W is subjected to a washing/rinsing step S16. In the present step, the process liquid supplying unit 21 is used as a washing/rinsing unit.

Specifically, the control unit 13 gives an operation command to the rotarily driving part 52 to rotate the substrate W around the axis A1 at a constant speed. At this time, the rotation speed of the substrate W is preferably set to make the membrane thickness of a liquid membrane made of the process liquid as a washing liquid higher than the height of convexities Wp1 on the whole of a front surface Wf of the substrate.

Subsequently, the control unit 13 gives an operation command to the revolvingly driving part 14 to position the nozzle 22 at the central portion of the front surface Wf of the substrate W. The control unit 13 then gives an operation command to the valve 26 to open the valve 26. In this way, the process liquid as the washing liquid is supplied from the process liquid storing tank 271 through the pipe 25 and the nozzle 22 to the front surface Wf of the substrate W.

The liquid temperature of the supplied washing liquid (more specifically, the temperature of the liquid that has been supplied on the front surface Wf of the substrate W) is set to a temperature not lower than the melting point of a sublimable substance used in the present embodiment and lower than the boiling point thereof. Moreover, the supply amount of the washing liquid is not particularly limited, and may be appropriately set.

When the temperature of the substrate W and that of the atmosphere inside the chamber 11 are not higher than the melting point of the sublimable substance, the supply of a washing liquid of a temperature slightly higher than the melting point onto the substrate W may cause the washing liquid to be solidified in a very short period from the contact of the liquid with the substrate W. In such a case, a solidified body with a uniform layer thickness cannot be produced not to decrease the substrate easily in drying-unevenness. Accordingly, when the temperature of the substrate W and that of the atmosphere inside the chamber 11 are not higher than the melting point of the sublimable substance, it is preferred to make a temperature adjustment to make the liquid temperature of the washing liquid sufficiently higher than the melting point.

The washing liquid supplied to the front surface Wf of the substrate W is caused to flow from the vicinity of the center of the front surface Wf of the substrate W toward the peripheral portion of the substrate W by centrifugal force generated by the rotation of the substrate W, so that the washing liquid diffuses on the whole of the front surface Wf of the substrate W. In this way, the supply of the washing liquid attains the removal of an adherend and others that adhere onto the front surface Wf of the substrate W to cover the whole of the front surface Wf of the substrate W with the washing liquid. After the end of the washing, the control unit 13 gives an operation command to the valve 26 to close the valve 26. Moreover, the control unit 13 gives an operation command to the revolvingly driving part 14 to position the nozzle 22 to the retiring position P1.

FIG. 9(a) illustrates a situation of the substrate W at the end time of the washing. As illustrated in FIG. 9(a), the washing liquid (reference number "64" in this figure) supplied in the washing adheres on the front surface Wf of the substrate W on which the pattern Wp is formed, and the adherend is removed from the front surface Wf of the substrate W with the washing liquid 64.

Returning to FIG. 8, in the washing/rinsing step S16, the substrate W is further rinsed through the rinsing unit. A rinsing liquid used in this treatment is a process liquid, and the rinsing unit is the process liquid supplying unit 21.

The control unit 13 initially gives an operation command to the rotarily driving part 52 to rotate the substrate W around the axis A1 at a constant speed. Next, the control unit 13 gives an operation command to the revolvingly driving part 14 to position the nozzle 32 at the central portion of the front surface Wf of the substrate W. The control unit 13 then gives an operation command to the valve 36 to open the valve 36. In this way, the process liquid as the rinsing liquid is supplied from the process liquid storing tank 271 through the pipe 25 and the nozzle 22 to the front surface Wf of the substrate W.

The rinsing liquid supplied to the front surface Wf of the substrate W is caused to flow from the vicinity of the center of the front surface Wf of the substrate W toward the peripheral portion of the substrate W by centrifugal force generated by the rotation of the substrate W, so that the rinsing liquid diffuses on the whole of the front surface Wf of the substrate W. In this way, the supply of the rinsing liquid attains the removal of the washing liquid adhering on the front surface Wf of the substrate W to cover the whole of the front surface Wf of the substrate W with the rinsing liquid. The rotation speed of the substrate W is preferably set to make the membrane thickness of a membrane made of the rinsing liquid higher than the height of the convexities Wp1 on the whole of the front surface Wf. The supply amount of the rinsing liquid is not particularly limited, and may be appropriately set. Furthermore, the liquid temperature of the rinsing liquid is the same as set in the case of the liquid temperature of the above-mentioned washing liquid. The rinsing period is not particularly limited, either, and may be appropriately set as required.

After the end of the washing/rinsing step S16, the control unit 13 gives an operation command to the valve 26 to open the valve 26. Moreover, the control unit 13 gives an operation command to the revolvingly driving part 14 to position the nozzle 22 at the retiring position P1.

FIG. 9(b) illustrates a situation of the substrate W at the end time of the washing/rinsing step S16. As illustrated in FIG. 9(b), the rinsing liquid (represented by reference number "65" in this figure) supplied in the rinsing treatment adheres on the front surface Wf of the substrate W, on which the pattern Wp is formed. The washing liquid 64 is substituted with the rinsing liquid 65 to be removed from the front surface Wf of the substrate W.

Returning to FIG. 8, a solidifying step S14 is next performed in which the rinsing liquid 65 supplied on the front surface Wf of the substrate W is solidified to form a solidified membrane of the sublimable substance. Furthermore, a sublimating step S15 is performed in which a solidified body 63 produced on the front surface Wf of the substrate W is sublimated to be removed from the front surface Wf of the substrate W.

Through this step, the substrate drying treatment series in the present embodiment is ended. After the above-mentioned substrate drying treatment, the substrate carrying-in/out mechanism not illustrated is used to carry the drying-treated substrate W out from the chamber 11.

Third Embodiment

The following will describe a third embodiment of the present disclosure.

The present embodiment is different from the first embodiment in that a pattern-formed surface of a substrate is beforehand subjected to water-repellent treatment. When a solidified body is sublimated, the solidified body may cause stress to act on a pattern of a substrate. If the degree of the sublimation of the solidified body is nonuniform at this time, a nonuniform stress is applied to the pattern so that pattern collapse may be caused. However, by subjecting the pattern-formed surface beforehand to water-repellent treatment as performed in the present embodiment, convexities of the pattern are mutually repelled by repulsive force even when the pattern convexities are caused to move toward contact with each other. Consequently, pattern collapse can be prevented. In this case, the surface of the substrate can be more satisfactorily dried than in the case of subjecting the pattern-formed surface of the substrate to no water-repellent treatment.

<3-1. Structure of Substrate Treating Apparatus, and Dry Assistant Liquid>

Figure 10:
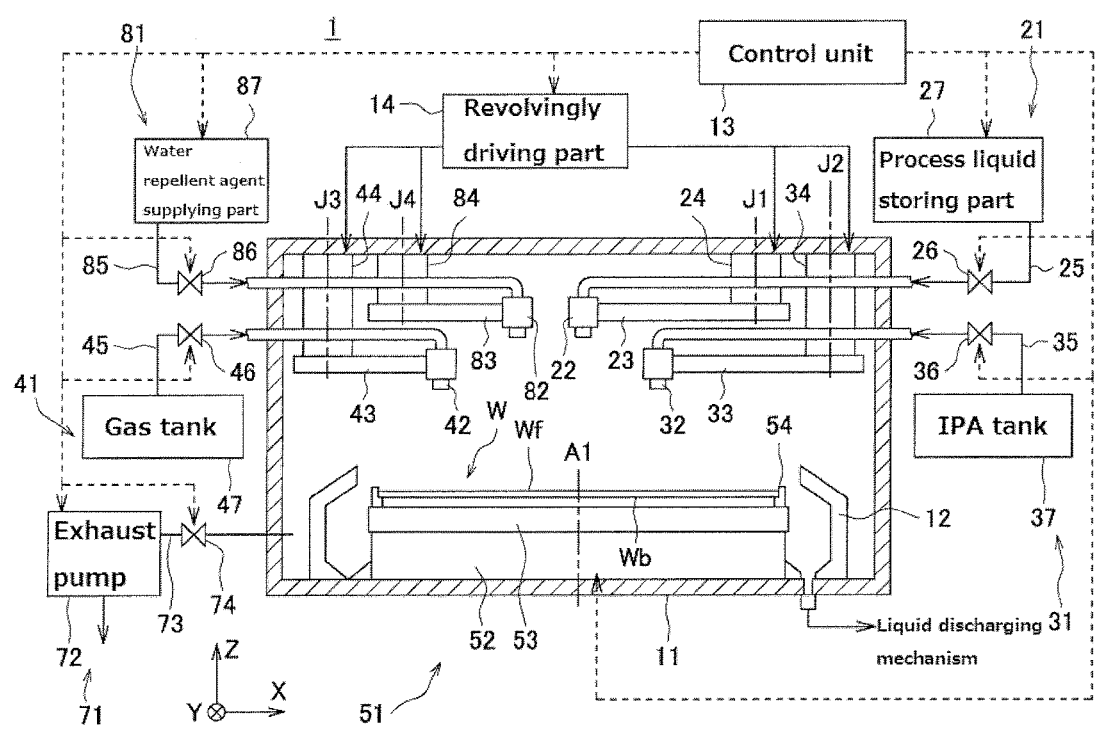
FIG. 10 is an explanatory view illustrating an outline of a substrate treating apparatus according to a third embodiment of the present invention.
Figure 11:
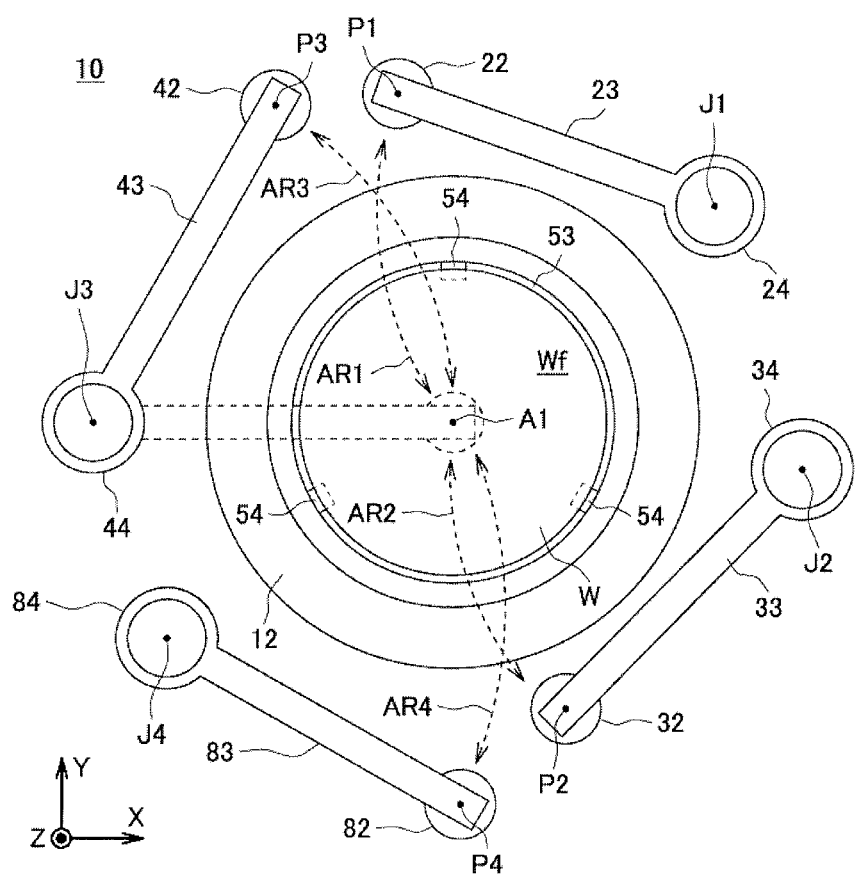
FIG. 11 is a schematic plan view illustrating this substrate treating apparatus.

Referring appropriately to FIGS. 10 and 11, the following will describe a substrate treating apparatus according to the third embodiment. FIG. 10 is an explanatory view illustrating an outline of this substrate treating apparatus, which is an apparatus 10 according to the present embodiment. FIG. 11 is a schematic pattern view illustrating an internal structure of the substrate treating apparatus 10.

The substrate treating apparatus 10 according to the third embodiment basically has the same constituents as the substrate treating apparatus 1 according to the first embodiment except that the former apparatus has a water repellent agent supplying unit 81 (see FIG. 10). A control unit in the third embodiment has the same constituents as the control unit 13 in the first embodiment. Thus, the same reference numbers as in the first embodiment are attached to members having the same functions in the third embodiment, and descriptions thereon are omitted.

The water repellent agent supplying unit 81 is a unit for supplying a water repellent agent to the pattern-formed surface of the substrate W. As illustrated in FIG. 10, this unit has a nozzle 82, an arm 83, a revolving axis 84, a pipe 85, a valve 86, and a water repellent agent supplying part 87.

The water repellent agent supplying part 87 is connected through the pipe 85 to the nozzle 82. The valve 86 is fitted to the middle of the pipe 85. In the water repellent agent supplying part 87, the water repellent is stored. Through a pump not illustrated, the water repellent in the water repellent agent supplying part 87 is pressurized to be sent from the pipe 85 in the direction of the nozzle 82. When the water repellent is in a gas form, the gas-form water repellent is stored in the water repellent agent supplying part 87. Through a pressurizing unit not illustrated, the gas-form water repellent is pressurized inside the water repellent agent supplying part 87 to be sent from the pipe 85 into the direction of the nozzle 82. The pressurization can be realized by pressurization through, for example, a pump, or compressive storage of a gas into a gas tank 47. Thus, any pressurizing unit may be used.

The valve 86 is electrically connected to the control unit 13, and is usually closed. The opening and closing of the valve 86 are controlled through an operation command from the control unit 13. When the valve 86 is opened through an operation command from the control unit 13, the water repellent is passed through the pipe 85 to be sent from the nozzle 82 to the front surface Wf of the substrate W.

The nozzle 82 is fitted to a front tip of the arm 83 extended horizontally, and is located over the spin base 53. A rear tip of the arm 83 is freely rotatably supported around an axis J4 by the revolving axis 84 extended in the Z direction. The revolving axis 84 is located to be fixed inside the chamber 11. The arm 83 is connected through the revolving axis 84 to the revolvingly driving part 14. The revolvingly driving part 14 is electrically connected to the control unit 13, and moves the arm 83 revolvingly around the axis J4 through an operation command from the control unit 13. With the revolving movement of the arm 83, the nozzle 82 is also shifted.

As represented by a solid line in FIG. 11, the nozzle 82 is usually located at a retiring position P4 outside the peripheral portion of the substrate W and outside the scattering-preventing cup 12. When the arm 83 is revolvingly moved through an operation command from the control unit 13, the nozzle 82 is shifted along a path represented by an arrow AR4 to be arranged at a position over the central portion of the front surface Wf of the substrate W (over the position of the axis A1 or the vicinity thereof).

The dry assistant liquid used in the present embodiment is the same as in the first embodiment. Thus, descriptions thereon are omitted.

<3-2. Water Repellent>

The following will describe the water repellent used in the present embodiment.

The water repellent used in the embodiment is not particularly limited as far as the repellent is an agent which can formed into a protecting film on the surface of a pattern and shows compatibility with the dry assistant liquid. When the substrate W is made of a silicon based material such as silicon oxide, silicon nitride, polycrystalline silicon or monocrystalline silicon, the water repellent may be, for example, a silicon based water repellent, a non-chlorine based water repellent, or a metal based water repellent.

The silicon based water repellent is not particularly limited. Examples thereof include hydrofluoric acid, and silane coupling agents (such as HMDS (hexamethyldisilazane), alkyldisilazanes, TMS (tetramethylsilane), fluorinated alkylchlorosilanes, and alkyldisilazanes). The non-chlorine based water repellent is not particularly limited. Examples thereof include dimethylsilyldimethylamine, dimethylsilyldiethylamine, hexamethyldisilazane, tetramethyldisilazane, bis(dimethylamino)dimethylsilane, N,N-dimethylaminotrimethylsilane, N-(trimethylsilyl)dimethylamine, and organosilane compounds. The metal based water repellent is not particularly limited. Examples thereof include amines having a hydrophobic group, and organic silicon compounds. These agents may be used singly or in any combination of two or more thereof. The water repellent may be in a liquid form or gas form.

When the water repellent is in a liquid form, the water repellent may contain a solvent that may be used for dilution. The solvent is, for example, HMDS (hexamethyldisilazane).

<3-3. Substrate Treating Method>

The following will describe a substrate treating method according to the third embodiment, using the substrate treating apparatus 10 according to the present embodiment.

Figure 12:
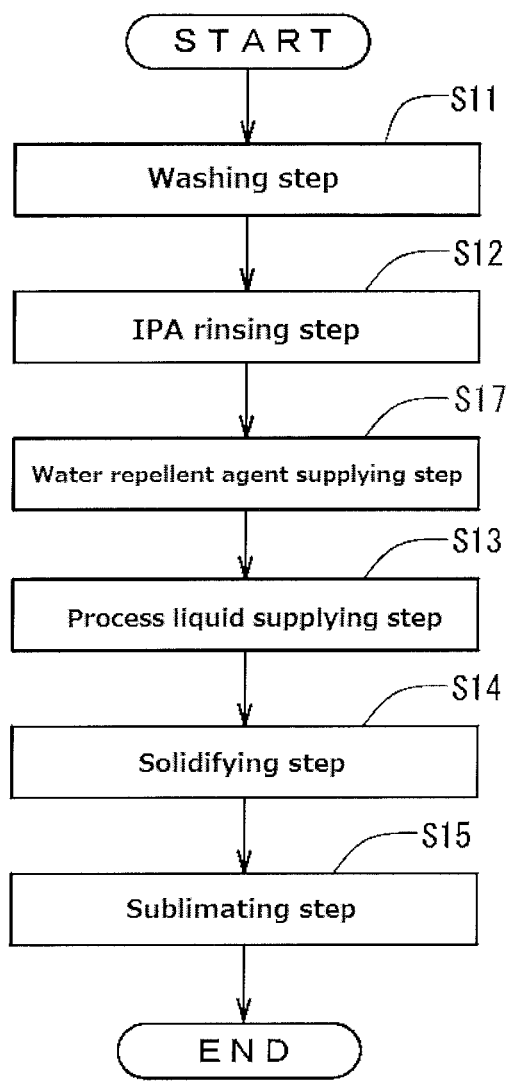
FIG. 12 is a flowchart showing a substrate treating method using the substrate treating apparatus.
Figure 13:
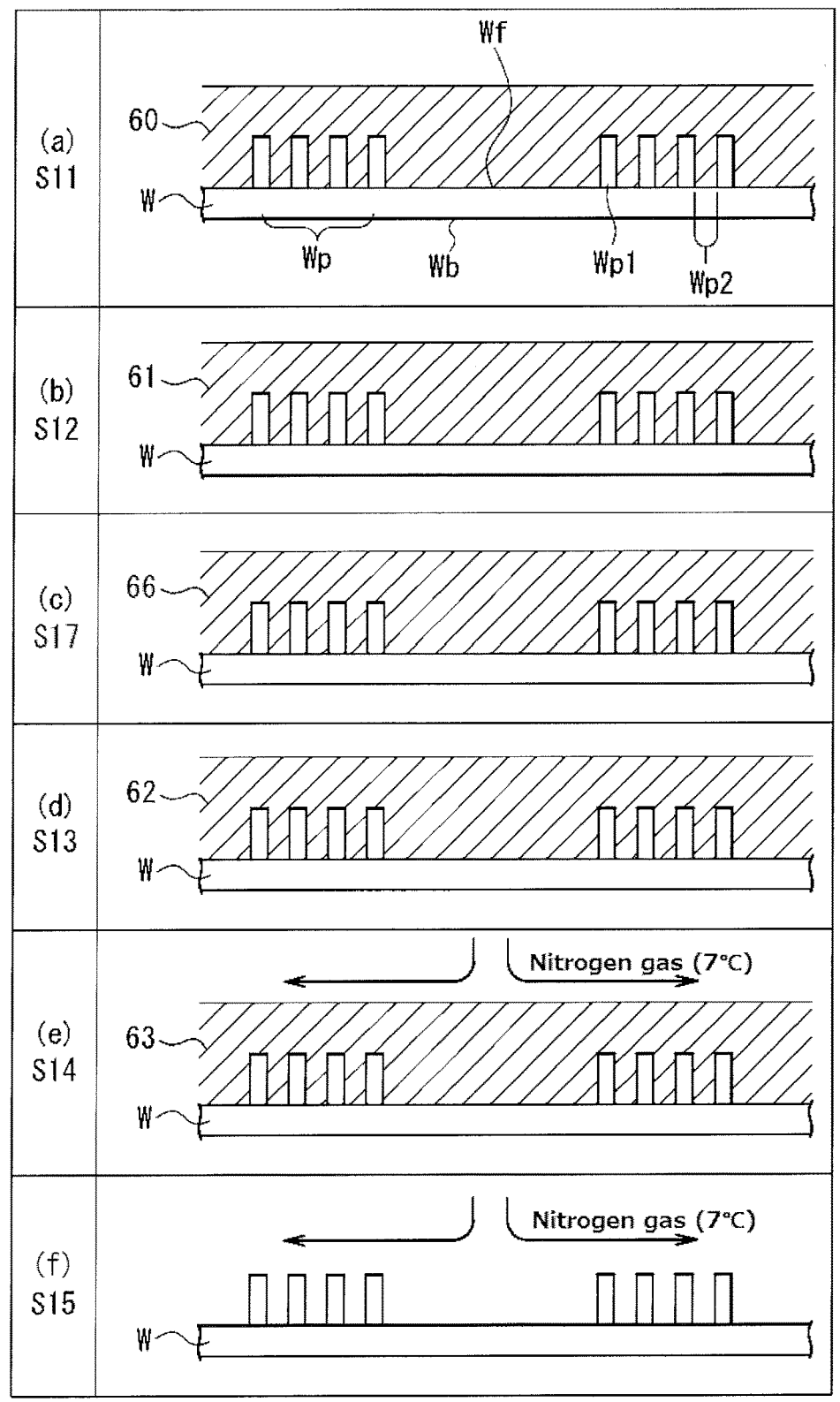
FIG. 13 is a view illustrating a situation of a substrate in each step in the substrate treating method according to the third embodiment.

Hereinafter, a process for substrate treatment will be described with an appropriate reference to FIGS. 12 and 13. FIG. 12 is a flowchart showing operations of the substrate treating apparatus 10 according to the third embodiment. FIG. 13 is a schematic view illustrating a situation of the substrate W in each of the steps in FIG. 12. In the third embodiment, a washing step S11, an IPA rinsing step S12, a process liquid supplying step S13, a solidifying step S14, and a sublimating step S15 illustrated in FIGS. 13(a) to 13(f) (except FIG. 13(c)), respectively, are the same as in the first embodiment. Thus, descriptions thereon are omitted.

As illustrated in FIG. 12, a water repellence treating step S17 is performed in which a water repellent is supplied on the front surface Wf of the substrate W onto which IPA 61 adheres through the IPA rinsing step. Initially, the control unit 13 gives an operation command to the rotarily driving part 52 to rotate the substrate W around the axis A1 at a constant speed. At this time, the rotation speed of the substrate W is preferably set to make the membrane thickness of a liquid membrane of the dry assistant liquid higher than the height of convexities Wp1 on the whole of the front surface Wf.

Subsequently, the control unit 13 gives an operation command to the revolvingly driving part 14 to position the nozzle 82 at the central portion of the front surface Wf of the substrate W. The control unit 13 then gives an operation command to the valve 86 to open the valve 86. In this way, the water repellent is supplied from the water repellent agent supplying part 87 through the pipe 85 and the nozzle 82 to the front surface Wf of the substrate W.

The liquid temperature and the supply amount of the supplied water repellent are not particularly limited, and may be appropriately set as required. It is preferred to use, as the water repellent, a water repellent for increasing the contact angle between water and the water-repellency-treated substrate W.

The water repellent supplied on the front surface Wf of the substrate W is caused to flow from the vicinity of the center of the front surface Wf of the substrate W to the peripheral portion of the substrate W by centrifugal force generated by the rotation of the substrate W so that the water repellent diffuses on the whole of the front surface Wf of the substrate W. In this way, the supply of the water repellent attains the removal of IPA adhering on the front surface Wf of the substrate W to cover the whole of the front surface Wf of the substrate W with the water repellent. After the end of the water repellency treating step S17, the control unit 13 gives an operation command to the valve 86 to close the valve 86. Moreover, the control unit 13 gives an operation command to the revolvingly driving part 14 to position the nozzle 82 at the retiring position P4.

FIG. 13(c) illustrates a situation of the substrate W at the end time of the water repellency treating step S17. As illustrated in FIG. 13(c), the water repellent (represented by reference number "66" in this figure) supplied in the water repellency treating step S17 adheres on the front surface Wf of the substrate W, on which the pattern Wp is formed. The IPA 61 is substituted with the water repellent 66 to be removed from the front surface Wf of the substrate W.

Subsequently, a process liquid supplying step (supplying step) S13 is performed in which a dry assistant liquid containing a sublimable substance in a melt state is supplied on the front surface Wf of the substrate W onto which the water repellent 66 adheres. Individual steps after the process liquid supplying step S13 are the same as in the substrate treating method according to the first embodiment.

Through this step, the substrate drying treatment series in the present embodiment is ended. After the above-mentioned substrate drying treatment, the substrate carrying-in/out mechanism not illustrated is used to carry the drying-treated substrate W out from the chamber 11.

The present embodiment is applicable to the substrate treating method according to the second embodiment. In this case, the water repellency treating step S17 may be performed immediately before the washing/rinsing step S16. In this way, even when the sublimation of the solidified body advances nonuniformly and thus a nonuniform stress is applied to the pattern so that its convexities are caused to move toward contact with each other, the pattern convexities are mutually repelled so that pattern collapse can be restrained. As a result, in the second embodiment also, pattern collapse can be further restrained.

Fourth Embodiment

The following will describe a fourth embodiment of the present disclosure. The present embodiment is different from the first and second embodiments in that in a solidifying step S14 and a sublimating step S15, the inside of a chamber is decreased in pressure instead of the supply of the nitrogen gas. In this way also, the surface of a substrate W can be satisfactorily dried while pattern collapse is restrained.

<4-1. Entire Structure of Substrate Treating Apparatus and Dry Assistant Liquid>

A substrate treating apparatus and a control unit according to the fourth embodiment basically have the same constituents as the substrate treating apparatus 1 and the control unit 13 according to the first embodiment (see FIGS. 1 and 2). Thus, the same reference numbers as in the first embodiment are attached to the constituents in the fourth embodiment, and descriptions thereon are omitted. A dry assistant liquid used in the present embodiment is also the same as used in the first embodiment, and descriptions thereon are omitted.

<4-2. Substrate Treating Method>

The following will describe a substrate treating method according to the fourth embodiment, using the substrate treating apparatus 1 having the same structure as the apparatus in the first embodiment.

Figure 14:
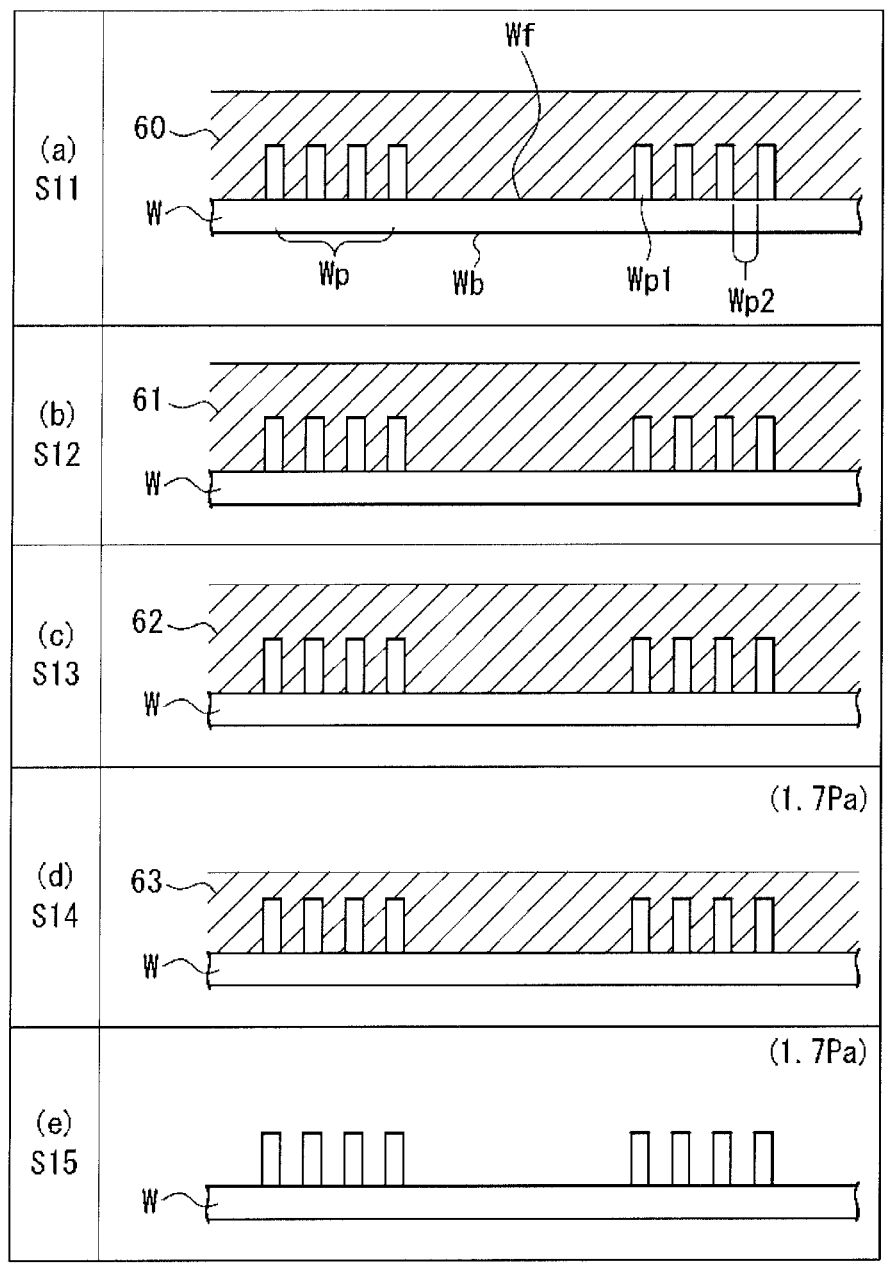
FIG. 14 is a view illustrating a situation of a substrate in each step in the substrate treating method according to a fourth embodiment.

Hereinafter, a process for substrate treatment will be described with an appropriate reference to FIGS. 1, 2, 6 and 14. FIG. 14 is a schematic view illustrating a situation of a substrate W in each step in FIG. 6. In the fourth embodiment, a washing S11, an IPA rinsing step S12 and a process liquid supplying step S13 illustrated in FIG. 6, and FIGS. 14(a) to 14(c) are the same as in the first embodiment. Thus, descriptions thereon are omitted.

FIG. 14(a) illustrates the substrate W having a front surface Wf covered with a liquid membrane of DIW 60 at the end time of the washing step S11 in the fourth embodiment. FIG. 14(b) illustrates the substrate W the front surface Wf of which is covered with a liquid membrane of IPA 61 at the end time of the IPA rinsing step S12 in the fourth embodiment. FIG. 14(c) illustrates the substrate W the front surface Wf of which is covered with a liquid membrane of a dry assistant liquid 62 in which a dry assistant substance (sublimable substance) is melted at the end time of the process liquid supplying step S13 in the fourth embodiment.

In each of FIGS. 14(a) to 14(e), the substrate W is treated in an environment having an atmospheric pressure unless otherwise specified. This atmospheric pressure environment denotes an environment having a pressure in a range from 0.7 to 1.3 atm both inclusive, the center thereof being a standard atmospheric pressure (1 atm, 1013 hPa). When the substrate treating apparatus 1 is located, particularly, in a clean room having a positive pressure, the environment for the front surface Wf of the substrate W is higher than 1 atm. A treatment (details thereof being to be described later) illustrated in each of FIGS. 14(d) and 14(e) is conducted in an environment of a reduced-pressure of 1.7 Pa ($1.7 \times 10^{-0.5}$ atm).

Referring to FIG. 6, after the washing step S11, the IPA rinsing step S12 and the process liquid supplying step S13 are conducted, a solidifying step S14 is performed in which a liquid membrane of the dry assistant liquid 62 supplied on the front surface Wf of the substrate W is solidified to produce a solidified body containing the dry assistant substance. Specifically, the control unit 13 initially gives an operation command to the rotarily driving part 52 to rotate the substrate W around the axis A1 at a constant speed. At this time, the rotation speed of the substrate W is preferably set to make the membrane thickness of the liquid membrane of the dry assistant liquid higher than the height of convexities Wp1 of the front surface Wf on the whole of the front surface Wf.

Subsequently, the control unit 13 gives an operation command to the exhaust pump 72 to start the driving of the exhaust pump 72. The control unit 13 gives an operation command to the valve 74 to open the valve 74. In this way, a gas inside the chamber 11 is discharged through the pipe 73 to the outside of the chamber 11. By making the inside of the chamber 11 except the pipe 73 into an air-tightly closed state, the internal environment of the chamber 11 is reduced in pressure from an atmospheric pressure.

The pressure reduction is performed from the atmospheric pressure (about 1 atm, about 1013 hPa) to about $1.7 \times 10^{-5}$ atm (1.7 Pa). The gas pressure in the present disclosure is not limited to this pressure. The reduced gas pressure in the chamber 11 may be appropriately set in accordance with the pressure resistance of the chamber 11, and other factors.

When the pressure in the chamber 11 is reduced, the dry assistant substance is vaporized from the dry assistant liquid 62 supplied on the front surface Wf of the substrate W. At this time, heat of vaporization is deprived of the dry assistant liquid 62 to cool and solidify the dry assistant liquid 62.

FIG. 14(d) illustrates a situation of the substrate W at the end time of the solidifying step S14. As illustrated in FIG. 14(d), the dry assistant liquid 62 supplied in the process liquid supplying step S13 is cooled by the vaporization of the dry assistant substance, which is caused by the reduction of the pressure in the chamber 11, so as to be solidified. Thus, a solidified body (represented by reference number "63" in this figure) of the dry assistant substance is produced.

At this time, the layer thickness of the solidified body 63 becomes small correspondingly to the vaporization amount of the dry assistant substance from the dry assistant liquid 62. It is therefore preferred in the process liquid supplying step S13 in the present embodiment to adjust the rotation speed of the substrate W and others to cause the liquid membrane of the dry assistant liquid 62 to have a predetermined thickness or more, considering the vaporization amount of the dry assistant substance in the solidifying step S14.

Returning to FIG. 6, a sublimating step S15 is next performed in which the solidified body 63 produced on the front surface Wf of the substrate W is sublimated to be removed from the front surface Wf of the substrate W. In the sublimating step S15 also, the pressure reducing treatment in the chamber 11 is continued from the solidifying step S14 through the pressure reducing unit 71.

The pressure reducing treatment makes the pressure in the environment inside the chamber 11 lower than the saturated vapor pressure of the dry assistant substance. Accordingly, when this reduced-pressure environment is kept, the dry assistant substance is sublimated from the solidified body 63.

Also when the dry assistant substance is sublimated from the solidified body 63, heat as sublimation heat is deprived of the solidified body 63 so that the solidified body 63 is cooled. Accordingly, also when the environment inside the chamber 11 has a slightly higher temperature (ambient environment) than the melting point of the dry assistant substance in the sublimating step S15 in the fourth embodiment, the solidified body 63 can be kept in a lower temperature state than the melting point of the dry assistant substance without cooling the solidified body 63 separately. Thus, while the melting of the solidified body 63 is prevented, the solidified body 63 can be sublimated. As a result, no separate cooling mechanism is required to be set up, so that costs for the apparatus and cost for the treatment can be decreased.

As described above, the sublimation of the solid-state dry assistant substance makes it possible that the front surface Wf of the substrate W is satisfactorily dried, and further that at the time of removing IPA and other substances present on the front surface Wf of the substrate W, any surface tension is prevented from acting on the pattern Wp to restrain the generation of pattern collapse.

FIG. 14(*e*) illustrates a situation of the substrate W at the end time of the sublimating step S15. As illustrated in FIG. 14(*e*), the solidified body 63 of the dry assistant substance, which is produced in the solidifying step S14, is sublimated by rendering the inside of the chamber 11 a reduced-pressure environment, so as to be removed from the front surface Wf. Thus, the drying of the front surface Wf of the substrate W is completed.

After the end of the sublimating step S15, the control unit 13 gives an operation command to the valve 74 to open the valve 74. Moreover, the control unit 13 gives an operation command to the exhaust pump 72 to stop the operation of the exhaust pump 72. The control unit 13 then gives an operation command to the valve 46 to open the valve 46 to introduce a gas (nitrogen gas) from the gas tank 47 through the pipe 45 and the nozzle 42 into the chamber 11. In this way, the inside of the chamber 11 is returned from the reduced-pressure environment to an atmospheric pressure environment. At this time, the nozzle 42 may be positioned at the retiring position P3 or at the central portion of the front surface Wf of the substrate W.

After the end of the sublimating step S15, the method for returning the inside of the chamber 11 to the atmospheric pressure environment is not limited to the above-mentioned method, and may be a known method that may be of various types.

Through this step, the substrate drying treatment series is ended. After the above-mentioned substrate drying treatment, the substrate carrying-in/out mechanism not illustrated is used to carry the drying-treated substrate W out from the chamber 11.

As described above, in the fourth embodiment, the dry assistant liquid in which the dry assistant substance is melted is supplied on the front surface Wf of the substrate W, on which IPA adheres, to substitute IPA with the dry assistant liquid. Thereafter, the dry assistant liquid is solidified on the front surface Wf of the substrate W to form a solidified membrane of the dry assistant substance, and then the dry assistant substance is sublimated to be removed from the front surface Wf of the substrate W. In this way, the drying treatment of the substrate W is attained.

Also when the dry assistant liquid is solidified and sublimated by pressure reduction as performed in the fourth embodiment, the substrate W can be satisfactorily dried while pattern collapse is prevented. Specific pattern-collapse-restraining effects will be described in the item "EXAMPLES", which will be described later.

In the fourth embodiment, in the solidifying step S14 and the sublimating step S15, the pressure reducing unit 71 common to these steps is used to reduce the pressure in the chamber 11. This way makes it possible to start the sublimating step S15 immediately after the solidifying step S14 to produce advantageous effects not only of decreasing treating-periods associated with operations of the individual parts of the substrate treating apparatus 1, and a memory quantity for the substrate treating program 19 in the control unit 13 for operating the parts, but also of reducing the number of parts used for the treatment to decrease costs for the apparatus. In the fourth embodiment, particularly, nitrogen gas of a low temperature is not used. Thus, the temperature adjusting part 272 in the gas supplying unit 41 may be omitted. When the inside of the chamber 11 is returned from the reduced-pressure environment to the atmospheric pressure environment, the use of a unit other than the gas supplying unit 41 permits the gas supplying unit 41 to be omitted.

Fifth Embodiment

A fifth embodiment of the present disclosure will be described hereinafter.

The present embodiment is different from the first embodiment in that a process liquid further contains an alcohol showing compatibility with a sublimable substance as described above. When organic substances are present as impurities in a solution containing a sublimable substance, the organic substances may turn to crystal nuclei when the sublimating-substance-containing solution is solidified. In this way, each of the impurities has turned to the crystal nuclei so that crystal grains grow. The grown crystal grains collide soon with each other to generate crystal grain boundaries at boundaries between the grains. The generation of the crystal grain boundaries applies stress on the pattern to cause a problem that pattern collapse is generated. However, by incorporating, into a process liquid, an alcohol showing compatibility with a sublimable substance as performed in the present embodiment, the following can be attained: even when an organic substance is present as an impurity in the process liquid, crystal grains can be restrained from growing, using the organic substance as crystal nuclei. As a result, a solidified body can be gained which has a crystal structure in which crystal grain boundaries are restrained from being generated or growing. In this way, the present embodiment makes it possible to decrease a phenomenon that stress caused by, e.g., the generation of the crystal grain boundaries acts on the pattern to cause the collapse of the pattern.

In the same manner as in the first embodiment, the process liquid contains a melt-state fluorinated carbon compound as a sublimable substance in a melt state; thus, the substrate can be freeze-dried without giving surface tension to the pattern formed on the substrate. In this way, in the present embodiment, pattern collapse caused by effect of surface tension can be simultaneously prevented.

<5-1. Structure of Substrate Treating Apparatus>

Figure 15:
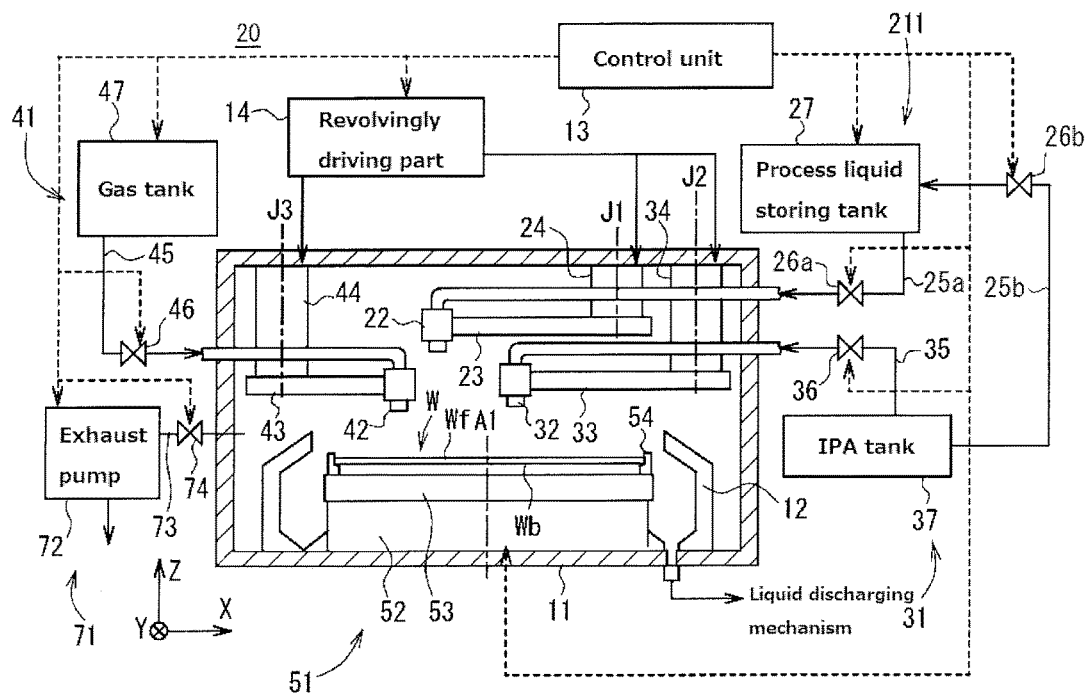
FIG. 15 is an explanatory view illustrating an outline of a substrate treating apparatus according to a fifth embodiment of the present invention.
Figure 16:
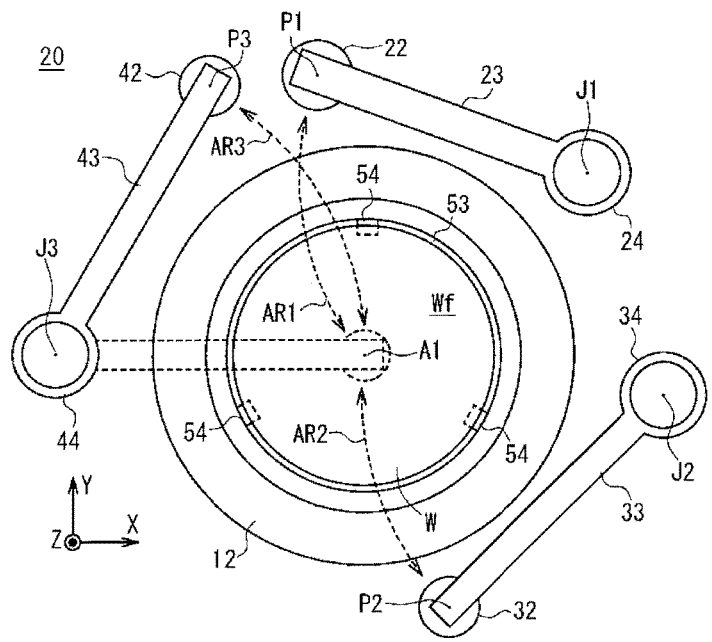
FIG. 16 is a schematic plan view illustrating this substrate treating apparatus.

Referring appropriately to FIGS. 15 and 16, the following will describe a substrate treating apparatus according to the fifth embodiment. FIG. 15 is an explanatory view illustrating an outline of this substrate treating apparatus, which is an apparatus 20 according to the present embodiment. FIG. 16 is a schematic pattern view illustrating an internal structure of the substrate treating apparatus 20.

The substrate treating apparatus 20 according to the fifth embodiment basically has the same constituents as the substrate treating apparatus 1 according to the first embodiment except the structure of a process liquid supplying unit (supplying unit) 211 (see FIG. 15). A control unit in the fifth embodiment has the same structure as the control unit 13 in the first embodiment. Thus, the same reference numbers as in the first embodiment are attached to members having the same functions in the fifth embodiment, and descriptions thereon are omitted.

The process liquid supplying unit 211 is a unit for supplying a dry assistant liquid on a pattern-formed surface of a substrate W. As illustrated in FIG. 15, the supplying unit 211 has at least a nozzle 22, an arm 23, a revolving axis 24, pipes 25*a* and 25*b*, valves 26*a* and 26*b*, and a process liquid storing part 27.

As illustrated in FIGS. 17A and 17B, the process liquid storing part 27 has at least a process liquid storing tank 271, a stirring part 277 for stirring a dry assistant liquid inside the process liquid storing tank 271, a pressurizing part 274 for pressurizing the process liquid storing tank 271 to send out the dry assistant liquid, and a temperature adjusting part 272 for heating the dry assistant liquid inside the process liquid storing tank 271. FIG. 17A is a block chart illustrating a schematic structure of the process liquid storing part 27, and FIG. 17B is an explanatory view illustrating a specific structure of the process liquid storing part 27.

As described above, the temperature adjusting part 272 is a section for heating the dry assistant liquid stored in the process liquid storing tank 271 to adjust the temperature of this liquid. It is sufficient for the temperature adjustment to be made to adjust the liquid temperature of the dry assistant liquid to a temperature not lower than the melting point of a dry assistant substance contained in the dry assistant liquid. This way makes it possible to maintain the melt state of the dry assistant substance. The upper limit of the adjusted temperature is preferably a temperature lower than lower one of the respective boiling points of the dry assistant substance and IPA. In this way, it is possible that the dry assistant liquid having a desired composition can be prevented from being unsupplied to the substrate W which is caused by the evaporation of the constituent component having the lower boiling point.

Returning to FIG. 15, the process liquid storing part 27 (more specifically, the process liquid storing tank 271) is connected through the pipe 25*b* to an IPA tank 37 (details thereof being to be described later). The valve 26*b* is fitted into the middle of the pipe 25*b*. The valve 26*b* is electrically connected to the control unit 13, and is usually closed. The opening and closing of the valve 26*b* are each controlled through an operation command from the control unit 13. The control unit 13 gives an operation command to the process liquid supplying unit 211 to open the valve 26*b*. Consequently, IPA is sent under pressure from the IPA tank 37 to be passed through the pipe 25*b* and supplied into the process liquid storing tank 271. In this way, in the process liquid storing tank 271, a process liquid which uniformly contains IPA having a constant concentration is prepared.

The process liquid storing part 27 (more specifically, the process liquid storing tank 271) is connected through the pipe 25*a* to the nozzle 22. The valve 26*a* is fitted into the middle of the pipe 25*a*. A gas pressure sensor (not illustrated) is set inside the process liquid storing tank 271, and is electrically connected to the control unit 13. On the basis of a value detected through the gas pressure sensor, the control unit 13 controls the operation of a pump 276 to keep the pressure of the gas in the process liquid storing tank 271 at a predetermined gas pressure higher than any atmospheric pressure. In the meantime, the valve 26*a* is also electrically connected to the control unit 13, and is usually closed. The opening and closing of the valve 26*a* are also each controlled through an operation command from the control unit 13. When the control unit 13 gives an operation command to the process liquid supplying unit 211 to open the valve 26*a*, from the inside of the pressurized process liquid storing tank 271 the dry assistant liquid is sent under pressure to be passed through the pipe 25*a* and then discharged from the nozzle 22. This way makes it possible to supply the dry assistant liquid to the front surface Wf of the substrate W. As described above, the process liquid storing tank 271 sends the dry assistant liquid under pressure, using the pressure based on nitrogen gas; thus, it is preferred that the process liquid storing tank 271 is made into an airtight form.

Returning to FIG. 15, the following will describe an IPA supplying unit 31. The IPA supplying unit 31 is a unit for supplying IPA (isopropyl alcohol) to the substrate W, and has a nozzle 32, an arm 33, a revolving axis 34, a pipe 35, a valve 36 and an IPA tank 37. As described above, the IPA supplying unit 31 functions as a unit for supplying IPA to the process liquid storing part 27 also.

The IPA tank 37 is connected through the pipe 35 to the nozzle 32. The valve 36 is fitted into the middle of the path of the pipe 35. In the IPA tank 37, IPA is stored. A pump not illustrated pressurizes IPA inside the IPA tank 37 to send IPA from the pipe 35 into the direction of the nozzle 32. Moreover, IPA is sent from the pipe 25*b* into the direction of the process liquid storing part 27 also.

In the present embodiment, IPA is used in the IPA supplying unit 31. In the present disclosure, however, it is sufficient for the liquid used in this supplying unit to be soluble in the dry assistant liquid and deionized water (DIW). Thus, the liquid is not limited to IPA. Examples of an alternate for IPA in the present embodiment include methanol, ethanol, acetone, benzene, carbon tetrachloride, chloroform, hexane, decalin, tetralin, acetic acid, cyclohexanol, ether, and hydrofluoro ether. However, in the case of using a solution other than IPA as a rinsing liquid and not using this solution as any constituent component of the process liquid, it is preferred to set up a different IPA supplying unit for supplying IPA to the process liquid storing part 27. In this case, the different IPA supplying unit is configured to supply IPA timely from the different IPA supplying unit to the process liquid storing part 27 under the control of the control unit 13.

In the same manner as in the substrate treating apparatus 1 according to the first embodiment, a gas supplying unit 41 is a unit for supplying a gas to the substrate W, and has a nozzle 42, an arm 43, a revolving axis 44, a pipe 45, a valve 46, and a gas tank 47.

In a gas storing part 471, an inert gas is stored which is chemically inert to at least the dry assistant substance and alcohols, more specifically, nitrogen gas (see FIG. 5). In a gas temperature adjusting part 472, the stored nitrogen gas is adjusted into a temperature not higher than the solidifying point of the process liquid. The nitrogen gas temperature is not particularly limited as far as the temperature is a temperature not higher than the solidifying point of the process liquid. The temperature is usually set into a range from 0 to 15° C. both inclusive. When the nitrogen gas temperature is set to 0° C. or higher, the following can be prevented: water vapor present inside the chamber 11 is solidified to cause, for example, the adhesion of the resultant on the front surface Wf of the substrate W; and thus bad effects are produced to the substrate W.

In the same manner as in the first embodiment, the nitrogen gas used in the fifth embodiment is preferably a dry gas having a dew point of 0° C. or lower.

In the present embodiment, as the gas supplied to the gas supplying unit 41, nitrogen gas is used. However, the gas is not limited to this gas as far as the gas is a gas inert to the dry assistant substance and alcohols. In the fifth embodiment, examples of a gas alternative for nitrogen gas include argon gas, helium gas, and air (gas composed of nitrogen gas in a concentration of 80%, and oxygen gas in a concentration of 20%). Alternatively, the alternative gas may be a mixed gas in which two or more of these gases are mixed with each other.

<5-2. Dry Assistant Liquid>

The following will describe the dry assistant liquid used in the present embodiment.

The dry assistant liquid in the embodiment is a process liquid containing at least a dry assistant substance (sublimable substance) in a melt state, and IPA, which shows compatibility with the sublimable substance in the melt state, and fulfils such a function that in a drying treatment of removing a liquid present on a pattern-formed surface of a substrate, this drying treatment is assisted. In the embodiment, the following description will be made, using, as an example, a case where the process liquid contains IPA. However, the present disclosure is not limited to this case, where the process liquid contains IPA, as far as the substance contained in the process liquid is an alcohol showing compatibility with the sublimable substance in the melt state.

In the same manner as in the first embodiment, a fluorinated carbon compound in the present embodiment is preferably any one of the above-mentioned compounds (A) to (E). These compounds may be used singly or in any combination of two or more thereof, IPA added to the process liquid in the present embodiment shows compatibility with at least the sublimable substance in the melt state. Moreover, IPA shows the nature of an organic solvent. Thus, when an organic substance as an impurity is present in the process liquid, IPA fulfils a function as a crystal growth restrainer of dissolving the impurity to restrain crystal grains from growing as crystal nuclei, so as to decrease the generation and growth of crystal grain boundaries. As a result, stress can be prevented from being applied to a pattern of the substrate by the generation and growth of crystal grain boundaries.

In the present disclosure, however, an alcohol other than IPA is usable as far as the alcohol shows compatibility the sublimable substance in the melt-state and further functions as a crystal growth restrainer. Examples of the alcohol other than IPA include methanol, ethanol, 1-pentanol, 2-pentanol, 3-pentanol, n-propyl alcohol, isopropyl alcohol, n-butyl alcohol, sec-butyl alcohol, isobutyl alcohol, tert-amyl alcohol, 1-methoxy-2-propanol, cyclopentanol, and ethylene glycol. These alcohols may be used singly or in any combination of two or more thereof.

The concentration of IPA in the process liquid is from 0.001 to 0.8% by volume, preferably from 0.01 to 0.5% by volume of this liquid. When the IPA concentration is set to 0.001% or more by volume, stress can be prevented from being applied to the pattern by the generation and growth of crystal grain boundaries, so that pattern collapse can be decreased. In the meantime, when the IPA concentration is set to 0.8% or less by volume, the following can be prevented: the solidifying point of the process liquid itself is excessively lowered to make the solidification of the process liquid difficult. Furthermore, when the process liquid is made into a solidified body, the sublimability of the solidified body itself can be prevented from being deteriorated. Thus, pattern collapse can be restrained from being increased by effect of surface tension. The above-mentioned numerical ranges of the concentration are applicable not only to IPA but also to the other alcohols.

The content of the sublimable substance in the process liquid is preferably from 60 to 99.999% by mass, more preferably from 90 to 99.999% by mass, in particular preferably from 99.5 to 99.999% by mass of the whole of the process liquid. When the sublimable substance content is set to 60% or more by mass, pattern collapse can be prevented from being generated by surface tension. In the meantime, when the sublimable substance content is set to 99.999% or less by mass, pattern collapse can be restrained from being generated in the crystal grain boundaries.

The process liquid may further contain an organic solvent other than alcohols such as IPA. The organic solvent is not particularly limited as far as the organic solvent is a solvent showing compatibility with the sublimable substance in the melt state and alcohols, and further damages neither properties of the sublimable substance nor those of the alcohols. Specific examples thereof include methanol, ethanol, 1-pentanol, 2-pentanol, 3-pentanol, n-propyl alcohol, isopropyl alcohol, n-butyl alcohol, sec-butyl alcohol, isobutyl alcohol, tert-amyl alcohol, 1-methoxy-2-propanol, cyclopentanol, and ethylene glycol.

The solidifying point of the dry assistant liquid ranges preferably from 0 to 80° C., more preferably from 5 to 50° C., in particular preferably from 10 to 25° C. When the solidifying point is set to 0° C. or higher, it is possible to prevent the matter that it becomes difficult to solidify the process liquid to produce a solidified body. In the meantime, when the solidifying point is set to 80° C. or lower, it is possible to prevent the matter that it becomes difficult to melt the process liquid.

<5-3. Substrate Treating Method>

The following will describe a substrate treating method according to the fifth embodiment, using the substrate treating apparatus 20 of the present embodiment.

Figure 18:
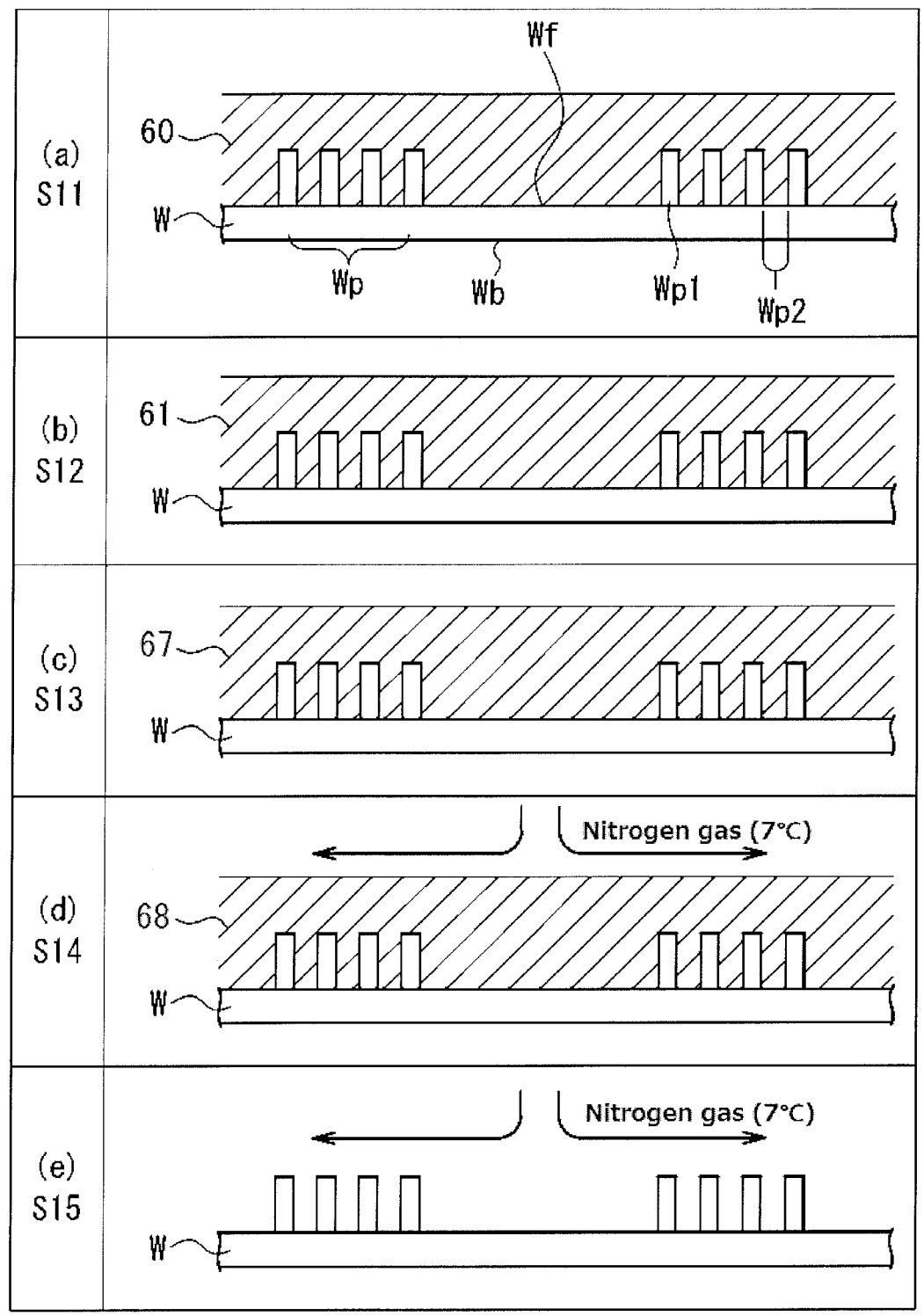
FIG. 18 is a view illustrating a situation of a substrate in each step in the substrate treating method according to the fifth embodiment.

Hereinafter, a process for substrate treatment will be described with an appropriate reference to FIGS. 6, 15, 16 and 18. FIG. 18 is a schematic view illustrating a situation of a substrate in each step in FIG. 6. In the fifth embodiment, each of a washing step S11 and an IPA rinsing step S12 illustrated in FIGS. 6, and 18(*a*) and 18(*b*) is the same as in the first embodiment. Thus, descriptions thereon are omitted.

As illustrated in FIG. 6, a process liquid supplying step (supplying step) S13 is performed in which a process liquid is supplied, as a dry assistant liquid containing a dry assistant substance in a melt state and IPA, on a front surface Wf of a substrate W, onto which IPA 61 adheres.

Initially, the control unit 13 gives an operation command to the valve 26b to open the valve 26b. In this way, IPA is supplied from the IPA tank 37 through the pipe 25b into the process liquid storing part 27. In the meantime, the control unit 13 gives an operation command to the stirring control unit 278. Thus, the stirring control unit 278 rotates the rotary part 279 to stir the dry assistant liquid. Thus, the dry assistant substance in the melt state and IPA are uniformly mixed with each other to uniformize the respective concentrations of these substances, and the temperature of the process liquid. In this way, the process liquid in the present embodiment is prepared. The preparation of the process liquid is performed in the process liquid supplying step S13, or the preparation may be timely performed in advance, for example, immediately before the process liquid supplying step S13.

Next, the control unit 13 gives an operation command to the rotarily driving part 52 to rotate the substrate W around the axis A1 at a constant speed. At this time, the rotation speed of the substrate W is preferably set to make the membrane thickness of a liquid membrane of the dry assistant liquid higher than the height of convexities Wp1 on the whole of the front surface Wf.

Subsequently, the control unit 13 gives an operation command to the revolvingly driving part 14 to position the nozzle 22 at the central portion of the front surface Wf of the substrate W. The control unit 13 then gives an operation command to the valve 26a to open the valve 26a. In this way, the dry assistant liquid is supplied from the process liquid storing tank 271 through the pipe 25a and the nozzle 22 to the front surface Wf of the substrate W.

About the liquid temperature of the supplied dry assistant liquid, the lower limit thereof is set to a temperature which is not lower than the melting point of the dry assistant substance after this liquid is supplied on at least the front surface Wf of the substrate W. The upper limit is set to a temperature lower than lower one of the respective boiling points of the dry assistant substance and IPA. In the case of using, for example, the above-mentioned compound 1,1,2,2,3,3,4-heptafluorocyclopentane (melting point: 20.5° C.; and boiling point: 82.5° C.) as the dry assistant substance and using IPA (melting point: −89° C.; and boiling point: 82.6° C.) as an alcohol, the liquid temperature is preferably set to a range from 35 to 82° C. both inclusive. Moreover, the supply amount of the dry assistant liquid is not particularly limited, and may be appropriately set.

The supply of the dry assistant liquid in the state of such a high-temperature not lower than the melting point of the dry assistant substance makes it possible to form a liquid membrane of the dry assistant liquid on the front surface Wf of the substrate W and subsequently produce a solidified body. As a result, this solidified body is obtained as a membrane-form solidified body uniform in layer thickness, so that the substrate W can be decreased in drying-unevenness. When the temperature of the substrate W and that of the atmosphere inside the chamber 11 are not higher than the melting point of the sublimable substance, the supply of the dry assistant liquid of a temperature slightly higher than the melting point on the substrate W may cause the dry assistant liquid to be solidified in a very short period from the contact of this liquid with the substrate W. In such a case, a solidified body with a uniform layer thickness cannot be produced not to decrease the substrate easily in drying-unevenness. Accordingly, when the temperature of the substrate W and that of the atmosphere inside the chamber 11 are not higher than the melting point of the dry assistant substance, it is preferred to make a temperature adjustment to make the liquid temperature of the dry assistant liquid sufficiently higher than the melting point.

Immediately before the dry assistant liquid is supplied to the front surface Wf of the substrate W, the liquid temperature of this liquid is preferably set to a temperature not lower than the "melting point of the dry assistant substance plus 10° C.". Also when an organic substance is present as an impurity in the dry assistant liquid, this preferred case makes it possible to dissolve this organic substance to decrease more largely the collapse of the pattern, which is caused by the generation and growth of crystal grain boundaries.

The dry assistant liquid supplied to the front surface Wf of the substrate W is caused to flow from the vicinity of the center of the front surface Wf of the substrate W to the peripheral portion of the substrate W by centrifugal force generated by the rotation of the substrate W, so that the dry assistant liquid is diffused on the whole of the front surface Wf of the substrate W. In this way, the supply of the dry assistant liquid attains the removal of IPA adhering on the front surface Wf of the substrate W, so that the whole of the front surface Wf of the substrate W is covered with the dry assistant liquid. After the end of the process liquid supplying step S13, the control unit 13 gives an operation command to the valve 26a to close the valve 26a. Moreover, the control unit 13 gives an operation command to the revolvingly driving part 14 to position the nozzle 22 at the retiring position P1.

FIG. 18(c) illustrates a situation of the substrate W at the end time of the process liquid supplying step S13. As illustrated in FIG. 18(c), the dry assistant liquid (represented by reference number "67" in this figure) supplied in the process liquid supplying step S13 adheres on the front surface Wf of the substrate W, on which the pattern Wp is formed. The IPA 61 is substituted with the dry assistant liquid 67 to be removed from the front surface Wf of the substrate W.

When the IPA 61 adhering on the front surface Wf of the substrate W is removed by the supply of the dry assistant liquid containing no IPA on the front surface, it can also be considered that the whole of the front surface Wf of the substrate W can be substantially covered with the dry assistant liquid containing IPA. However, such a method makes it difficult to make the IPA concentration in the dry assistant liquid, with which the whole of the front surface Wf of the substrate W is covered, uniform on the in-plane area of the front surface. It is therefore difficult to prevent uniformly the generation of pattern collapse on the in-plane area of the front surface Wf of the substrate W.

Returning to FIG. 6, a solidifying step S14 is next performed in which the dry assistant liquid 67 supplied on the front surface Wf of the substrate W is solidified to form a solidified membrane of the dry assistant liquid. Initially, the control unit 13 gives an operation command to the rotarily driving part 52 to rotate the substrate W around the axis A1 at a constant speed. At this time, the rotation speed of the substrate W is set to cause the dry assistant liquid 67 to be made into a membrane having a predetermined membrane thickness higher than the convexities Wp1 on the whole of the front surface Wf.

Subsequently, the control unit 13 gives an operation command to the revolvingly driving part 14 to position the nozzle 42 at the central portion of the front surface Wf of the substrate W. The control unit 13 then gives an operation command to the valve 46 to open the valve 46. In this way, a gas (nitrogen gas of 7° C. temperature in the present embodiment) is supplied from the gas tank 47 through the pipe 45 and the nozzle 42 to the front surface Wf of the substrate W.

Nitrogen gas supplied to the front surface Wf of the substrate W is caused to flow from the vicinity of the center of the front surface Wf of the substrate W to the peripheral portion of the substrate W by centrifugal force generated by the rotation of the substrate W, so that the nitrogen gas is diffused onto the whole of the front surface Wf of the substrate W, which is covered with the dry assistant liquid 67. In this way, a liquid membrane of the dry assistant liquid 67, which is formed on the front surface Wf of the substrate W, is cooled to a temperature not higher than the solidifying point of the process liquid. Thus, a solidified body is produced.

FIG. 18(*d*) is a situation of the substrate W at the end time of the solidifying step S14. As illustrated in FIG. 18(*d*), the dry assistant liquid 67 supplied in the process liquid supplying step S13 is cooled by the supply of the nitrogen gas of 7° C. temperature, so as to be solidified. Thus, a solidified body (represented by reference number "68" in this figure) is produced which contains the dry assistant substance and IPA.

Returning to FIG. 6, a sublimating step S15 is performed in which the solidified body 68 produced on the front surface Wf of the substrate W is sublimated to be removed from the front surface Wf of the substrate W. In the sublimating step S15 also, gas (nitrogen gas) from the nozzle 42 is supplied continuously from the solidifying step S14.

The partial pressure of vapor of the dry assistant substance in the nitrogen gas is set to a value lower than the saturated vapor pressure of the dry assistant substance at the supply temperature of the nitrogen gas. Accordingly, when the nitrogen gas in such a state is supplied onto the front surface Wf of the substrate W to contact the solidified body 68, the dry assistant substance is sublimated from the solidified body 68 into the nitrogen gas. Moreover, the nitrogen gas has a lower temperature than the melting point of the dry assistant substance; thus, the sublimation of the solidified body 68 can be attained while the solidified body 68 is prevented from being melted. Additionally, IPA is incorporated into the dry assistant liquid to have a uniform concentration. Thus, in the solidified body 68 obtained by the solidification of this dry assistant liquid, IPA is uniformly present. Accordingly, when the solidified body 68 is sublimated, a solidified body as a lump of IPA is not sublimated. In this way, the sublimation of IPA can be prevented from giving surface tension to the pattern of the substrate W, so that pattern collapse can be restrained.

In this way, when IPA and other substances present on the front surface Wf of the substrate W are removed by the sublimation of the solid-state dry assistant substance, surface tension is prevented from acting to the pattern Wp so that the front surface Wf of the substrate W can be satisfactorily dried while the generation of pattern collapse is restrained.

FIG. 18(*e*) illustrates a situation of the substrate W at the end time of the sublimating step S15. As illustrated in FIG. 18(*e*), the solidified body 68 of the process liquid, which is produced in the solidifying step S14, is sublimated by the supply of the nitrogen gas of 7° C. temperature to be removed from the front surface Wf Thus, the drying of the front surface Wf of the substrate W is completed.

After the end of the sublimating step S15, the control unit 13 gives an operation command to the valve 46 to close the valve 46. Moreover, the control unit 13 gives an operation command to the revolvingly driving part 14 to position the nozzle 42 at the retiring position P3.

Through this step, the substrate drying treatment series is ended. After the above-mentioned substrate drying treatment, the substrate carrying-in/out mechanism not illustrated is used to carry the drying-treated substrate W out from the chamber 11.

As described above, in the present embodiment, the dry assistant substance made of the fluorinated carbon compound in the melt state, and the dry assistant liquid containing IPA are supplied on the front surface Wf of the substrate W, onto which IPA adheres, to substitute the adhering IPA with the dry assistant liquid. Furthermore, the dry assistant liquid is solidified on the front surface Wf of the substrate W to produce a solidified body containing the dry assistant substance and IPA, and subsequently the solidified body is sublimated to be removed from the front surface Wf of the substrate W. In this way, the drying treatment of the substrate W is conducted.

In the present embodiment, in the solidifying step S14 and the sublimating step S15, the gas supplying unit 41 common to these steps is used to supply nitrogen gas, which is an inert gas chemically inert to the dry assistant substance and alcohols, at a temperature not higher than the solidifying point of the process liquid. This way makes it possible to start the sublimating step S15 immediately after the solidifying step S14 to produce advantageous effects not only of decreasing treating-periods associated with operations of the individual parts of the substrate treating apparatus 20, and a memory quantity for the substrate treating program 19 in the control unit 13 for operating the parts, but also of reducing the number of parts used for the treatment to decrease costs for the apparatus. In the present embodiment, particularly, the above-mentioned pressure reducing unit 71 is not used. Thus, the pressure reducing unit 71 can be omitted.

Sixth Embodiment

A sixth embodiment according to the present disclosure will be described hereinafter.

The present embodiment is different from the fifth embodiment in that a process liquid is used as a washing liquid and/or a rinsing liquid and further the step of supplying the treatment is performed as a washing/rinsing step. In the present embodiment, this manner makes it possible to reduce the number of steps and improve the efficiency of the treatment, and to restrain pattern collapse. Thus, the surface of a substrate W can be satisfactorily dried.

<6-1. Structure of Substrate Treating Apparatus, and Process Liquid>

A substrate treating apparatus and a control unit according to the fifth embodiment may be an apparatus and a unit which have the same constituents as the substrate treating apparatus 20 and the control unit 13 according to the first embodiment (see FIGS. 15 and 16). Thus, the same reference numbers are attached to the constituents, respectively, and descriptions thereon are omitted.

The above-mentioned process liquid supplying unit 211 is used as a wet washing unit and a rinsing unit in the present embodiment. The process liquid supplying unit in the embodiment, as the wet washing unit and the rinsing unit, has the same constituents as in the fifth embodiment. Thus, descriptions thereon are omitted. In the present embodiment, however, any IPA rinsing step is omitted, so that an IPA supplying unit 31 is used only to supply IPA to a process liquid storing part 27. Moreover, a process liquid used in the present embodiment is the same as used in the fifth embodiment. Thus, descriptions thereon are omitted.

<6-2. Substrate Treating Method>

The following will describe a substrate treating method according to the sixth embodiment, using the substrate treating apparatus 20 having the same structure as the apparatus in the fifth embodiment.

Figure 19:
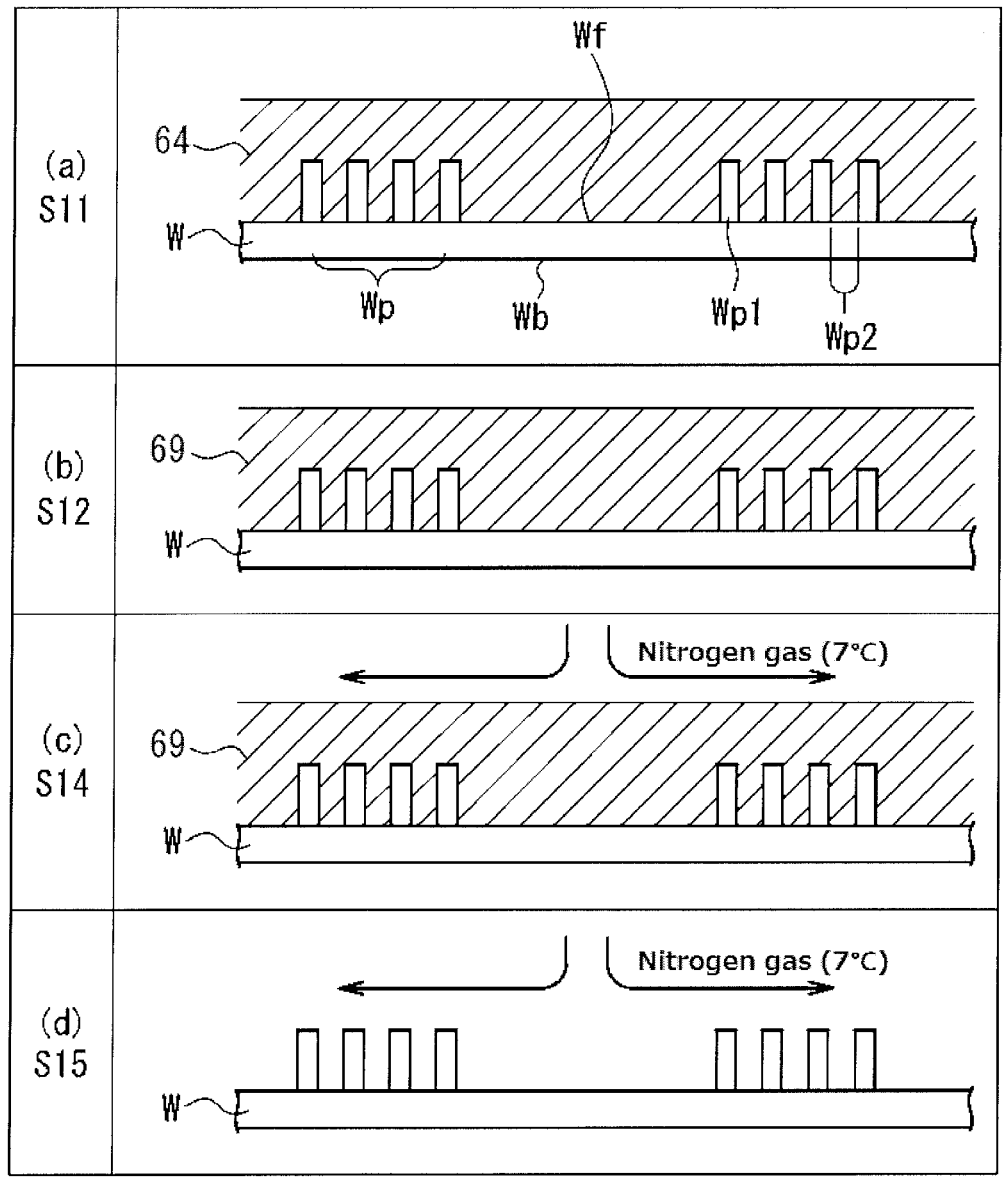
FIG. 19 is a view illustrating a situation of a substrate in each step in the substrate treating method according to a sixth embodiment.

Hereinafter, with an appropriate reference to FIGS. 8, 15, 16 and 19, a process for substrate treatment will be described. FIG. 19 is a schematic view illustrating a situation of a substrate W in each step in FIG. 8. In the sixth embodiment, each of a solidifying step S14 and a sublimating step S15 illustrated in FIGS. 8, and 19(*c*) and 19(*d*) is the same as in the fifth embodiment. Thus, descriptions thereon are omitted.

As illustrated in FIG. 8, the substrate W that has not been treated is held by the substrate holder 51, and subsequently the substrate W is subjected to a washing/rinsing step S16. In the present step, the process liquid supplying unit 211 is used as a washing/rinsing unit.

Initially, the control unit 13 gives an operation command to the valve 26*b* to open the valve 26*b*. In this way, IPA is supplied from the IPA tank 37 through the pipe 25*b* into the process liquid storing part 27. In the meantime, the control unit 13 gives an operation command to the stirring control unit 278. Thus, the stirring control unit 278 rotates the rotary part 279 to stir the dry assistant liquid. Thus, the dry assistant substance in a melt state and IPA are uniformly mixed with each other to uniformize the respective concentrations of these substances, and the temperature of the process liquid. In this way, the process liquid in the present embodiment is prepared. The preparation of the process liquid is performed in the process liquid supplying step S13, or the preparation may be timely performed in advance, for example, immediately before the process liquid supplying step S13.

Next, the control unit 13 gives an operation command to the rotarily driving part 52 to rotate the substrate W around the axis A1 at a constant speed. At this time, the rotation speed of the substrate W is preferably set to make the membrane thickness of a liquid membrane made of the process liquid as a washing liquid higher than the height of the convexities Wp1 on the whole of the front surface Wf.

Subsequently, the control unit 13 gives an operation command to the revolvingly driving part 14 to position the nozzle 22 at a central portion of the front surface Wf of the substrate W. The control unit 13 then gives an operation command to the valve 26*a* to open the valve 26*a*. In this way, the process liquid as the washing liquid is supplied from the process liquid storing tank 271 through the pipe 25*a* and the nozzle 22 to the front surface Wf of the substrate W.

The liquid temperature of the supplied washing liquid (more specifically, the liquid temperature of the washing liquid that has been supplied on the front surface Wf of the substrate W) is set to a temperature range which is not lower than the melting point of the sublimable substance and is lower than lower one of the respective boiling points of the sublimable substance and the alcohol. The supply amount of the washing liquid is not particularly limited, and may be appropriately set.

When the temperature of the substrate W and that of the atmosphere inside the chamber 11 are not higher than the melting point of the sublimable substance, the supply of a washing liquid of a temperature slightly higher than the melting point on the substrate W may cause the washing liquid to be solidified in a very short period from the contact of the liquid with the substrate W. In such a case, a solidified body with a uniform layer thickness cannot be produced not to decrease the substrate easily in drying-unevenness.

Accordingly, when the temperature of the substrate W and that of the atmosphere inside the chamber 11 are not higher than the melting point of the sublimable substance, it is preferred to make a temperature adjustment to make the liquid temperature of the washing liquid sufficiently higher than the melting point.

The washing liquid supplied on the front surface Wf of the substrate W is caused to flow from the vicinity of the center of the front surface Wf of the substrate W to the peripheral portion of the substrate W by centrifugal force generated by the rotation of the substrate W, so that the washing liquid is diffused on the whole of the front surface Wf of the substrate W. In this way, the supply of the washing liquid attains the removal of an adherend and others that adhere on the front surface Wf of the substrate W, so that the whole of the front surface Wf of the substrate W is covered with the washing liquid. After the end of the washing, the control unit 13 gives an operation command to the valve 26*a* to close the valve 26*a*. Moreover, the control unit 13 gives an operation command to the revolvingly driving part 14 to position the nozzle 22 at the retiring position P1.

FIG. 19(*a*) illustrates a situation of the substrate W at the end time of the washing. As illustrated in FIG. 19(*a*), the washing liquid (reference number "64" in this figure) supplied in the washing adheres on the front surface Wf of the substrate W on which the pattern Wp is formed, and the adherend is removed from the front surface Wf of the substrate W with the washing liquid 64.

Returning to FIG. 8, in the washing/rinsing step S16, the substrate W is further rinsed through the rinsing unit. A rinsing liquid used in this treatment is a process liquid, and the rinsing unit is the process liquid supplying unit 211.

Initially, the control unit 13 gives an operation command to the rotarily driving part 52 to rotate the substrate W around the axis A1 at a constant speed. Next, the control unit 13 gives an operation command to the revolvingly driving part 14 to position the nozzle 32 to the central portion of the front surface Wf of the substrate W. The control unit 13 then gives an operation command to the valve 36 to open the valve 36. In this way, the process liquid as a rinsing liquid is supplied from the process liquid storing tank 271 through the pipe 25*a* and the nozzle 22 on the front surface Wf of the substrate W.

The rinsing liquid supplied to the front surface Wf of the substrate W is caused to flow from the vicinity of the center of the front surface Wf of the substrate W toward the peripheral portion of the substrate W by centrifugal force generated by the rotation of the substrate W, so that the rinsing liquid diffuses on the whole of the front surface Wf of the substrate W. In this way, the supply of the rinsing liquid attains the removal of the washing liquid adhering on the front surface Wf of the substrate W to cover the whole of the front surface Wf of the substrate W with the rinsing liquid. The rotation speed of the substrate W is preferably set to make the membrane thickness of a membrane made of the rinsing liquid higher than the height of the convexities Wp1 on the whole of the front surface Wf. The supply amount of the rinsing liquid is not particularly limited, and may be appropriately set. Furthermore, the liquid temperature of the rinsing liquid is the same as set in the case of the liquid temperature of the above-mentioned washing liquid. The rinsing period is not particularly limited, either, and may be appropriately set as required.

After the end of the washing/rinsing step S16, the control unit 13 gives an operation command to the valve 26*a* to close the valve 26*a*. Moreover, the control unit 13 gives an operation command to the revolvingly driving part 14 to position the nozzle 22 at the retiring position P1.

FIG. 19(*b*) illustrates a situation of the substrate W at the end time of the washing/rinsing step S16. As illustrated in FIG. 19(*b*), the rinsing liquid (represented by reference number "69" in this figure) supplied in the rinsing treatment adheres on the front surface Wf of the substrate W, on which the pattern Wp is formed. The washing liquid 64 is substituted with the rinsing liquid 69 to be removed from the front surface Wf of the substrate W.

Returning to FIG. 8, a solidifying step S14 is next performed in which the rinsing liquid 69 supplied on the front surface Wf of the substrate W is solidified to form a solidified membrane of the sublimable substance. Furthermore, a sublimating step S15 is performed in which the solidified body produced on the front surface Wf of the substrate W is sublimated to be removed from the front surface Wf of the substrate W.

Through this step, the substrate drying treatment series in the present embodiment is ended. After the above-mentioned substrate drying treatment, the substrate carrying-in/out mechanism not illustrated is used to carry the drying-treated substrate W out from the chamber 11.

Seventh Embodiment

The following will describe a seventh embodiment of the present disclosure. The present embodiment is different from the fifth and sixth embodiments in that in a solidifying step S14 and a sublimating step S15, the inside of a chamber is decreased in pressure instead of the supply of the nitrogen gas. In this way also, the surface of a substrate W can be satisfactorily dried while pattern collapse is restrained.

<7-1. Entire Structure of Substrate Treating Apparatus and Dry Assistant Liquid>

A substrate treating apparatus and a control unit according to the seventh embodiment basically have the same constituents as the substrate treating apparatus 20 and the control unit 13 according to the fifth embodiment (see FIGS. 15 and 16). Thus, the same reference numbers as in the fifth embodiment are attached to the constituents in the seventh embodiment, and descriptions thereon are omitted. A dry assistant liquid used in the present embodiment is also the same as used in the fifth embodiment, and descriptions thereon are omitted.

<7-2. Substrate Treating Method>

The following will describe a substrate treating method according to the seventh embodiment, using the substrate treating apparatus 20 having the same structure as the apparatus in the fifth embodiment.

Figure 20:
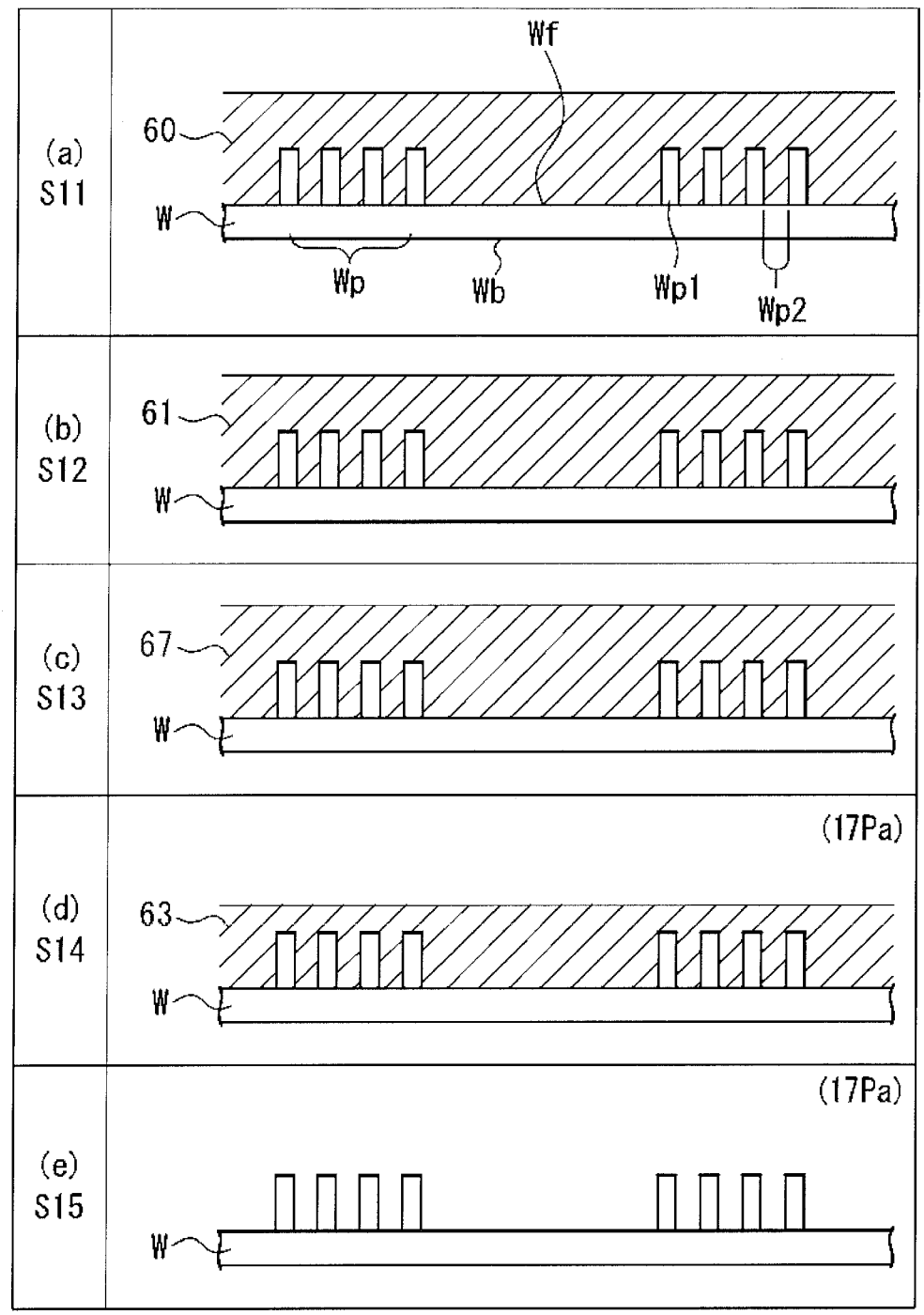
FIG. 20 is a view illustrating a situation of a substrate in each step in the substrate treating method according to a seventh embodiment.

Hereinafter, a process for substrate treatment will be described with an appropriate reference to FIGS. 6, 15, 16 and 20. FIG. 20 is a schematic view illustrating a situation of a substrate W in each step in FIG. 6. In the seventh embodiment, a washing step S11, an IPA rinsing step S12 and a process liquid supplying step S13 illustrated in FIGS. 6, and 20(*a*) to 20(*c*) are the same as in the fifth embodiment. Thus, descriptions thereon are omitted.

FIG. 20(*a*) illustrates the substrate W having a front surface Wf covered with a liquid membrane of DIW 60 at the end time of the washing step S11 in the seventh embodiment. FIG. 20(*b*) illustrates the substrate W the front surface Wf of which is covered with a liquid membrane of IPA 61 at the end time of the IPA rinsing step S12 in the seventh embodiment. FIG. 20(*c*) illustrates the substrate W the front surface Wf of which is covered with a liquid membrane of a dry assistant liquid 67 containing a dry assistant substance (sublimable substance) in a melt state and IPA at the end time of the process liquid supplying step S13 in the seventh embodiment.

In each of FIGS. 20(*a*) to 20(*e*), the substrate W is treated in an environment having an atmospheric pressure unless otherwise specified. This atmospheric pressure environment denotes an environment having a pressure in a range from 0.7 to 1.3 atm both inclusive, the center thereof being a standard atmospheric pressure (1 atm, 1013 hPa). When the substrate treating apparatus 1 is located, particularly, in a clean room having a positive pressure, the environment for the front surface Wf of the substrate W is higher than 1 atm. A treatment (details thereof being to be described later) illustrated in each of FIGS. 20(*d*) and 20(*e*) is conducted in an environment of a reduced-pressure of 17 Pa ($17 \times 10^{-0.5}$ atm).

Referring to FIG. 6, after the washing step S11, the IPA rinsing step S12, and the process liquid supplying step S13 are performed, a solidifying step S14 is performed in which the liquid membrane of the dry assistant liquid 67 supplied on the front surface Wf of the substrate W is solidified to produce a solidified body containing the dry assistant substance and IPA. Specifically, the control unit 13 initially gives an operation command to the rotarily driving part 52 to rotate the substrate W around the axis A1 at a constant speed. At this time, the rotation speed of the substrate W is preferably set to make the membrane thickness of the liquid membrane made of the dry assistant liquid 67 higher than the height of the convexities Wp1 on the whole of the front surface Wf.

Subsequently, the control unit 13 gives an operation command to the exhaust pump 72 to start the driving of the exhaust pump 72. The control unit 13 gives an operation command to the valve 74 to open the valve 74. In this way, a gas inside the chamber 11 is discharged through the pipe 73 to the outside of the chamber 11. By making the inside of the chamber 11 except the pipe 73 into an air-tightly closed state, the internal environment of the chamber 11 is reduced in pressure from an atmospheric pressure.

The pressure reduction is performed from the atmospheric pressure (about 1 atm, about 1013 hPa) to about $17 \times 10^{-5}$ atm (17 Pa). The gas pressure in the present disclosure is not limited to this pressure. The reduced gas pressure in the chamber 11 may be appropriately set in accordance with the pressure resistance of the chamber 11, and other factors.

When the pressure in the chamber 11 is reduced, the dry assistant substance and/or IPA is/are vaporized in accordance with the degree of the pressure reduction from the dry assistant liquid 67 supplied on the front surface Wf of the substrate W. At this time, the heat of vaporization is deprived of the dry assistant liquid 67 so that the dry assistant liquid 67 is cooled to be solidified.

FIG. 20(*d*) illustrates a situation of the substrate W at the end time of the solidifying step S14. As illustrated in FIG. 20(*d*), the dry assistant liquid 67 supplied in the process liquid supplying step S13 is cooled by the vaporization of the dry assistant substance and/or IPA, which is caused by the pressure reduction in the chamber 11, so as to be cooled. Thus, a solidified body (represented by reference number "63" in this figure) of the dry assistant substance and IPA is produced.

At this time, the layer thickness of the solidified body 63 becomes small correspondingly to the amount of the vaporization of the dry assistant substance and/or IPA from the dry assistant liquid 67. It is therefore preferred in the process liquid supplying step S13 in the present embodiment to adjust the rotation speed of the substrate W, and other factors to make the dry assistant liquid 67 into a liquid membrane having a predetermined thickness or more, considering the vaporization amount of the dry assistant substance in the solidifying step S14.

Returning to FIG. 6, a sublimating step S15 is next performed in which the solidified body 63 produced on the front surface Wf of the substrate W is sublimated to be removed from the front surface Wf of the substrate W. In the sublimating step S15 also, the pressure reducing treatment in the chamber 11 is continued from the solidifying step S14 through the pressure reducing unit 71.

By the pressure reducing treatment, the environment inside the chamber 11 is made into the state of a pressure lower than lower one of the respective saturated vapor pressures of the dry assistant substance and IPA. Thus, when this reduced-pressure environment is maintained, the dry assistant substance and IPA are sublimated from the solidified body 63.

Also when the dry assistant substance and IPA are sublimated from the solidified body 63, heat as sublimation heat is deprived of the solidified body 63 so that the solidified body 63 is cooled. Accordingly, in the seventh embodiment, also when the environment inside the chamber 11 has a slightly higher temperature (ambient environment) than the melting point of the dry assistant substance, the sublimating step S15 makes it possible that the solidified body 63 is kept in a state of a temperature lower than the melting point of the dry assistant substance without cooling the solidified body 63 separately. Thus, the solidified body 63 can be sublimated while prevented from being melted. Consequently, no separate cooling mechanism is required to be set up, and thus cost for the apparatus and costs for the treatment can be decreased.

As described above, the sublimation of the solid-state dry assistant substance makes it possible that the front surface Wf of the substrate W is satisfactorily dried, and further that at the time of removing IPA and other substances present on the front surface Wf of the substrate W, any surface tension is prevented from acting to the pattern Wp to restrain the generation of pattern collapse.

FIG. 20(e) illustrates a situation of the substrate W at the end time of the sublimating step S15. As illustrated in FIG. 20(e), by rendering the inside of the chamber 11 the reduced-pressure environment, the solidified body 63 of the dry assistant substance and IPA, which is produced in the solidifying step S14, is sublimated to be removed from the front surface Wf Consequently, the drying of the front surface Wf of the substrate W is completed.

After the end of the sublimating step S15, the control unit 13 gives an operation command to the valve 74 to open the valve 74. Moreover, the control unit 13 gives an operation command to the exhaust pump 72 to stop the operation of the exhaust pump 72. The control unit 13 then gives an operation command to the valve 46 to open the valve 46 to introduce a gas (nitrogen gas) from the gas tank 47 through the pipe 45 and the nozzle 42 into the chamber 11. In this way, the inside of the chamber 11 is returned from the reduced-pressure environment to an atmospheric pressure environment. At this time, the nozzle 42 may be positioned at the retiring position P3 or at the central portion of the front surface Wf of the substrate W.

After the end of the sublimating step S15, the method for returning the inside of the chamber 11 to the atmospheric pressure environment is not limited to the above-mentioned method, and may be a known method that may be of various types.

Through this step, the substrate drying treatment series is ended. After the above-mentioned substrate drying treatment, the substrate carrying-in/out mechanism not illustrated is used to carry the drying-treated substrate W out from the chamber 11.

As described above, in the seventh embodiment, the dry assistant liquid containing the dry assistant substance in the melt state and IPA is supplied on the front surface Wf of the substrate W onto which IPA adheres to substitute IPA with this liquid. Thereafter, the dry assistant liquid is solidified on the front surface Wf of the substrate W to produce a solidified membrane of the dry assistant substance, and then the dry assistant substance is sublimated to be removed from the front surface Wf of the substrate W. In this way, the drying treatment of the substrate W is conducted.

Also when the dry assistant liquid is solidified and sublimated by pressure reduction as performed in the seventh embodiment, the substrate W can be satisfactorily dried while pattern collapse is prevented.

In the seventh embodiment, in the solidifying step S14 and the sublimating step S15, the pressure reducing unit 71 common to these steps is used to reduce the pressure in the chamber 11. This way makes it possible to start the sublimating step S15 immediately after the solidifying step S14 to produce advantageous effects not only of decreasing treating-periods associated with operations of the individual parts of the substrate treating apparatus 20, and a memory quantity for the substrate treating program 19 in the control unit 13 for operating the parts, but also of reducing the number of parts used for the treatment to decrease costs for the apparatus. In the seventh embodiment, particularly, nitrogen gas of a low temperature is not used. Thus, the temperature adjusting part 272 in the gas supplying unit 41 may be omitted. When the inside of the chamber 11 is returned from the reduced-pressure environment to the atmospheric pressure environment, the use of a unit other than the gas supplying unit 41 permits the gas supplying unit 41 to be omitted.

Modified Examples

The above has described preferred embodiments of the present disclosure. However, the present disclosure is not limited to these embodiments, and may be carried out in various other forms. The following will describe main ones of the other forms.

In each of the first embodiment to the seventh embodiment, each of the steps is performed to the substrate W in the chamber 11, which is a single chamber. However, the present disclosure is not limited to this form. For the steps, respective chambers may be prepared.

In each of the embodiments, for example, it is allowable to perform the process until the solidifying step S14 in a first chamber to form a solidified membrane on the front surface Wf of the substrate W, carry the substrate W out from the first chamber after the membrane-formation, carry the solidified-membrane-formed substrate W into a second chamber as another chamber, and perform the sublimating step S15 in the second chamber.

In each of the first to the third, the fifth and the sixth embodiments, gas is supplied, using the gas supplying unit 41 in both of the solidifying step S14 and the sublimating step S15. Moreover, in each of the fourth and the seventh embodiments, pressure reducing treatment is conducted inside the chamber 11, using the pressure reducing unit 71 in both of the solidifying step S14 and the sublimating step S15. However, the present disclosure is not limited to this form. Thus, it is allowable to supply gas, using the gas supplying unit 41 in the solidifying step S14 to produce the solidified body 63 on the front surface Wf, and subsequently reduce the pressure in the chamber 11, using the pressure reducing unit 71 in the sublimating step S15 to sublimate the solidified body 63.

In each of the first to the seventh embodiments, in the solidifying step 14, using the gas supplying unit 41, gas having a low temperature not higher than the solidifying point of the dry assistant substance is supplied to produce the solidified body 63 on the front surface Wf. However, the present disclosure is not limited to this form.

Specifically, a structure may be used which has a spin chuck that directly contacts the central portion of the back surface Wb of the substrate W to suck and hold the substrate W, instead of the spin base 53 and the chuck pin 54 in each of FIGS. 1, 10 and 15. According to this structure, the spin chuck is cooled by a known cooling mechanism (for example, a pipe through which cold water is passed, or a Peltier element) to cool the substrate W from the back surface Wb side thereof to cool the dry assistant liquid 62 (the rinsing liquid 65 in the second embodiment, or the rinsing liquid 69 in the sixth embodiment) on the front surface Wf to a low temperature not higher than the solidifying point thereof.

In the first to the seventh embodiments, it is allowable in at least one of the solidifying step S14 and the sublimating step S15 to supply a coolant onto the back surface Wb of the substrate W at a low temperature not higher than the solidifying point of the dry assistant substance (the process liquid in the fifth to the seventh embodiments) instead of the use of the gas supplying unit 41. In this way, the substrate W can be cooled from the back surface Wb side thereof to cool a low temperature not higher than the solidifying point of the dry assistant liquid 62 (the rinsing liquid 65 in the second embodiment, or the rinsing liquid 69 in the sixth embodiment). This manner can be realized by making, in the substrate treating apparatus 1, 10 or 20, a through hole in a central portion of the spin base 53 in FIG. 1, 10 or 15, and then locating a unit (solidifying unit or sublimating unit) for supplying the coolant through the through hole to the back surface Wb side of the substrate W. This unit may have, for example, a structure having a coolant storing part in which the coolant is stored, a coolant temperature adjusting part for adjusting the temperature of the coolant stored in the coolant storing part, a pipe through which the coolant storing part is connected to the through hole, and a valve fitted into the middle of the pipe (each of these members being not illustrated).

The coolant temperature adjusting part is electrically connected to the control unit 13, and is a section for heating or cooling the coolant stored in the coolant storing part through an operation command of the control unit 13. It is sufficient for the temperature adjustment to be made to cause the coolant stored in the coolant storing part to have a low temperature not higher than the solidifying point of the dry assistant substance. The coolant temperature adjusting part is not particularly limited, and may be, for example, a known temperature adjusting mechanism such as a Peltier element, or a pipe through which temperature-adjusted water is passed.

The coolant in the coolant storing part is pressurized by a pressurizing unit not illustrated, so as to be sent to a pipe. The pressurization can also be realized by pressurization through, e.g., a pump, or compressive storage of a gas into the coolant storing part.

The valve is electrically connected to the control unit 13, and is usually closed. The opening and the closing of the valve are each controlled through an operation command from the control unit 13. When the valve is opened through an operation command from the control unit 13, the coolant is passed through a pipe to be supplied from the through hole to the back surface Wb of the substrate W. In this way, in the solidifying step S14, the dry assistant liquid 62 (the rinsing liquid 65 in the second embodiment or the rinsing liquid 69 in the sixth embodiment) on the front surface Wf can be solidified to produce a solidified body. Moreover, in the sublimating step S15, the solidified body 63 can be sublimated while prevented from being melted.

The coolant may be a liquid or gas having a temperature not higher than the solidifying point of the dry assistant substance. This liquid is not particularly limited, and is, for example, cold water of 7° C. temperature. The gas is not particularly limited, and is, for example, an inert gas chemically inert to the dry assistant substance, more specifically, for example, nitrogen gas of 7° C. temperature.

The present disclosure is applicable to all drying techniques for removing a liquid adhering on a surface of a substrate, and all substrate treating techniques of using any one of the drying techniques to treat a surface of a substrate.

EXAMPLES

Hereinafter, preferred working examples of this invention will be demonstratively and specifically described. However, materials, blend amounts and others that are described in the examples do not limit the scope of this invention as far as the specification does not include restrictive description thereabout.

Pattern-Attached Substrate A

Figure 21:
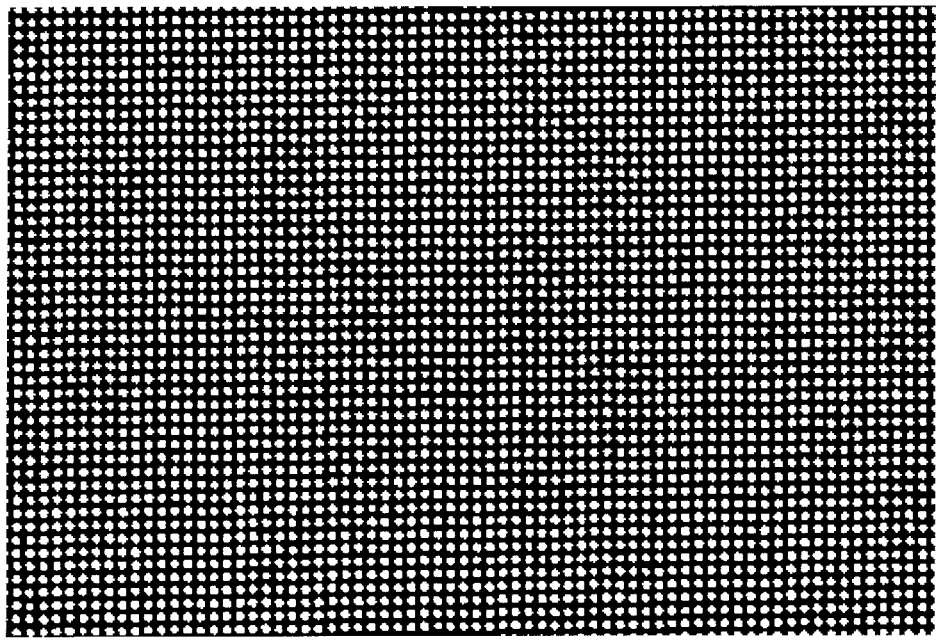
FIG. 21 is an SEM image showing a pattern-formed surface of an untreated silicon substrate used in each of working examples of the present invention and comparative examples.

As each pattern-attached substrate A, prepared was a silicon substrate A having a front surface on which a model pattern was formed. FIG. 21 is an SEM (scanning electron microscope) image showing the surface of the silicon substrate on which the model pattern was formed. The adopted model pattern was a pattern in which circular columns having a diameter of 30 nm and a height of 480 nm (aspect ratio: 16) were arranged at intervals of about 30 nm. In FIG. 21, white portions are heads of the circular columns (i.e., convexities of the pattern) while black portions are concavities of the pattern. It is verified as shown in FIG. 21 that white circles having substantially the same size are regularly arranged in the pattern-formed surface.

Example 1

In the present example, one of the silicon substrates A was subjected to drying treatment through steps described below. The pattern-collapse-restraining effect of this example was then evaluated. For the treatment of the silicon substrate A, the substrate treating apparatus described in the first embodiment was used.

<Step 1-1: Radiation of Ultraviolet Rays>

Initially, ultraviolet rays were radiated onto the front surface of the silicon substrate A to make the front surface property thereof hydrophilic. In this way, an environment was artificially produced in which a liquid was to be easily put into the concavities of the pattern, and the pattern was to collapse easily after the supply of the liquid to the front surface.

<Step 1-2: Supplying Step>

Next, inside the chamber 11 under an atmospheric pressure, a dry assistant liquid (liquid temperature: 40° C.) made of a melted sublimable substance was directly supplied on the pattern-formed surface of the dry silicon substrate A. In this way, a liquid membrane of the dry assistant liquid was formed on the pattern-formed surface of the silicon substrate A. The used sublimable substance was 1,1,2,2,3,3,4-heptafluorocyclopentane, which is represented by a chemical structural formula illustrated below. About this compound, the surface tension is 19.6 mN/m at 25° C., the vapor pressure is 8.2 kPa (62.0 mmHg) at 20° C. The melting point and the solidifying points thereof are each 20.5° C. The specific gravity is 1.58 at 25° C. This compound is further excellent in dissolving performance of, for example, fluorine-contained polymers. Thus, this compound is used as a solvent for various coating agents, and as a washing agent for oil membrane stains.

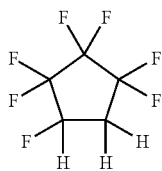

<Step 1-3: Solidifying Step>

Subsequently, under an atmospheric pressure, nitrogen gas of 7° C. temperature was supplied onto the liquid membrane made of the dry assistant liquid to solidify the dry assistant liquid. In this way, a solidified body was produced.

<Step 1-4: Sublimating Step>

Furthermore, in an atmospheric-pressure environment of an ambient temperature, nitrogen gas of 7° C. temperature was continuously supplied to the solidified body to sublimate the dry assistant substance (sublimable substance) while the solidified body was prevented from being melted. In this way, the solidified body was removed from the pattern-formed surface of the silicon substrate. The temperature of the nitrogen gas, which was 7° C., was lower than the melting point (20.5° C.) of 1,1,2,2,3,3,4-heptafluorocyclopentane. Thus, the solidified body was not separately cooled.

Figure 22:
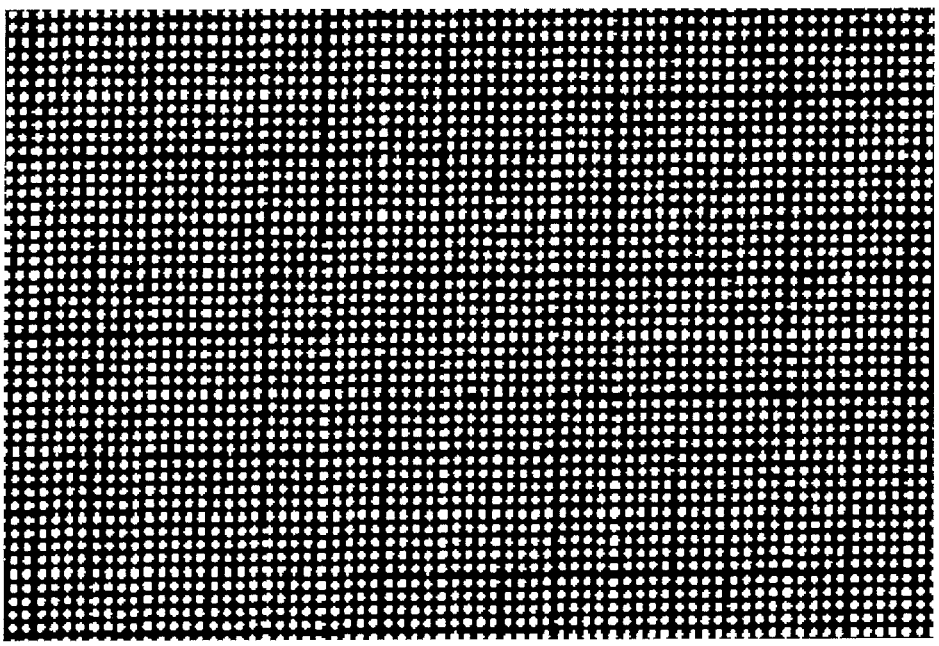
FIG. 22 is an SEM image showing a pattern-formed surface of a silicon substrate subjected to substrate treatment according to Example 1 of the present invention.

FIG. 22 is an SEM image of the silicon substrate A subjected to the above-mentioned step 1-1 to step 1-4. When compared with the pattern-formed surface (see FIG. 21) of the silicon substrate A before the drying treatment, the dried surface hardly underwent pattern collapse so that the collapse ratio in the displayed area of the dried surface was 0%. This matter demonstrated that the use of 1,1,2,2,3,3,4-heptafluorocyclopentane as a dry assistant substance makes it possible to restrain pattern collapse very satisfactorily and is useful for sublimation drying.

The collapse ratio is a value calculated out in accordance with the following expression:

Collapse ratio (%)="the number of collapsed convexities in any area"/"the total number of convexities in the area"×100

Example 2

In the present embodiment, the process from the step 1-1 to step 1-4 was performed in the same way as in Example 1 except that in the supplying step, the liquid temperature of the dry assistant liquid supplied on the pattern-formed surface of one of the silicon substrates A was changed to an ambient temperature (23° C.). In this way, the pattern-formed surface of the silicon substrate A was freeze-dried.

Figure 23:
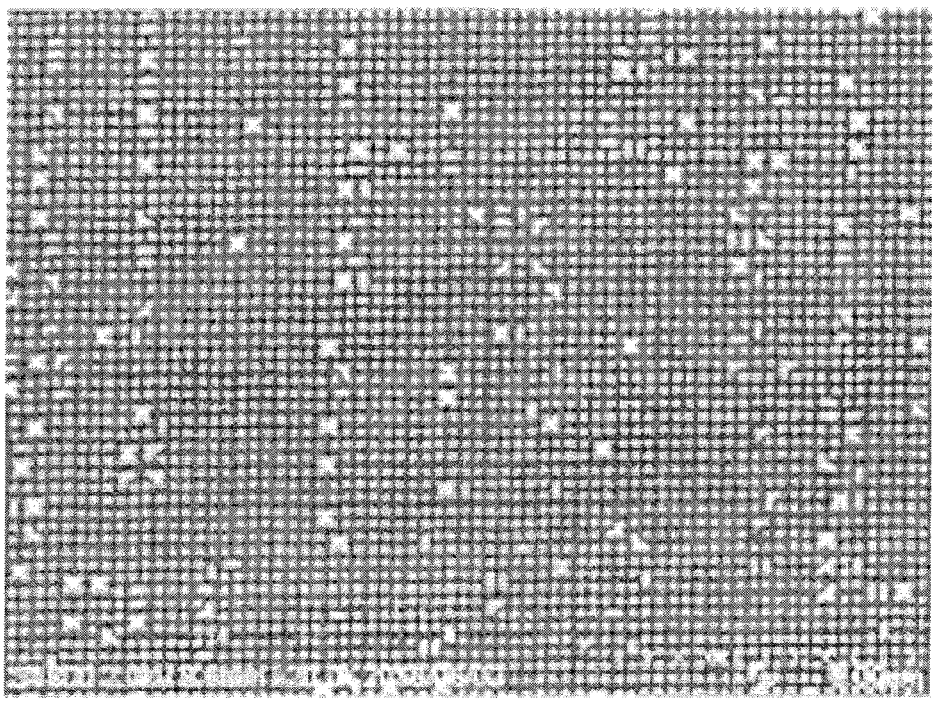
FIG. 23 is an SEM image showing a pattern-formed surface of a silicon substrate subjected to substrate treatment according to Example 2 of the present invention.

FIG. 23 is an SEM image of the silicon substrate A subjected to the above-mentioned step 1-1 to step 1-4 in the present example. When compared with the pattern-formed surface (see FIG. 21) of the silicon substrate A before the drying treatment, the dried surface was a surface about which pattern collapse into the form of cracks was slightly observed. However, the collapse ratio in the displayed area of the dried surface was restrained to 16%. This matter demonstrated that the use of 1,1,2,2,3,3,4-heptafluorocyclopentane as a dry assistant substance at an ambient temperature also makes it possible to restrain pattern collapse satisfactorily and is useful for sublimation drying.

Example 3

In the present embodiment, the process from the step 1-1 to step 1-4 was performed in the same way as in Example 1 except that in the supplying step, the liquid temperature of the dry assistant liquid supplied on the pattern-formed surface of one of the silicon substrates A was changed to 60° C. In this way, the pattern-formed surface of the silicon substrate A was freeze-dried.

Figure 24:
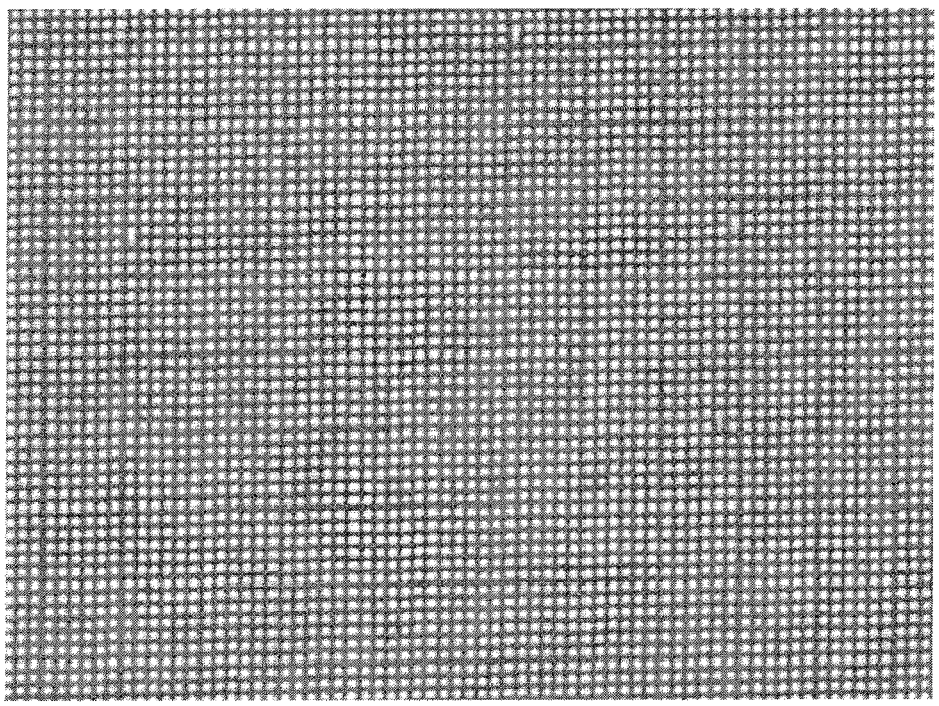
FIG. 24 is an SEM image showing a pattern-formed surface of a silicon substrate subjected to substrate treatment according to Example 3 of the present invention.

FIG. 24 is an SEM image of the silicon substrate A subjected to the above-mentioned step 1-1 to step 1-4 in the present example. When compared with the pattern-formed surface (see FIG. 21) of the silicon substrate A before the drying treatment, the dried surface hardly underwent pattern collapse so that the collapse ratio in the displayed area of the dried surface was 0%. This matter demonstrated that the use of 1,1,2,2,3,3,4-heptafluorocyclopentane as a dry assistant substance makes it possible to restrain pattern collapse very satisfactorily and is useful for sublimation drying.

Comparative Example 1

In the present embodiment, one of the silicon substrates A was subjected to drying treatment in the same way as in Example 1 except that t-butanol was used as a dry assistant liquid instead of 1,1,2,2,3,3,4-heptafluorocyclopentane.

Figure 25:
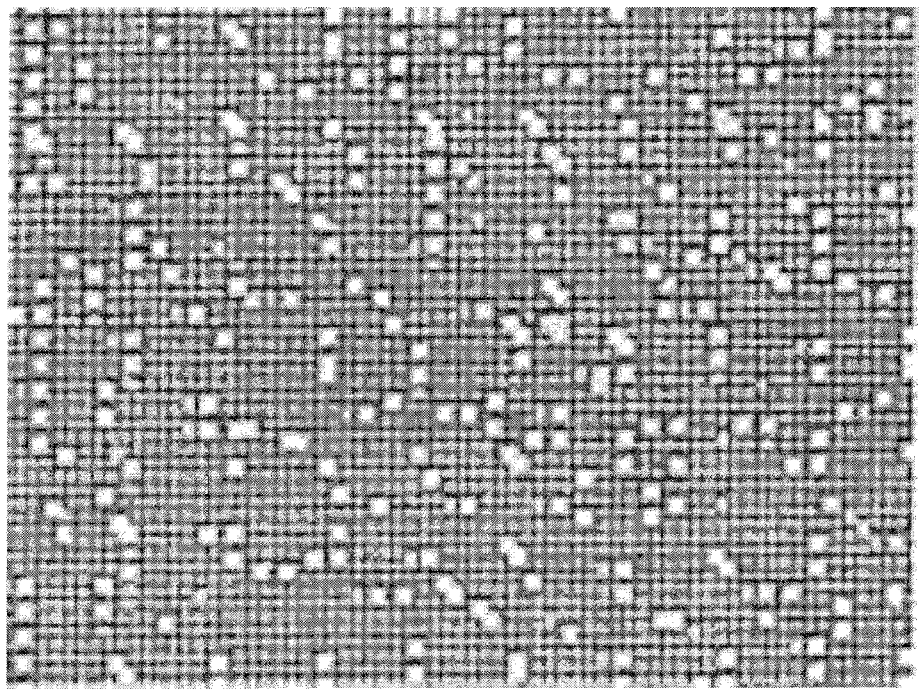
FIG. 25 is an SEM image showing a pattern-formed surface of a silicon substrate subjected to substrate treatment according to Comparative Example 1.

FIG. 25 is an SEM image of an area showing an average pattern collapse ratio in the silicon substrate A subjected to the above-mentioned steps. When compared with the pattern-formed surface (see FIG. 21) of the silicon substrate A before the drying treatment, the dried surface was a surface in which grown white circles were observed in many sites. Thus, it was verified that the substrate failed in a decrease in pattern collapse. The pattern collapse ratio was about 16%.

Example 4

In Example 1, evaluation was made about the pattern-collapse-restraining effect in the case of supplying the dry assistant liquid directly on the pattern-formed surface of the dried silicon substrate A. However, in an actual drying treatment of a substrate, the drying treatment is applied to the substrate in the state that a liquid adheres on its pattern-formed surface after wet washing treatment. Accordingly, in the present Example 4, evaluation was made about the pattern-collapse-restraining effect in the case of supplying DIW and IPA to dried one of the silicon substrates A, and subsequently supplying a dry assistant liquid thereonto to apply drying treatment to the substrate. The used silicon substrate was the same as used in Example 1. In the drying treatment, the substrate treating apparatus described in the first embodiment was used.

<Step 2-1: Radiation of Ultraviolet Rays>

In the same manner as in Example 1, ultraviolet rays were radiated on the silicon substrate A.

<Step 2-2: DIW and IPA Supplying Step>

Next, DIW was supplied on the pattern-formed surface of the dried silicon substrate A, and then IPA was further supplied thereonto. In this way, DIW adhering on the pattern-formed surface of the silicon substrate A was removed to form a liquid membrane of IPA.

<Step 2-3: Supplying Step>

Subsequently, in the same manner as in Example 1, a dry assistant liquid was supplied on the pattern-formed surface of the silicon substrate A. In this way, the liquid membrane of IPA formed on the pattern-formed surface of the silicon substrate A was removed to form a liquid membrane of the dry assistant liquid. The used dry assistant liquid was the same as in Example 1.

<Step 2-4: Solidifying Step>

Subsequently, under an atmospheric pressure, nitrogen gas of 7° C. temperature was supplied on the liquid membrane made of the dry assistant liquid to solidify the dry assistant liquid. In this way, a solidified body was produced.

<Step 2-5: Sublimating Step>

Furthermore, in an atmospheric-pressure environment of an ambient temperature, nitrogen gas of 7° C. temperature was continuously supplied to the solidified body to sublimate the dry assistant substance while the solidified body was prevented from being melted. In this way, the solidified body was removed from the pattern-formed surface of the silicon substrate A. The temperature of the nitrogen gas, which was 7° C., was lower than the melting point (20.5° C.) of 1,1,2,2,3,3,4-heptafluorocyclopentane. Thus, the solidified body was not separately cooled.

Figure 26:
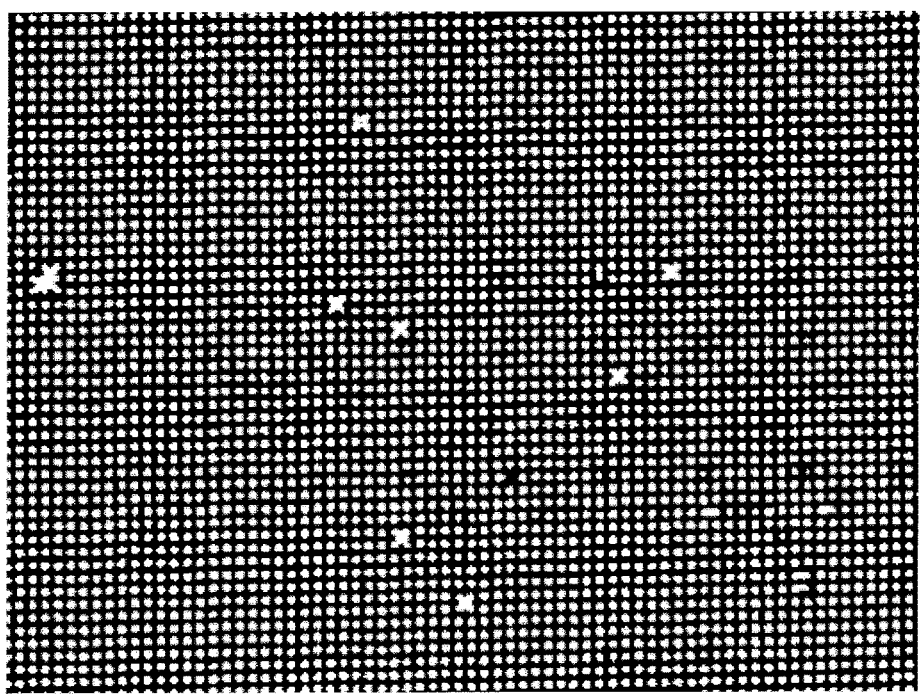
FIG. 26 is an SEM image showing a pattern-formed surface of a silicon substrate subjected to substrate treatment according to Example 4 of the present invention.

FIG. 26 is an SEM image of the silicon substrate A subjected to the above-mentioned step 2-1 to step 2-5. When compared with the pattern-formed surface (see FIG. 21) of the silicon substrate A before the drying treatment, the dried surface was a surface in which grown white circles were observed in plural sites. Thus, pattern collapse was verified. However, the collapse ratio in the displayed area of the dried surface was less than 1%. This matter demonstrated that for the wet-washed silicon substrate A, the use of 1,1,2,2,3,3,4-heptafluorocyclopentane as a dry assistant substance makes it possible to decrease the generation of pattern collapse satisfactorily.

Example 5

In Examples 1 and 4, the pattern collapse ratio was evaluated in the normal pressure environment. In the present Example 5, evaluation was made about the pattern-collapse-restraining effect in the case of sublimating a dry assistant substance in a reduced-pressure environment. As a silicon substrate, the same as in Example 1 was used. In drying treatment of the substrate, the substrate treating apparatus described in the second embodiment was used.

<Step 3-1: Radiation of Ultraviolet Rays>

In the same manner as in Example 1, ultraviolet rays were radiated on one of the silicon substrates A.

<Step 3-2: Supplying Step>

Next, in the chamber 11 under an atmospheric pressure, a dry assistant liquid (liquid temperature: 40° C.) made of a melted sublimable substance was directly supplied on the pattern-formed surface of the dried silicon substrate A. In this way, a liquid membrane made of the dry assistant liquid was formed on the pattern-formed surface of the silicon substrate A. The used dry assistant liquid was the same as in Example 1.

<Step 3-3: Solidifying Step>

Thereafter, in an environment under an atmospheric pressure, the silicon substrate A was put on a cooling plate, and the back surface of the substrate was brought into contact with the cooling plate to cool the liquid membrane of the dry assistant liquid from the back surface side of the substrate. In this way, a solidified body made of the dry assistant liquid was produced.

<Step 3-4: Sublimating Step>

Subsequently, the pressure in the chamber 11, in which the silicon substrate A was held, was reduced by the pressure reducing unit 71 to set the pressure to 1.7 Pa. In this way, the dry assistant substance was sublimated to remove the solidified body on the front surface of the silicon substrate A.

Figure 27:
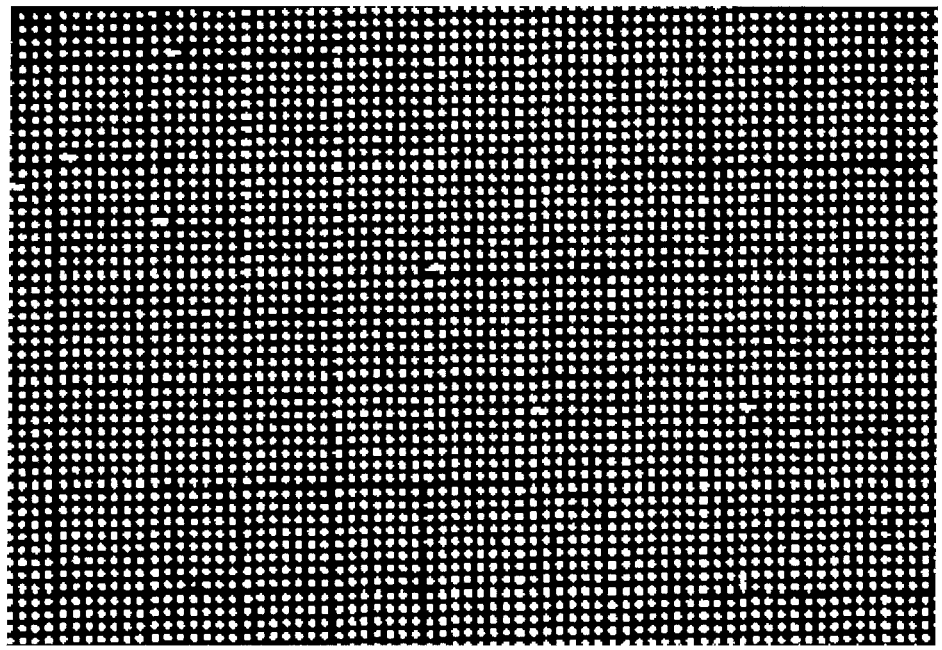
FIG. 27 is an SEM image showing a pattern-formed surface of a silicon substrate subjected to substrate treatment according to Example 5 of the present invention.

FIG. 27 is an SEM image of the silicon substrate A subjected to the above-mentioned step 3-1 to step 3-4. When compared with the pattern-formed surface (see FIG. 21) of the silicon substrate A before the drying treatment, the dried surface was a surface in which grown white circles were observed in plural sites. Thus, pattern collapse was slightly verified. However, the collapse ratio in the displayed area of the dried surface was less than 1%. This matter demonstrated that even when the sublimating step is performed in a reduced-pressure environment, the use of 1,1,2,2,3,3,4-heptafluorocyclopentane as a dry assistant substance makes it possible to decrease the generation of pattern collapse satisfactorily.

Comparative Example 2

In the present embodiment, one of the silicon substrates A was subjected to drying treatment in the same way as in Example 3 except that t-butanol was used as a dry assistant liquid instead of 1,1,2,2,3,3,4-heptafluorocyclopentane.

In the present comparative example, the best results were obtained among the examples in each of which t-butanol was used as the dry assistant liquid and the sublimating step was performed in the reduced-pressure environment. When compared with the present comparative example, a case where t-butanol was used and further the sublimating step was performed in an ordinary-pressure environment was higher in pattern collapse ratio. Thus, any description thereof is omitted.

Figure 28:
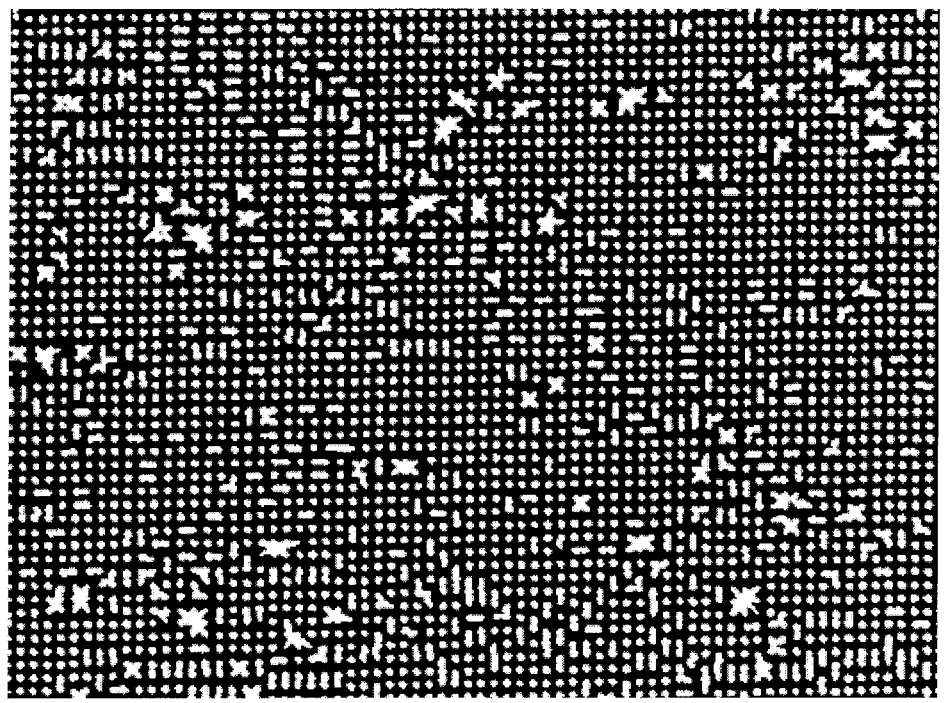
FIG. 28 is an SEM image showing a pattern-formed surface of a silicon substrate subjected to substrate treatment according to Comparative Example 2.
Figure 29:
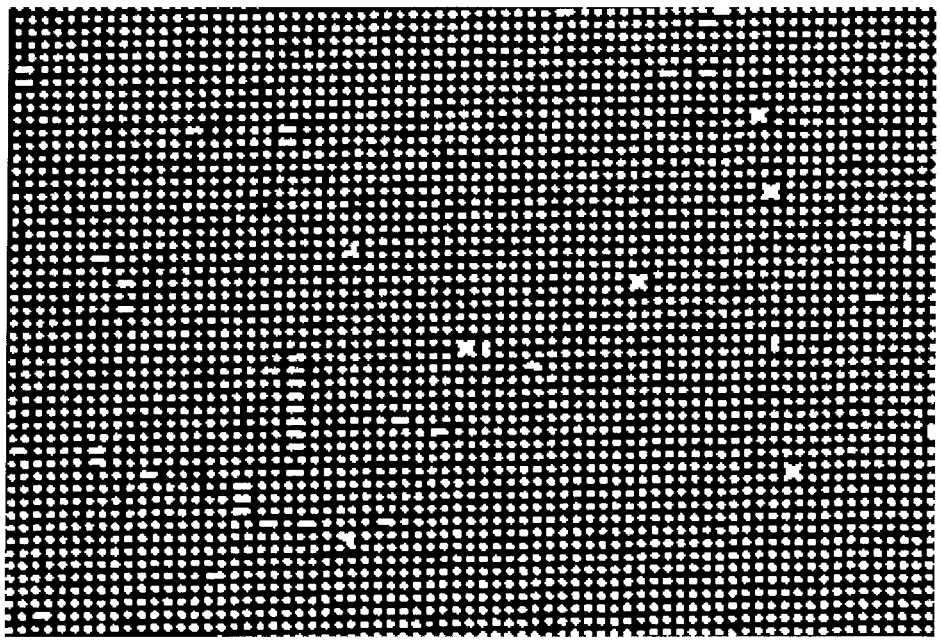
FIG. 29 is an SEM image showing another pattern-formed surface of the silicon substrate subjected to the substrate treatment according to the Comparative Example 2.

FIG. 28 is an SEM image of an area showing an average pattern collapse ratio in the silicon substrate A subjected to the above-mentioned steps. When compared with the pattern-formed surface (see FIG. 21) of the silicon substrate A before the drying treatment, the dried surface was a surface in which grown white circles were observed in many sites. Thus, it was verified that the substrate failed in a decrease in pattern collapse. The pattern collapse ratio was about 34%. FIG. 29 is an SEM image of an area where the pattern collapse ratio was the best value in the silicon substrate A subjected to the above-mentioned steps. Even in the best area, grown white circles were verified in its plural sites. The pattern collapse ratio of this area was 4%.

Example 6

In the present example, one of the silicon substrates A was subjected to drying treatment through steps described below to evaluate the pattern-collapse-restraining effect thereof. For the treatment of the silicon substrate A, the substrate treating apparatus described in the third embodiment was used. The used silicon substrate was a substrate having a formed brittle pattern, in which pattern collapse was to be more easily caused than in the silicon substrate used in Example 1.

<Step 4-1: Radiation of Ultraviolet Rays>

In the same manner as in Example 1, ultraviolet rays were radiated on the silicon substrate A.

<Step 4-2: Water Repellant Treatment>

Next, inside the chamber 11 under an atmospheric pressure, HMDS gas was brought into direct contact with the pattern-formed surface of the dried silicon substrate A. In this way, the pattern-formed surface of the silicon substrate A was subjected to water repellent treatment.

<Step 4-3: Supplying Step>

Subsequently, in the same manner as in Example 1, a dry assistant liquid was supplied on the pattern-formed surface of the silicon substrate A. In this way, a liquid membrane made of the dry assistant liquid was formed on the pattern-formed surface of the silicon substrate A. The used dry assistant liquid was the same as in Example 1.

<Step 4-4: Solidifying Step>

Subsequently, in the same manner as in rinsing liquid 1, nitrogen gas of 7° C. temperature was supplied onto the liquid membrane made of the dry assistant liquid in an environment under an atmospheric pressure to solidify the dry assistant liquid to produce a solidified body.

<Step 4-5: Sublimating Step>

Subsequently, in the same manner as in Example 1, in an atmospheric-pressure environment of an ambient temperature, nitrogen gas of 7° C. temperature was continuously supplied to the solidified body to sublimate the dry assistant substance (sublimable substance) while the solidified body was prevented from being melted. In this way, the solidified body was removed from the pattern-formed surface of the silicon substrate A.

Figure 30:
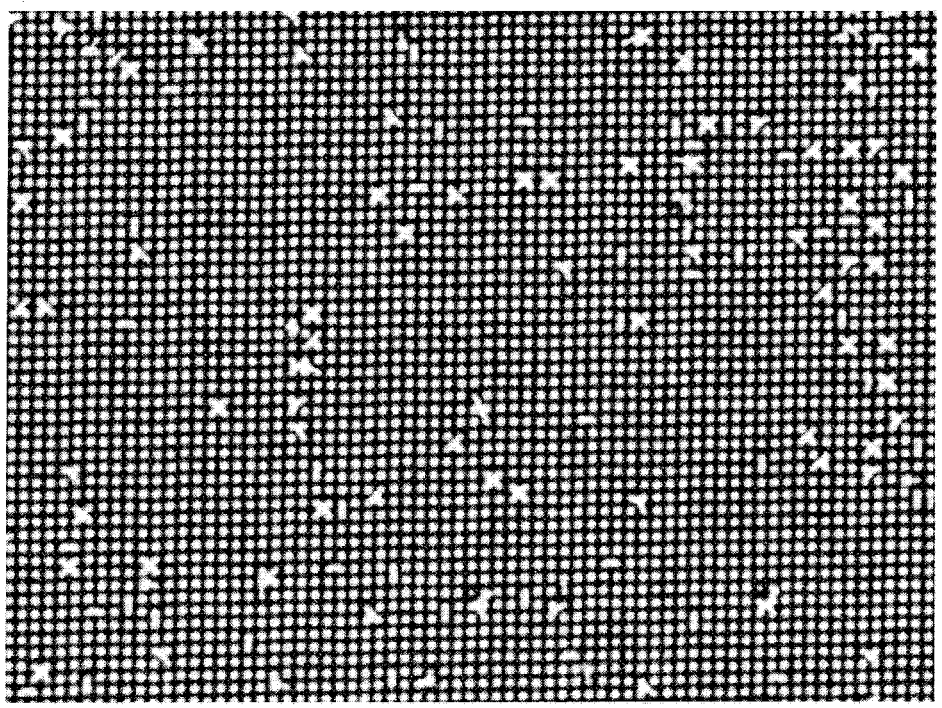
FIG. 30 is an SEM image showing a pattern-formed surface of a silicon substrate subjected to substrate treatment according to Example 6 of the present invention.

FIG. 30 is an SEM image of the silicon substrate A subjected to the above-mentioned step 4-1 to step 4-5. It was verified that the dried surface was a surface in which pattern collapse was largely decreased when compared with the pattern-formed surface (see FIG. 31) of the silicon substrate A in the case where only the water repellent treatment was not conducted. The collapse ratio in the displayed area of the dried surface was 1% or less. This matter demonstrated that the generation of pattern collapse can be satisfactorily decreased by subjecting the pattern-formed surface of the silicon substrate A beforehand to water repellent treatment.

Pattern-Attached Substrate B

Figure 32:
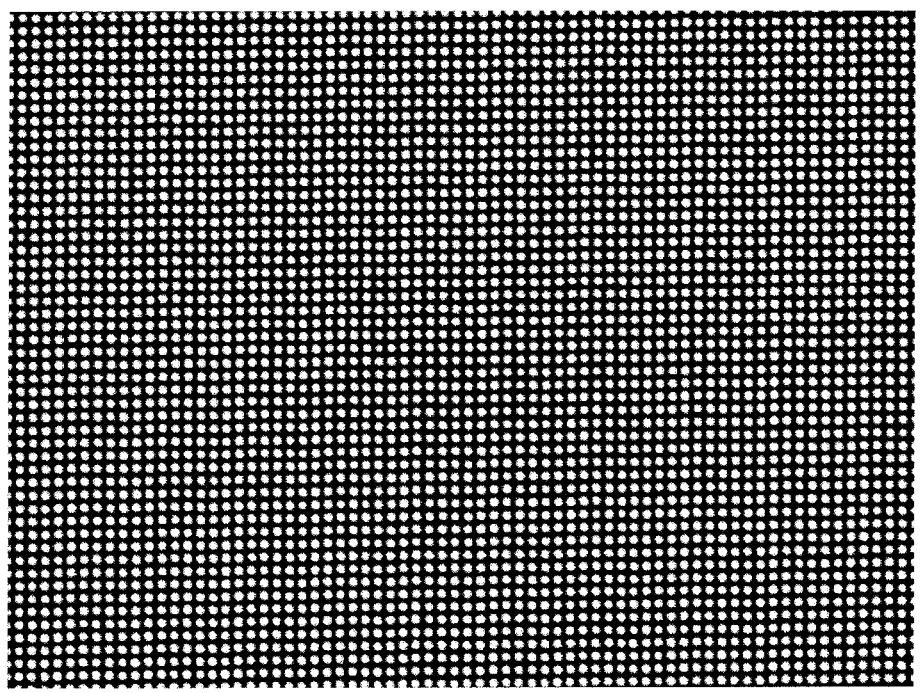
FIG. 32 is an SEM image showing a pattern-formed surface of an untreated specimen used in each of Examples 7 to 11 of the present invention and Comparative Examples 3 and 4.

As a pattern-attached substrate B, prepared was a silicon substrate B having a front surface on which a model pattern was formed. From the silicon substrate B, square specimens having each side of 1 cm length were cut out. FIG. 32 shows an SEM image showing the surface of one of the specimens on which the model pattern was formed. The adopted model pattern was a pattern in which circular columns having a diameter of about 30 nm (aspect ratio: about 20) were arranged. In FIG. 32, white portions are heads of the circular columns (i.e., convexities of the pattern) while black portions are concavities of the pattern. As shown in FIG. 32, it is verified that white circles having substantially the same size are regularly arranged in the pattern-formed surface.

Example 7

In the present example, one of the specimens cut out from the silicon substrate B was used and subjected to drying treatment through steps described below. The pattern-collapse-restraining effect thereof was then evaluated.

Initially, the specimen was put into a vial bottle, and then a process liquid was charged thereinto at an ambient temperature (23° C.) under an ordinary pressure to form a liquid membrane of the dry assistant liquid (process liquid) on the pattern-formed surface of the specimen. The used process liquid was a liquid composed of 1,1,2,2,3,3,4-heptafluorocyclopentane (see the above-mentioned structural formula) in a melt state and isopropyl alcohol (IPA) as an alcohol. The concentration of IPA in the dry assistant liquid was set to 0.1% by volume of this liquid. Moreover, the liquid temperature of the dry assistant liquid was set to 23° C.

About IPA, the surface tension is 20.8 mN/m at 25° C., the vapor pressure is 4.4 kPa (33.0 mmHg) at 20° C. The melting point and the solidifying points thereof are each −89.5° C. The specific gravity is 0.78 at 25° C.

Next, the vial bottle was put inside a freezing chamber to solidify the dry assistant liquid in an atmosphere of 0° C. temperature under an ordinary pressure to produce a solidified body.

Furthermore, the vial bottle was continuously put in the freezing chamber to sublimate the dry assistant substance (sublimable substance) and IPA while the solidified body was prevented from being melted. In this way, the solidified body was removed from the pattern-formed surface of the specimen.

Figure 33:
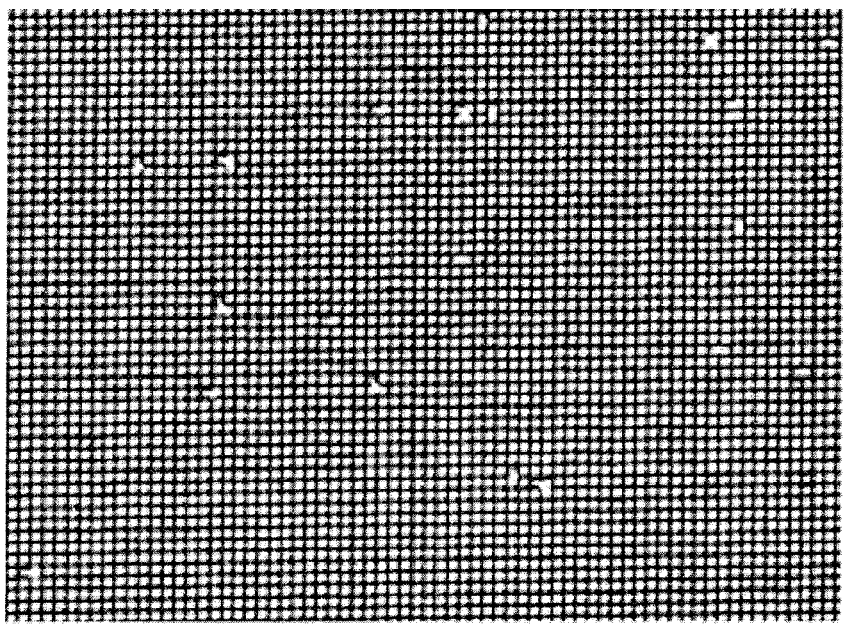
FIG. 33 is an SEM image showing a pattern-formed surface of a specimen subjected to substrate treatment according to Example 7 of the present invention.
Figure 34:
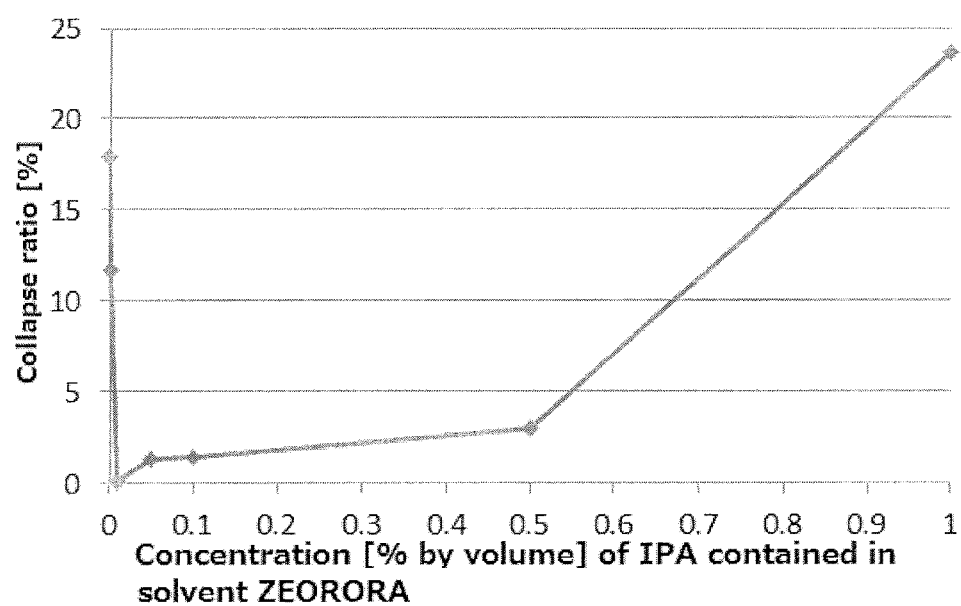
FIG. 34 is a graph showing a relationship between the IPA concentration and the pattern collapse ratio in Examples 7 to 11 of the present invention, and Comparative Examples 3 and 4.

The removal of the solidified body was verified, and then the temperature of the inside of the freezing chamber was raised to 30° C. to prevent dew condensation. Thereafter, the vial bottle was taken out to evaluate the pattern-collapse-restraining effect of the pattern-formed surface. FIG. 33 is an SEM image of the pattern-formed surface of the specimen. FIG. 34 is a graph showing a relationship between the concentration of IPA and the pattern collapse ratio. When compared with the pattern-formed surface (see FIG. 32) of the specimen before the drying treatment, the dried surface was a surface in which pattern collapse was hardly observed. The collapse ratio in the displayed area of the dried surface was 1.41% (see Table 1 described below and FIG. 34). This matter demonstrated that according to the use of the dry assistant liquid including 1,1,2,2,3,3,4-heptafluorocyclopentane in a melt state, as a dry assistant substance, and IPA, pattern collapse can be very satisfactorily restrained, and the use is useful for sublimation drying.

Examples 8 to 11

In each of Examples 8 to 11, the IPA concentration in the dry assistant liquid was changed as shown in Table 1 described below. In the same manner as in Example 7 except the change, the pattern-formed surface of one of the specimens, which was a specimen of the working example, was subjected to drying treatment. The results are shown in Table 1 and FIG. 34. In any one of the working examples, the generation of pattern collapse was restrained, and the collapse ratio in the displayed area of the dried surface was as shown in Table 1 and FIG. 34. This matter demonstrated that according to the use of a dry assistant liquid containing 1,1,2,2,3,3,4-heptafluorocyclopentane in a melt state, as a dry assistant substance, and IPA having a concentration in a predetermined range, pattern collapse can be very satisfactorily restrained, and the use is useful for sublimation drying.

Comparative Example 3

Figure 35:
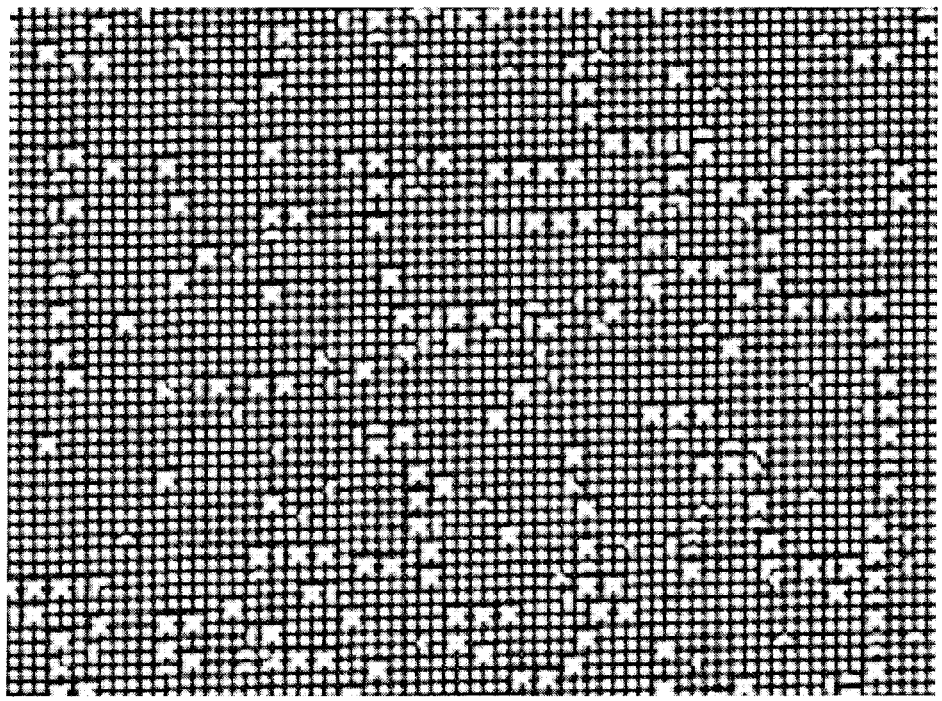
FIG. 35 is an SEM image showing a pattern-formed surface of a specimen subjected to substrate treatment according to Comparative Example 3.

In the present comparative example, as a dry assistant liquid, a liquid made only of 1,1,2,2,3,3,4-heptafluorocyclopentane in a melt state was used. In the same manner as in Example 7 except the use, the pattern-formed surface of one of the specimens was subjected to drying treatment. FIG. 35 is an SEM image of the pattern-formed body of the specimen. When compared with the pattern-formed surface (see FIG. 32) of the specimen before the drying treatment, the dried surface was a surface in which grown white circles were observed in many sites. Pattern collapse into the form of cracks was verified. The pattern collapse ratio was 17.94% (see Table 1 and FIG. 34 below).

Comparative Example 4

In Comparative Example 4, the IPA concentration in the dry assistant liquid was changed as shown in Table 1 described below. In the same manner as in Example 7 except the change, the pattern-formed surface of one of the specimens, which was a specimen of the present comparative example, was subjected to drying treatment. As a result, the collapse ratio in the displayed area of this specimen was 23.67% (see Table 1 and FIG. 34). This matter demonstrated that even by the use of a dry assistant liquid containing 1,1,2,2,3,3,4-heptafluorocyclopentane in a melt state, as a dry assistant substance, and IPA, pattern collapse cannot be sufficiently decreased when the IPA concentration is 1% by volume.

TABLE 1

|  | IPA concentration (% by volume) | Collapse ratio (%) |
|---|---|---|
| Example 7 | 0.1 | 1.41 |
| Example 8 | 0.001 | 11.72 |
| Example 9 | 0.01 | 0.09 |
| Example 10 | 0.05 | 1.32 |
| Example 11 | 0.5 | 3.01 |
| Comparative Example 3 | 0 | 17.94 |
| Comparative Example 4 | 1 | 23.67 |

Results

As shown in FIGS. 22 to 29, it is verified that Examples 1 to 5, in each of which 1,1,2,2,3,3,4-heptafluorocyclopentane as a fluorinated carbon compound species was used as a dry assistant substance, succeeded in decreasing the generation of pattern collapse more largely than Comparative Examples 1 and 2, in each of which t-butanol, which is a conventional dry assistant substance, was used.

Moreover, as shown in FIGS. 22 to 24, Example 1, in which the liquid temperature of the dry assistant liquid was 40° C., and Example 3, in which the liquid temperature was 60° C., were far better in pattern-collapse-decreasing effect than Example 2, in which the liquid temperature was 23° C. This matter demonstrates that according to the use of a dry assistant liquid at a far higher temperature than the melting point (20.5° C.) of 1,1,2,2,3,3,4-heptafluorocyclopentane, which is a sublimable substance, the generation of pattern collapse can be satisfactorily decreased.

Figure 31:
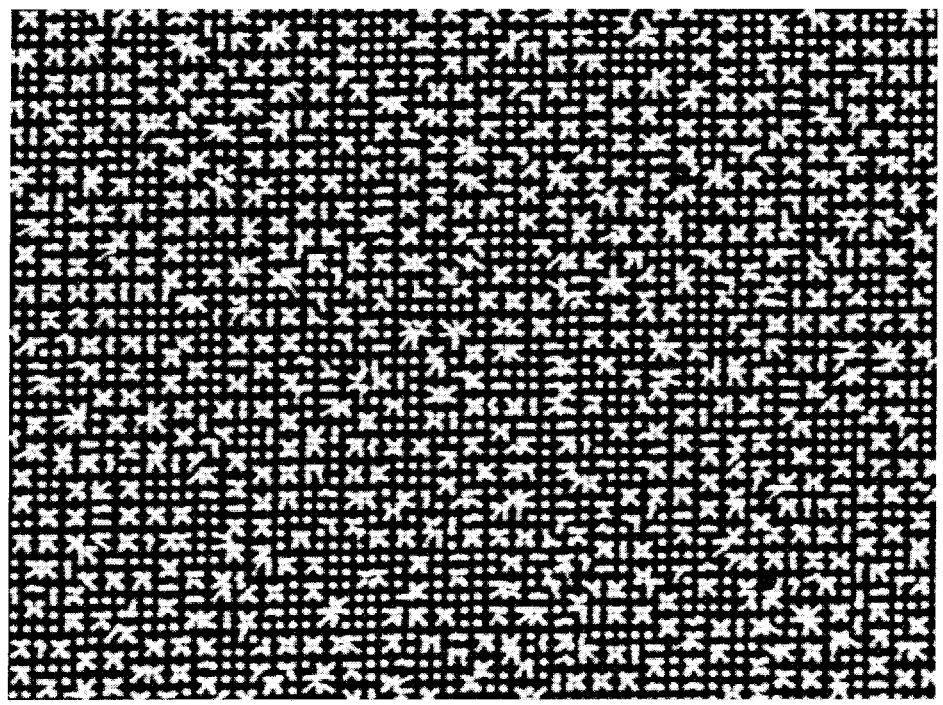
FIG. 31 is an SEM image showing a pattern-formed surface of the same silicon substrate as used in the Example 6 in the case of subjecting the silicon substrate to substrate treatment without subjecting the silicon substrate to any water repellent treatment.

Furthermore, as illustrated in FIG. 30, it is verified that in the case of Example 6, in which the pattern-formed surface of the silicon substrate A was beforehand subjected to the water repellent treatment, pattern collapse into the form of cracks was not generated, either, so that pattern collapse in any form was more largely decreased than in the case where the water repellent treatment was not conducted (see FIG. 31). The collapse ratio in the displayed area of the dried surface was 1% or less. This matter demonstrates that the generation of pattern collapse can be satisfactorily decreased by subjecting the pattern-formed surface of a silicon substrate, such as the silicon substrate A, to water repellent treatment.

Furthermore, as shown in Table 1 and FIG. 34, it is verified that in Examples 7 to 11, in each of which 1,1,2,2,3,3,4-heptafluorocyclopentane, which is a fluorinated carbon compound, was used as a dry assistant substance, and further isopropyl alcohol was incorporated into the dry assistant liquid to have a concentration of 0.01 to 0.5% by volume, pattern collapse was more satisfactorily restrained than in Comparative Example 3, into which no IPA was incorporated.

In Comparative Example 4, in which even when IPA was incorporated into the dry assistant liquid, the concentration thereof was 1% by volume, it was verified that the pattern-collapse-restraining effect was deteriorated. This would be because the excessively high IPA concentration relatively deteriorated the effect of decreasing pattern collapse, which is caused by surface tension, on the basis of 1,1,2,2,3,3,4-heptafluorocyclopentane.

The above results demonstrate that according to the use of a dry assistant liquid containing 1,1,2,2,3,3,4-heptafluorocyclopentane in a melt state, as a dry assistant substance, and IPA having a concentration in the range of 0.01 to 0.5% by volume, pattern collapse can be very satisfactorily restrained, and the use is useful for sublimation drying.

What is claimed is:
1. A substrate treating apparatus, comprising:
 a supplying unit which supplies a process liquid comprising a sublimable substance in a melt state on a pattern-formed surface of a substrate;
 a solidifying unit which solidifies the process liquid on the pattern-formed surface to produce a solidified body; and
 a sublimating unit which sublimates the solidified body to remove the solidified body from the pattern-formed surface;
 wherein the sublimable substance comprises a fluorinated carbon compound that at least one compound selected from the group consisting of the following compounds (A) to (E);
 a compound (A): a fluoroalkane having 3 to 6 carbon atoms, or the fluoroalkane to which at least one selected from the group consisting of the following is bonded: halogen radicals except a fluorine radical, a hydroxide group, an oxygen atom, a carboxyl group, and a perfluoroalkyl groups;
 a compound (B): a fluorocycloalkane having 3 to 6 carbon atoms, or the fluorocycloalkane to which at least one selected from the group consisting of the following is bonded: halogen radicals except a florine radical, a hydroxide group, an oxygen atom, a carboxyl group, and a perfluoroalkyl groups;
 a compound (C): a fluorobicycloalkane having 10 carbon atoms, or the fluorobicycloalkane to which at least one selected from the group consisting of the following is bonded: halogen radicals except a fluorine radical, cycloalkyl groups which may each have a halogen atom, and alkyl groups each having a cycloalkyl group which may have a halogen atom;
 a compound (D): a fluorotetracyanoquinodimethane, or the fluorotetracyanoquinodimethane to which at least one halogen radical except a fluorine radical is bonded; and
 a compound (E): a fluorocyclotriphosphazene, or the fluorocyclotriphosphazene to which at least one selected from the group consisting of the following is bonded: halogen radicals except a fluorine radical, a phenoxy group, and alkoxy groups.

2. The substrate treating apparatus according to claim 1, wherein the process liquid further comprises an alcohol showing compatibility with the sublimable substance, and a concentration of the alcohol in the process liquid ranges from 0.001 to 0.8% by volume of the process liquid.

3. The substrate treating apparatus according to claim 2, wherein the alcohol is isopropyl alcohol.

4. The substrate treating apparatus according to claim 1, wherein the compound (A) is tetradecafluorohexane.

5. The substrate treating apparatus according to claim 1, wherein the compound (B) is at least one compound selected from the group consisting of 1,1,2,2-tetrachloro-3,3,4,4-tetrafluorocyclobutane, 1,2,3,4,5-pentafluorocyclopentane, 1,1,2,2,3,3,4-heptafluorocyclopentane, fluorocyclohexane, dodecafluorocyclohexane, 1,1,4-trifluorocyclohexane, 2-fluorocyclohexanol, 4,4-difluorocyclohexanone, 4,4-difluorocyclohexanecarboxylic acid, and 1,2,2,3,3,4,4,5,5,6,6-undecafluoro-1-(nonafluorobutyl)cyclohexane.

6. The substrate treating apparatus according to claim 1, wherein the compound (C) is 2-[difluoro(undecafluorocyclohexyl)methyl]-1,2,3,3,4,4,4a,5,5,6,6,7,7,8,8,8a-heptadecafluorodecahydronaphthalene.

7. The substrate treating apparatus according to claim 1, wherein the compound (D) is tetrafluorotetracyanoquinodimethane.

8. The substrate treating apparatus according to claim 1, wherein the compound (E) is hexafluorocyclotriphosphazene.

9. The substrate treating apparatus according to claim 1, wherein the supplying unit is a unit which supplies the process liquid to the pattern-formed surface of the substrate under an atmospheric pressure, and the solidifying unit is a unit which cools the process liquid under an atmospheric pressure to a temperature not higher than a solidifying point of the sublimable substance.

10. The substrate treating apparatus according to claim 1, wherein the fluorinated carbon compound as the sublimable substance has sublimability under an atmospheric pressure, and the sublimating unit sublimates the sublimable substance under the atmospheric pressure.

11. The substrate treating apparatus according to claim 10, wherein the solidifying unit and the sublimating unit are a common gas supplying unit which supplies an inert gas chemically inert to at least the sublimable substance to the pattern-formed surface at a temperature not higher than a solidifying point of the sublimable substance.

12. The substrate treating apparatus according to claim 10, wherein at least one of the solidifying unit and the sublimating unit is a unit which supplies a coolant to a back surface of the substrate, which is opposite to the pattern-formed surface of the substrate, at a temperature not higher than a solidifying point of the sublimable substance.

13. The substrate treating apparatus according to claim 1, wherein the sublimating unit is a pressure reducing unit which makes an environment in which the pattern-formed surface, on which the solidified body is produced, is located into a pressure lower than an atmospheric pressure.

14. The substrate treating apparatus according to claim 13, wherein as the solidifying unit, the pressure reducing unit is used.

15. The substrate treating apparatus according to claim 1, wherein the supplying unit has a process liquid temperature adjusting part which adjusts a temperature of the process liquid to a temperature that is not lower than a melting point of the sublimable substance and is lower than the boiling point of the substance.

16. The substrate treating apparatus according to claim 1, wherein the supplying unit is a unit which supplies the process liquid as a washing liquid or a rinsing liquid to the pattern-formed surface of the substrate to wash or rinse the pattern-formed surface.

17. The substrate treating apparatus according to claim 1, further comprising a water repellent treatment unit which applies water repellent treatment to the pattern-formed surface of the substrate before the process liquid is supplied to the pattern-formed surface.

18. The substrate treating apparatus according to claim 2, wherein the solidifying unit and the sublimating unit are a common gas supplying unit which supplies an inert gas chemically inert to at least the sublimable substance and the alcohol to the pattern-formed surface at a temperature not higher than a solidifying point of the process liquid.

19. The substrate treating apparatus according to claim 18, wherein the supplying unit has a process liquid temperature adjusting part which adjusts the temperature of the process liquid to a temperature that is not lower than a melting point of the sublimable substance, and that is a temperature lower than lower one of the respective boiling points of the sublimable substance and the alcohol.

20. A substrate treating method, comprising:
a supplying step of supplying a process liquid comprising a sublimable substance in a melt state on a pattern-formed surface of a substrate;
a solidifying step of solidifying the process liquid on the pattern-formed surface to produce a solidified body; and
a sublimating step of sublimating the solidified body to be removed from the pattern-formed surface;
wherein the sublimable substance comprises a fluorinated carbon compound that is at least one compound selected from the group consisting of the following compounds (A) to (E):
a compound (A): a fluoroalkane having 3 to 6 carbon atoms, or the fluoroalkane to which at least one selected from the group consisting of the following is bonded: halogen radicals except a fluorine radical, a hydroxide group, an oxygen atom, a carboxyl group, and perfluoroalkyl groups;
a compound (B): a fluorocycloalkane having 3 to 6 carbon atoms, or the fluorobicycloalkane to which at least one selected from the group consisting of the following is bonded: halogen radicals except a fluorine radical, a hydroxide group, an oxygen atom, a carboxyl group, and the perfluoroalkyl groups;
a compound (C): a fluorobicycloalkane having 10 carbons, or the fluorobicycloalkane to which at least one selected from the group consisting of the following is bonded: halogen radicals except a fluorine radical, cycloalkyl groups which may each have a halogen atom, and alkyl groups each having a cycloalkyl group which may have halogen atom;

a compound (D): a fluorotetracyanoquinodimethane, or the fluorotetracyanoquinodimethane to which at least one halogen radical except a fluorine radical is bonded; and a compound (E): a fluorocyclotriphosphazene, or the fluorocyclotriphosphazene to which at least one selected from the group consisting the of the following is bonded: halogen radicals except a fluorine radical, a phenoxy group, and alkoxy groups.

21. The substrate treating method according to claim 20, wherein the process liquid further comprises an alcohol showing compatibility with the sublimable substance, and a concentration of the alcohol in the process liquid ranges from 0.001 to 0.8% by volume of the process liquid.

22. The substrate treating method according to claim 21, wherein the alcohol is isopropyl alcohol.

23. The substrate treating method according to claim 20, wherein the compound (A) is tetradecafluorohexane.

24. The substrate treating method according to claim 20, wherein the compound (B) is at least one compound selected from the group consisting of 1,1,2,2-tetrachloro-3,3,4,4-tetrafluorocyclobutane, 1,2,3,4,5-pentafluorocyclopentane, 1,1,2,2,3,3,4-heptafluorocyclopentane, fluorocyclohexane, dodecafluorocyclohexane, 1,1,4-trifluorocyclohexane, 2-fluorocyclohexanol, 4,4-difluorocyclohexanone, 4,4-difluorocyclohexanecarboxylic acid, and 1,2,2,3,3,4,4,5,5,6,6-undecafluoro-1-(nonafluorobutyl)cyclohexane.

25. The substrate treating method according to claim 20, wherein the compound (C) is 2-[difluoro(undecafluorocyclohexyl)methyl]-1,1,2,3,3,4,4,4a,,5,5,6,6,7,7,8,8,8a-heptadecafluorodecahydronaphthalene.

26. The substrate treating method according to claim 20, wherein the compound (D) is tetrafluorotetracyanoquinodimethane.

27. The substrate treating method according to claim 20, wherein the compound (E) is hexafluorocyclotriphosphazene.

* * * * *